(12) United States Patent
Sprowl et al.

(10) Patent No.: US 10,201,106 B2
(45) Date of Patent: Feb. 5, 2019

(54) WATERTIGHT SEALING APPARATUS AND METHOD FOR ELECTRONIC ENCLOSURE

(71) Applicant: TRAXXAS LP, McKinney, TX (US)

(72) Inventors: Jory Sprowl, Wolfe City, TX (US); Roy Perryman, Fairview, TX (US); Otto Karl Allmendinger, Rowlett, TX (US)

(73) Assignee: TRAXXAS LP, McKinney, TX (US)

( * ) Notice: Subject to any disclaimer, the term of this patent is extended or adjusted under 35 U.S.C. 154(b) by 0 days.

(21) Appl. No.: 14/320,486

(22) Filed: Jun. 30, 2014

(65) Prior Publication Data

US 2015/0131241 A1    May 14, 2015

Related U.S. Application Data

(60) Provisional application No. 61/841,241, filed on Jun. 28, 2013.

(51) Int. Cl.
*H05K 5/06* (2006.01)
*A63H 29/22* (2006.01)
*A63H 17/26* (2006.01)

(52) U.S. Cl.
CPC ............. *H05K 5/061* (2013.01); *A63H 17/26* (2013.01); *A63H 29/22* (2013.01); *H05K 5/069* (2013.01)

(58) Field of Classification Search
CPC .......... H05K 5/061; H05K 5/062; H05K 5/06; H05K 5/069; H05K 5/0095
USPC ............ 174/50.5–50.64, 520, 527, 528, 529, 174/535–537, 539–540, 549, 551, 554, 174/564, 135; 220/3.02, 3.8, 4.02, 4.01, 220/4.07; 361/679.01, 752
See application file for complete search history.

(56) References Cited

U.S. PATENT DOCUMENTS 3,187,462 A    6/1965  Licitis
3,354,454 A    11/1967 Rueger
(Continued)

FOREIGN PATENT DOCUMENTS

CN    102421265 A    4/2012
CN    103313564 A    9/2013
(Continued)

OTHER PUBLICATIONS

*TRAXXAS LP v. Hobby Shack d/b/a Global Hobby Distributors*, Case No. 2:14-cv-00081, U.S. Dist.Ct. Eastern Div. Texas, Marshall Div.; "Defendant Hobby Shack's Patent Rule 3-3 and 3-4 Disclosure of Invalidity Contentions"; Jul. 30, 2014.

(Continued)

*Primary Examiner* — Dimary Lopez Cruz
(74) *Attorney, Agent, or Firm* — Daryl R. Wright; Greg Carr

(57) ABSTRACT

An enclosure with a substantially continuous seal about its perimeter for protecting electronic components of a model vehicle, comprising a housing with one or more walls at least partially surrounding the electronic components, a cover having one or more walls surrounding the perimeter of the housing, and one or more seal members interposed between the housing perimeter walls and the cover perimeter walls, wherein the cover perimeter walls are configured to contact the seal members against the housing perimeter walls to create a watertight barrier configured to provide protection ranging from water-resistant to waterproof.

26 Claims, 43 Drawing Sheets

(56) References Cited

U.S. PATENT DOCUMENTS

| | | | |
|---|---|---|---|
| 3,879,255 A | 4/1975 | Mason et al. | |
| 3,994,555 A | 11/1976 | Konno et al. | |
| 4,225,655 A | 9/1980 | Pesce | |
| 4,394,692 A | 7/1983 | Randmae et al. | |
| 4,533,201 A | 8/1985 | Wasserlein | |
| 4,698,459 A | 10/1987 | Drake | |
| 4,850,884 A | 7/1989 | Sawai et al. | |
| 5,009,612 A | 4/1991 | Rishworth et al. | |
| 5,088,010 A | 2/1992 | Wimmer et al. | |
| 5,317,462 A * | 5/1994 | Kakizaki | G11B 33/1466 174/564 |
| 5,394,208 A | 2/1995 | Campbell | |
| 5,588,856 A | 12/1996 | Collins et al. | |
| 5,833,486 A | 11/1998 | Shinozaki | |
| 5,911,594 A | 6/1999 | Baker et al. | |
| 5,971,792 A | 10/1999 | Lin | |
| 6,315,596 B1 | 11/2001 | Chen | |
| 6,328,592 B1 | 12/2001 | Burke et al. | |
| 6,362,421 B1 * | 3/2002 | Layton, Jr. | H02G 3/081 174/50 |
| 6,364,736 B1 | 4/2002 | Lee | |
| 6,572,395 B1 | 6/2003 | Burlew et al. | |
| 6,575,809 B2 | 6/2003 | Ogawa et al. | |
| 6,602,089 B2 | 8/2003 | Abe et al. | |
| 7,377,295 B2 | 5/2008 | Byers et al. | |
| 7,402,073 B2 | 7/2008 | Yotsutani | |
| 7,497,757 B2 | 3/2009 | Hamasaki | |
| 7,762,415 B2 * | 7/2010 | Matsui | H02G 3/088 174/58 |
| 7,762,731 B2 | 7/2010 | Arbuckle et al. | |
| 7,835,634 B2 | 11/2010 | Berend et al. | |
| 8,026,443 B1 * | 9/2011 | Czarnecki | H02G 3/085 174/50 |
| 8,315,040 B2 * | 11/2012 | Roberts | A63H 17/262 361/622 |
| 8,488,314 B1 | 7/2013 | Ashcraft | |
| 8,625,290 B2 | 1/2014 | Wee et al. | |
| 8,976,511 B1 | 3/2015 | Roberts et al. | |
| 8,982,541 B1 | 3/2015 | Roberts et al. | |
| 2002/0079653 A1 | 6/2002 | Noguchi et al. | |
| 2009/0097191 A1 | 4/2009 | Roberts et al. | |
| 2009/0302034 A1 | 12/2009 | Makela | |
| 2011/0057778 A1 | 3/2011 | DeWitt et al. | |
| 2011/0059760 A1 | 3/2011 | DeWitt et al. | |
| 2011/0063090 A1 | 3/2011 | DeWitt et al. | |
| 2015/0270693 A1 * | 9/2015 | Thornton | H02G 3/081 174/50 |

FOREIGN PATENT DOCUMENTS

| | | |
|---|---|---|
| DE | 10151413 A1 | 8/2003 |
| DE | 102005061050 A1 | 6/2007 |
| DE | 102009005716 A1 | 7/2010 |
| DE | 102012213200 A1 | 2/2013 |
| GB | 2115614 A | 9/1983 |
| JP | H02-98685 U | 8/1990 |

OTHER PUBLICATIONS

TRAXXAS LP; "VillainEX" photographs; May 2003.
TRAXXAS LP; "VillainEX Details" web brochure; May 2003.
TRAXXAS LP; "VillainEX" photograph; May 2003.
TRAXXAS LP; "VillainEX Model 1502 Owners Manual"; May 2003.
TRAXXAS LP; "VillainEX Model 1502 Exploded Views"; May 2003.
International Search Report by the ISA/EP, dated Nov. 25, 2014, re PCT Application No. PCT/US2014/044959.
Written Opinion of the ISA/EP, dated Nov. 25, 2014, re PCT Application No. PCT/US2014/044959.
Unknown; Taiwan IPO Search Report; Taiwan Patent App. No. 103122504; Search Completed Nov. 23, 2017; dated Dec. 14, 2017.
Unknown; Chinese Patent and Trademark Office IPO Search Report; Chinese Utility Patent Application No. 2014800469101, Apr. 19, 2018.

\* cited by examiner

* Shown without ESC and servo wires for clarity

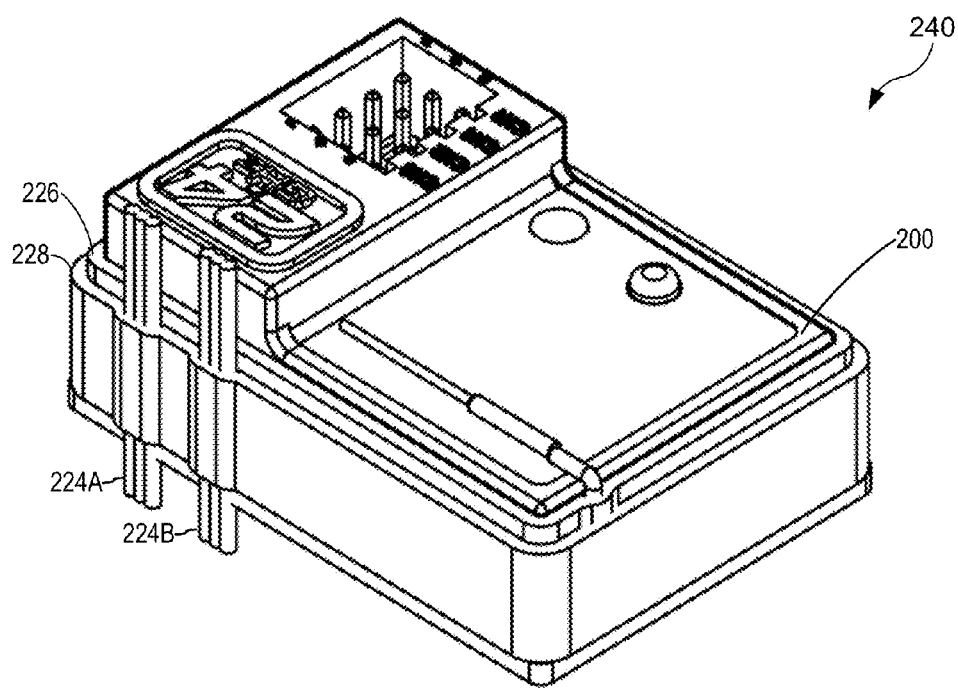
FIG. 15
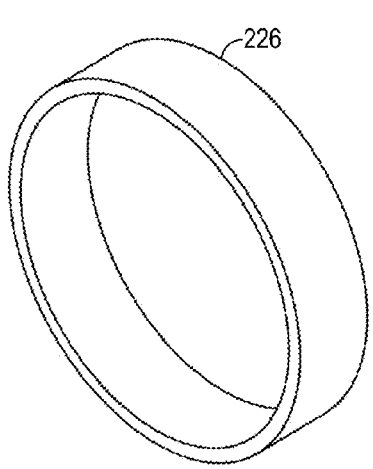
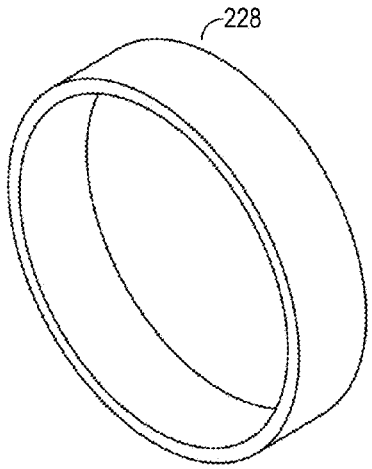
FIG. 16A  FIG. 16B

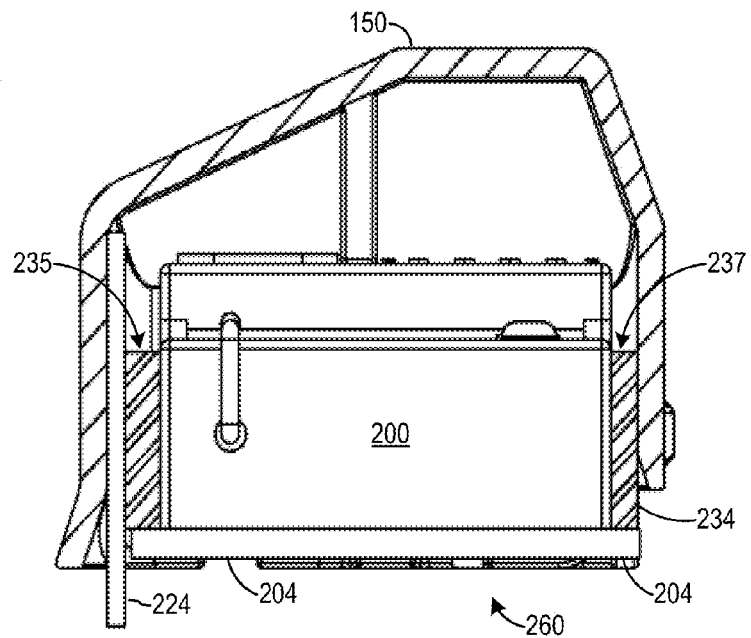
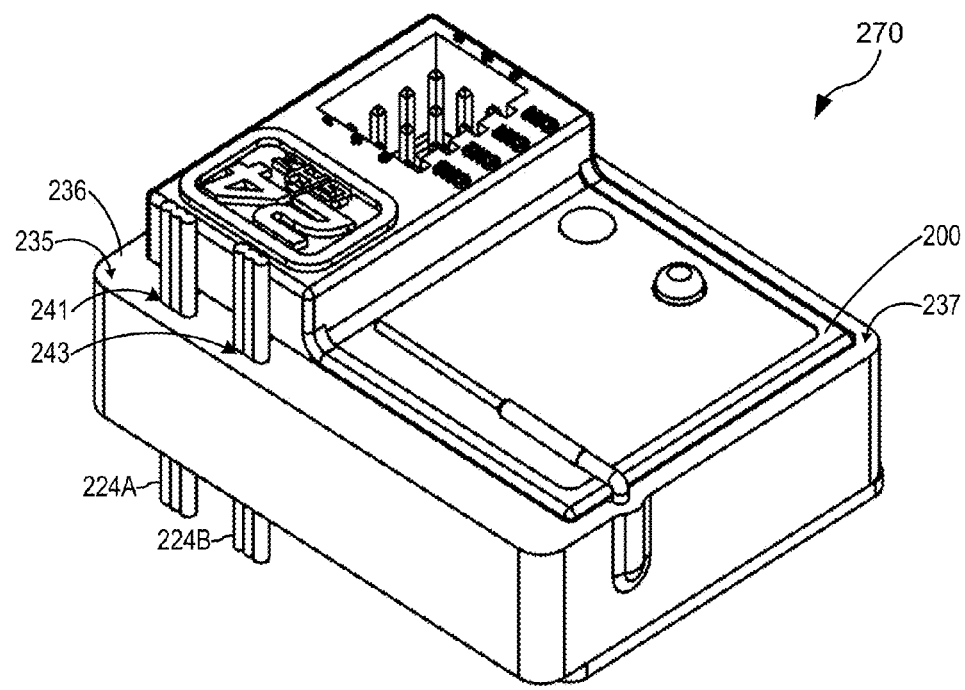

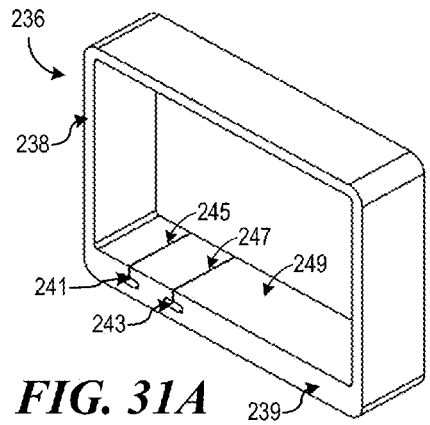
*FIG. 31A*
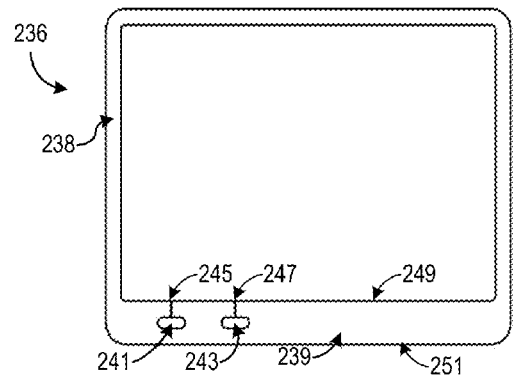
*FIG. 31B*
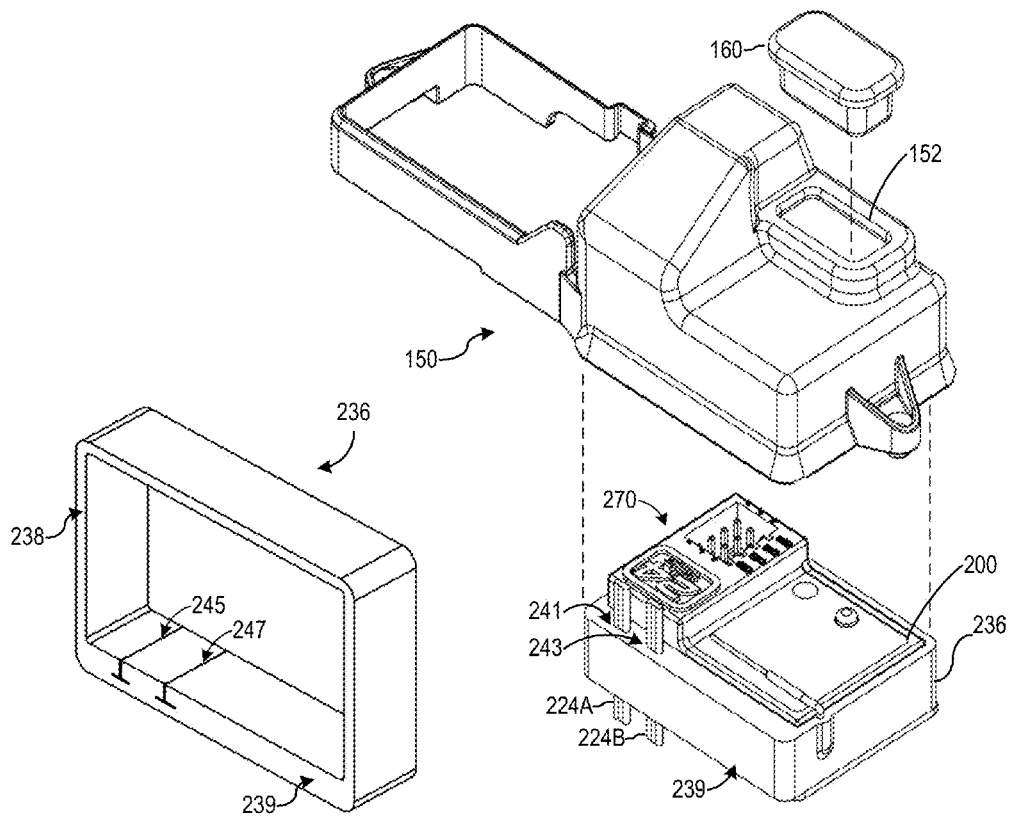
*FIG. 31C*     *FIG. 32*

WATERTIGHT SEALING APPARATUS AND METHOD FOR ELECTRONIC ENCLOSURE

CROSS-REFERENCE TO RELATED APPLICATIONS

This application relates to, and claims the benefit of the filing date of, co-pending U.S. provisional patent application Ser. No. 61/841,241 entitled WATERPROOF SEALING APPARATUS AND METHOD FOR ELECTRONIC ENCLOSURE, filed Jun. 28, 2013, the entire contents of which are incorporated herein by reference for all purposes.

BACKGROUND OF THE INVENTION

Field of the Invention

The present invention relates to protection of electronic components of model vehicles and, more particularly, to forming watertight enclosures for housing electronic components of a model vehicle.

Description of the Related Art

Radio controlled model vehicles house sophisticated electronic components for receiving control input and for driving vehicle components. These radio controlled model vehicles are designed for outdoor use, exposing the vehicles to dirt and debris, as well as to water and other liquids from rain, dew, snow, and puddles. The electronic components housed within the mode vehicles must be protected from these harmful contaminants to prevent corrosion, electrical shorts, and other damage that exposure to the contaminants may cause.

Electronic components of radio controlled model vehicles are oftentimes secured to the chassis of the vehicle, and shielded from contaminants by a formed plastic cover. The chassis and cover may be effective at preventing large contaminants like pebbles and other debris from reaching the electronic components housed within. The chassis and cover are not effective, however, in preventing liquids from seeping into the areas within the housing and coming into contact with the electronic components of the radio controlled model vehicle. A need exists for a method and apparatus for protecting the electronic components of a radio controlled model vehicle from exposure to liquids during use.

SUMMARY

The present invention provides methods and apparatuses for sealing a housing in which electronic circuitry for a radio-controlled model vehicle may be enclosed, protecting the circuitry from exposure to liquid.

BRIEF DESCRIPTION OF THE DRAWINGS

For a more complete understanding of the present invention and the advantages thereof, reference is now made to the following Detailed Description taken in conjunction with the accompanying drawings, in which:

FIG. 15 is a perspective view of the housing of FIG. 9, with sealing materials applied;

FIGS. 16A and 16B are perspective views of sealing materials of FIG. 15;

FIG. 29 is a partial cross-section of the cover member of FIG. 28, illustrating the cover member and sealing materials in cross-section, and an end view of the sealed housing of FIG. 25;

FIG. 30 is a perspective view of the housing of FIG. 9, with sealing materials applied;

FIG. 31A is a perspective view, FIG. 31B is a top view, and FIG. 31C is a top view of an alternative embodiment, of sealing material of FIG. 30;

FIG. 32 is a partially exploded, perspective view of a cover member and sealing plug together with the housing having sealing materials applied of FIG. 30;

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, specific details, and the like have been omitted inasmuch as such details are not considered necessary to obtain a complete understanding of the present invention, and are considered to be within the understanding of persons of ordinary skill in the relevant art.

Figure 1:
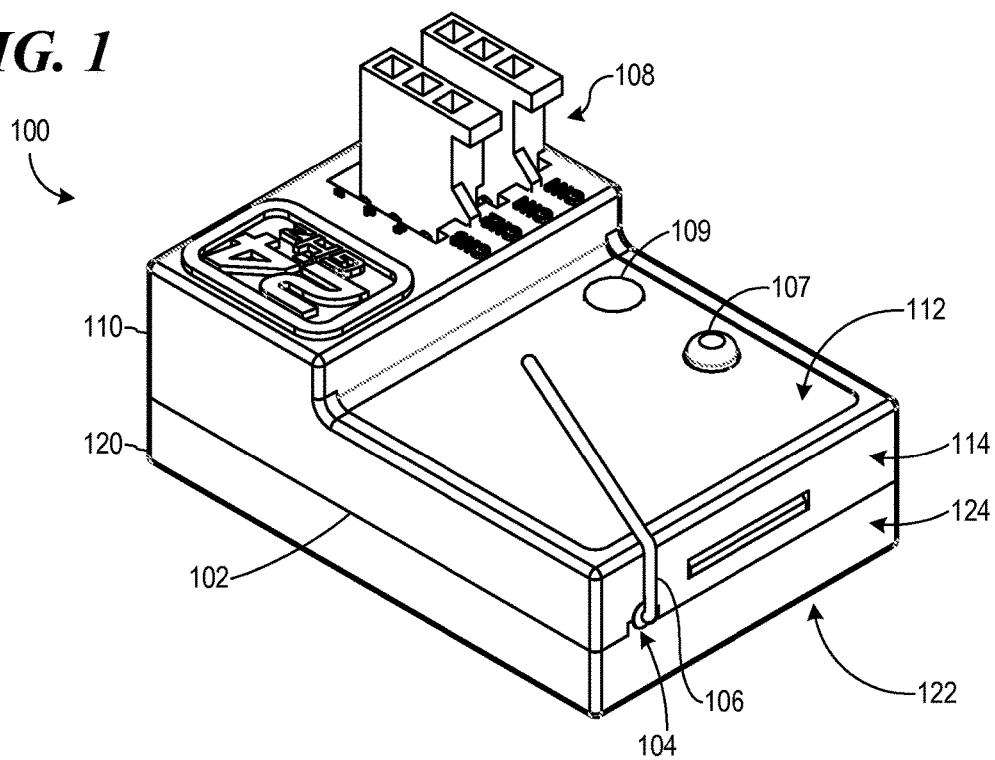
FIG. 1 is a perspective view of a housing for enclosing electronic circuitry according to an aspect of the present invention.

Turning now to FIG. 1, one embodiment of a housing for enclosing electronic circuitry is shown. A housing 100 may be comprised of a first portion 110 and a second portion 120. The first portion 110 and the second portion 120 may be coupled together to create an enclosure for housing electronic circuitry. As shown, the first portion 110 may include an aperture 104 through which an antenna 106 may pass, a control input 107, connectors 108, and an indicator 109. In alternative embodiments, fewer, additional, and different components may be included.

Figure 40:
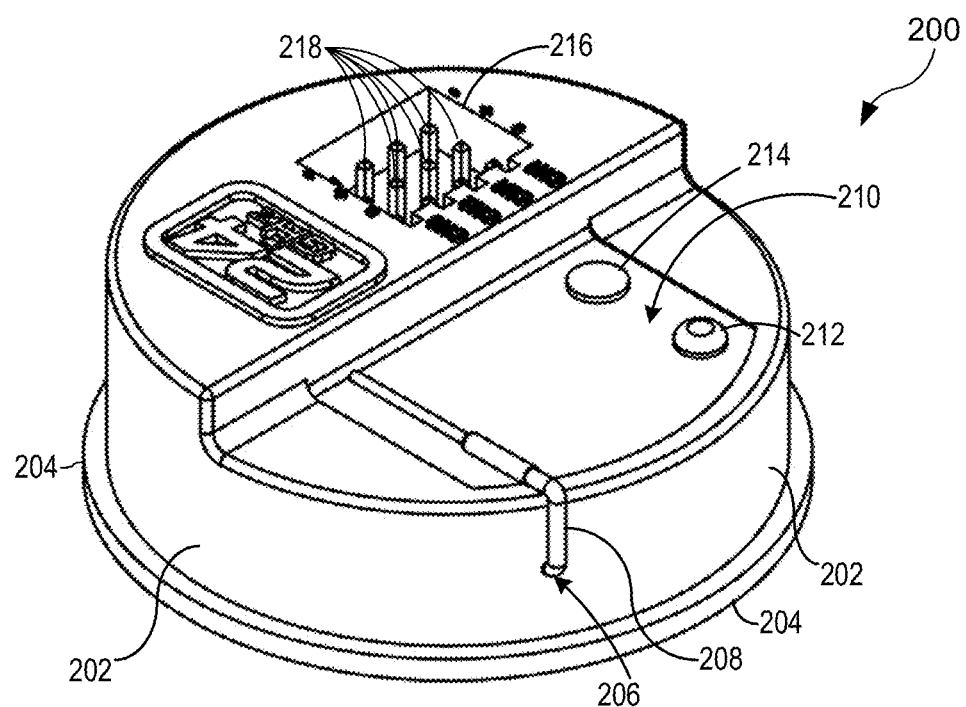
FIG. 40 is a perspective view of a housing for enclosing electronic circuitry.
Figure 41:
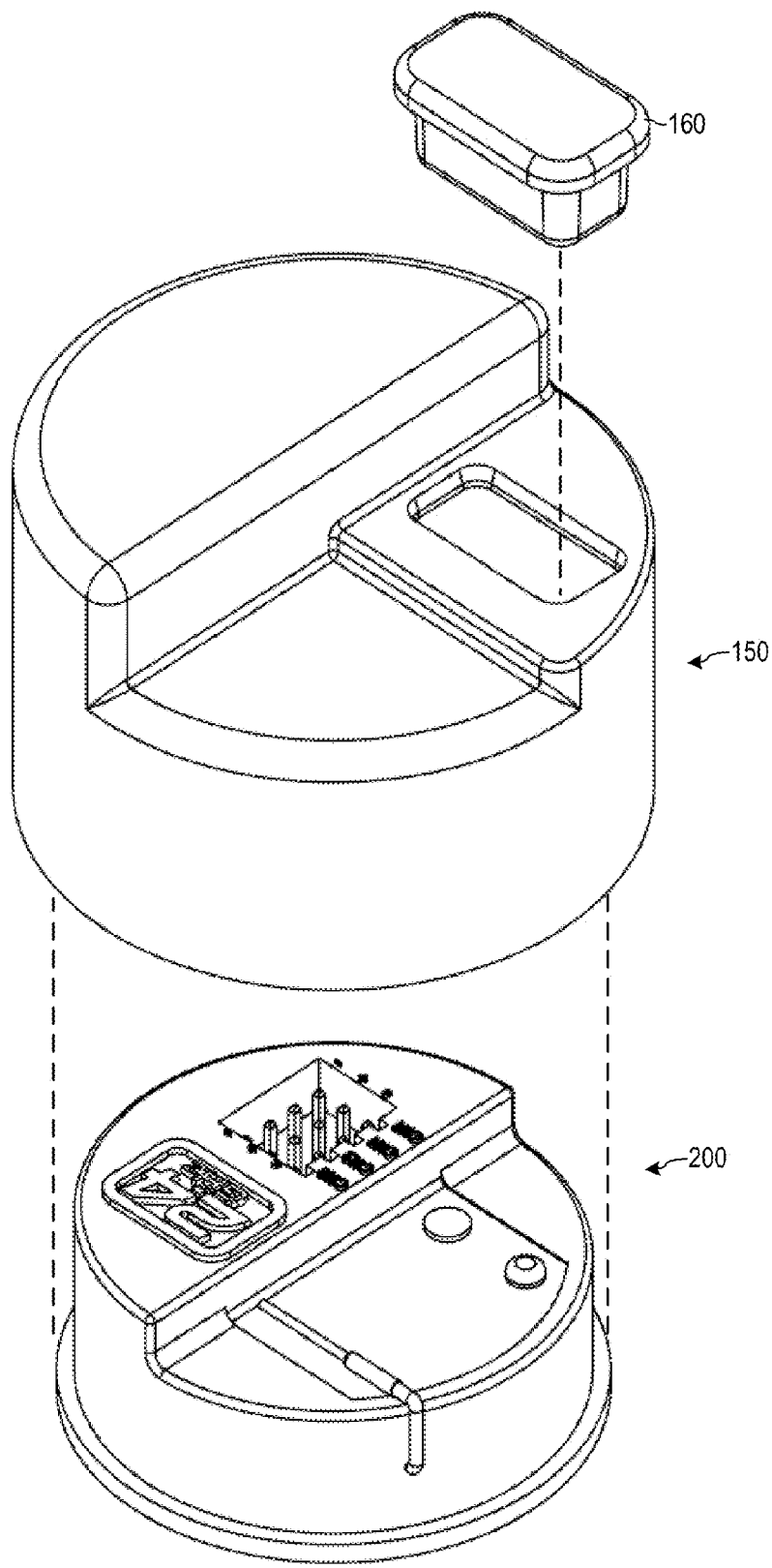
FIG. 41 is a partially exploded, perspective view of a cover member and sealing plug together with the housing of FIG. 40, in which the sealing materials are not shown for clarity.
Figure 42:
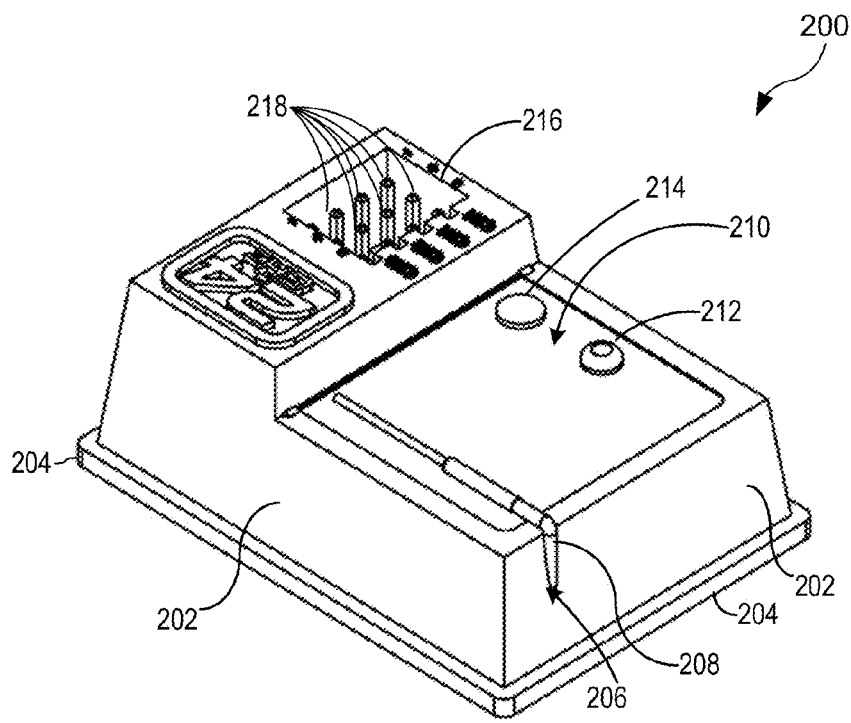
FIG. 42 is a perspective view of a housing for enclosing electronic circuitry.
Figure 43:
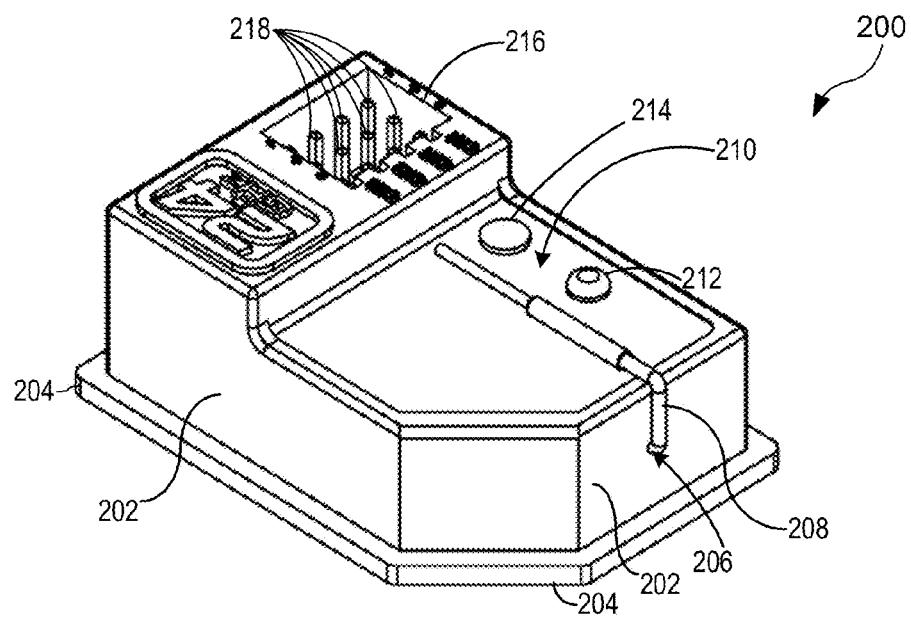
FIG. 43 is a perspective view of a housing for enclosing electronic circuitry.
Figure 44:
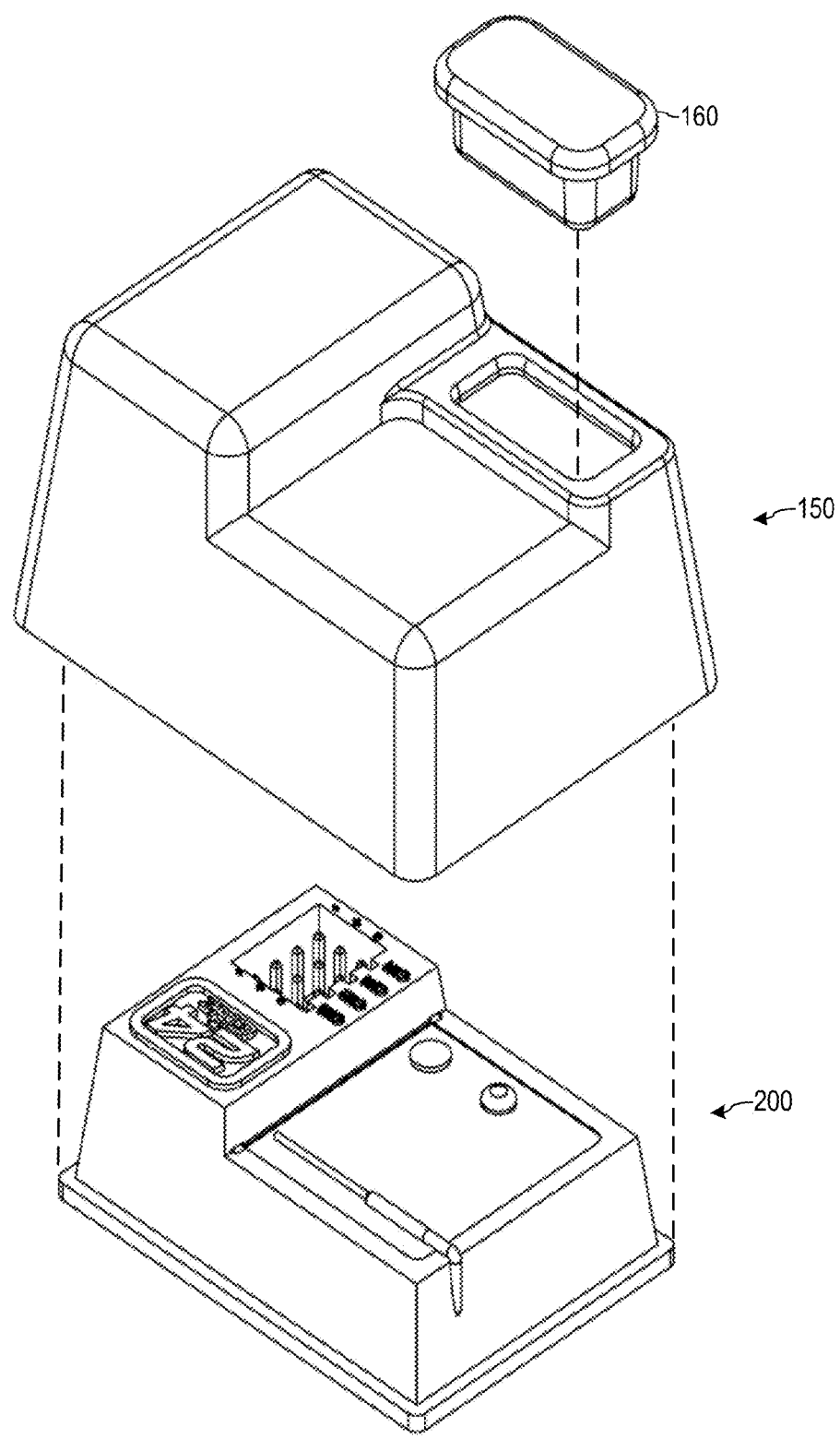
FIG. 44 is a partially exploded, perspective view of a cover member and sealing plug together with the housing of FIG. 42, in which the sealing materials are not shown for clarity.
Figure 45:
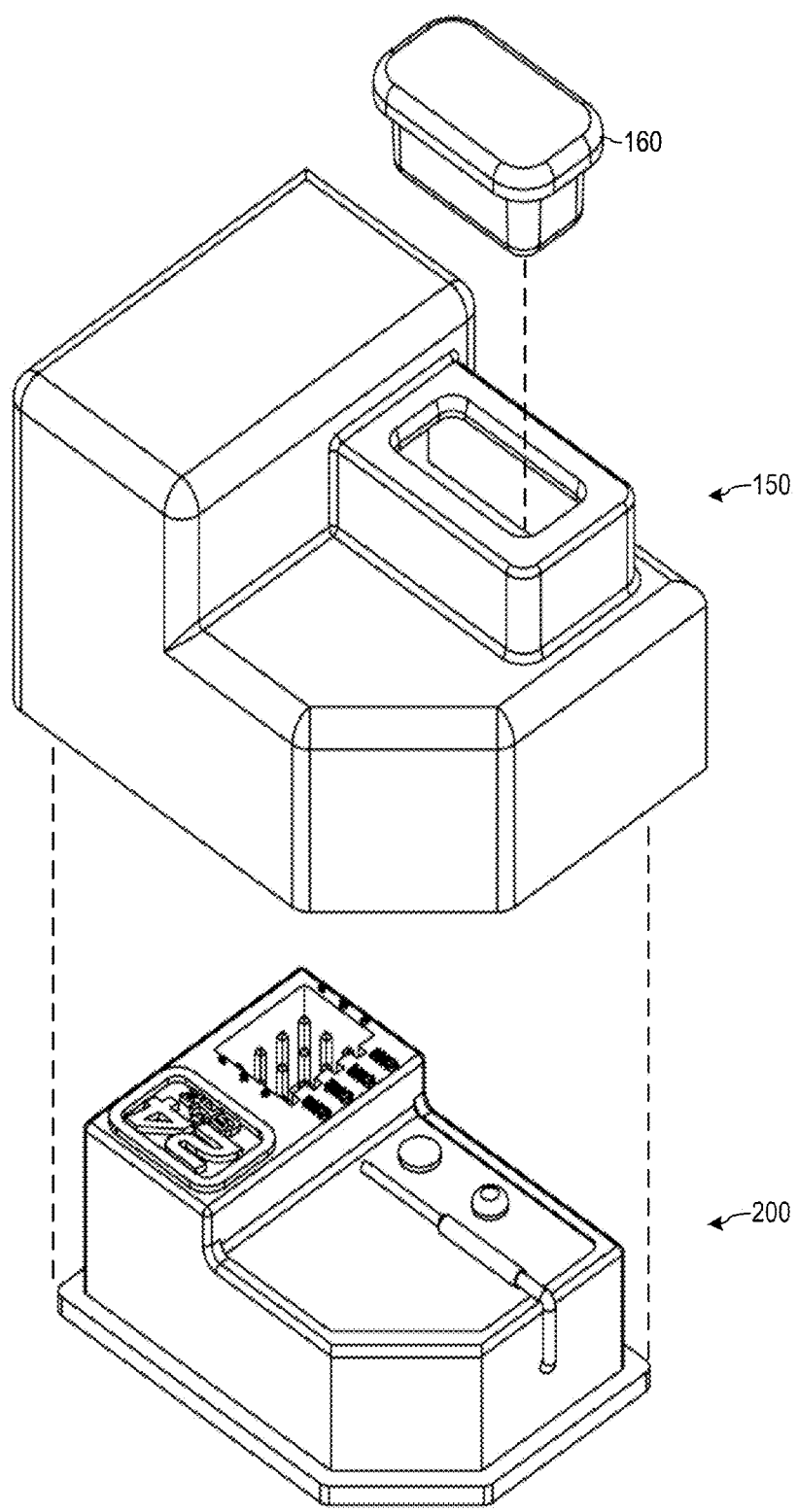
FIG. 45 is a partially exploded, perspective view of a cover member and sealing plug together with the housing of FIG. 43, in which the sealing materials are not shown for clarity.

The first portion 110 of the housing 100 may comprise an upper surface 112 and a plurality of walls 114 extending down from the upper surface 112. As shown in FIG. 1, the first portion 110 may have a rectangular upper surface 112 and may have four walls 114. In alternate embodiments, the first portion 110 may have an upper surface 112 of a different shape and correspondingly more, or fewer, walls 114 than shown in FIG. 1. For example, the upper surface 112 may have a circular, or ovoid, perimeter and a single wall 114 as shown in FIG. 40. Alternatively, the upper surface 112 may have an irregular pentagonal shape and five walls 114 as shown in FIG. 43. These Figs. are illustrative only, and should not be considered an exhaustive listing of the alternative configurations contemplated.

As shown in FIG. 1, the first portion 110 may include an aperture 104 for allowing an antenna 106 to pass through the housing 100 and access the electronic components contained within. The aperture 104 may be a cutout along the bottom edge of a wall 114. Alternatively, the aperture 104 may be a hole cut through the material of a wall 114 or through the upper surface 112. Although a single aperture 104 is shown, in alternative embodiments the first portion 110 may include none, one, or a plurality of apertures 104.

The control input 107 may access the electronic components enclosed within the housing 100. Control input 107 may be a push button, a switch, or the like. Although a single control input 107 is shown, in alternative embodiments, the first portion 110 may include zero, one, or a plurality of control inputs 107.

The first portion 110 may be provided with one or more electrical connectors 108 accessing the electronic circuitry enclosed within the housing 100. Electrical wiring may be coupled to the connectors 108. Alternatively, electrical wiring may be directly coupled to the electrical circuitry enclosed within the housing 100 and may exit the housing through the first portion 110 without the use of connectors 108. The electrical circuitry may function as a radio control receiver for receiving control signals from a remote transmitter. The electrical wiring may serve to convey control signals received from the remote transmitter to electronic control systems (not shown) as may be utilized in a radio-controlled model vehicle.

The indicator 109 may access the electronic components enclosed within the housing 100. The indicator 109 may be an LED light, a screen for displaying data, or the like. Although a single indicator 109 is shown, in alternative embodiments, the first portion 110 may include zero, one, or a plurality of indicators 109.

The control inputs 107 and/or the indicators 109 may access the electronic circuitry within the housing 100 for programming and/or operating a radio control receiver, as disclosed, for example, in U.S. Patent Application Publication No. US-2011-0057778A1, entitled AUTOMATIC DETERMINATION OF RADIO CONTROL UNIT CONFIGURATION PARAMETER SETTINGS, published Mar. 10, 2011, or in U.S. Patent Application Publication No. US-2011-0063090-A1, entitled ESTABLISHING A LINK WITH A RADIO TRANSMIT CONTROLLER, published Mar. 17, 2011, or in U.S. Patent Application Publication No. US-2011-0059760-A1 entitled COMMUNICATION WITH EXACTLY ONE RADIO CONTROL RECEIVER, published Mar. 10, 2011. The control input 107 and the indicator 109 may be accessible by an operator through the upper surface 112 of the first portion 110 of the housing 100.

The second portion 120 of the housing 100 may comprise a lower surface 122 and a plurality of walls 124 extending up from the lower surface 122. The lower surface 122 may provide a base for supporting electronic components within the housing 100 and may be a closed end for forming a portion of an enclosure. As shown in FIG. 1, the second portion 120 may have a lower surface 122 with a rectangular shaped perimeter and may have four walls 124. In alternate embodiments, and as described in reference to the first portion 110 above, the second portion 120 may have a lower surface 122 with a perimeter of different shape and have correspondingly more, or fewer, walls 124 than shown in FIG. 1.

As shown in FIG. 1, the second portion 120 may include an aperture 104 for allowing an antenna 106 to pass through the housing 100 and access the electronic components contained within the housing 100. The aperture 104 may be a cutout along the top edge of a wall 124. Alternatively, the aperture 104 may be a hole cut through the material of a wall 124. Although a single aperture 104 is shown, in alternative embodiments the second portion 120 may include zero, one, or a plurality of apertures 104. The hole, or cutout, forming the aperture 104 may be configured to coincide with the location of a corresponding aperture 104 hole, or cutout, of the first portion 110 when the first portion 110 and second portion 120 are coupled together forming the housing 100.

Figure 9:
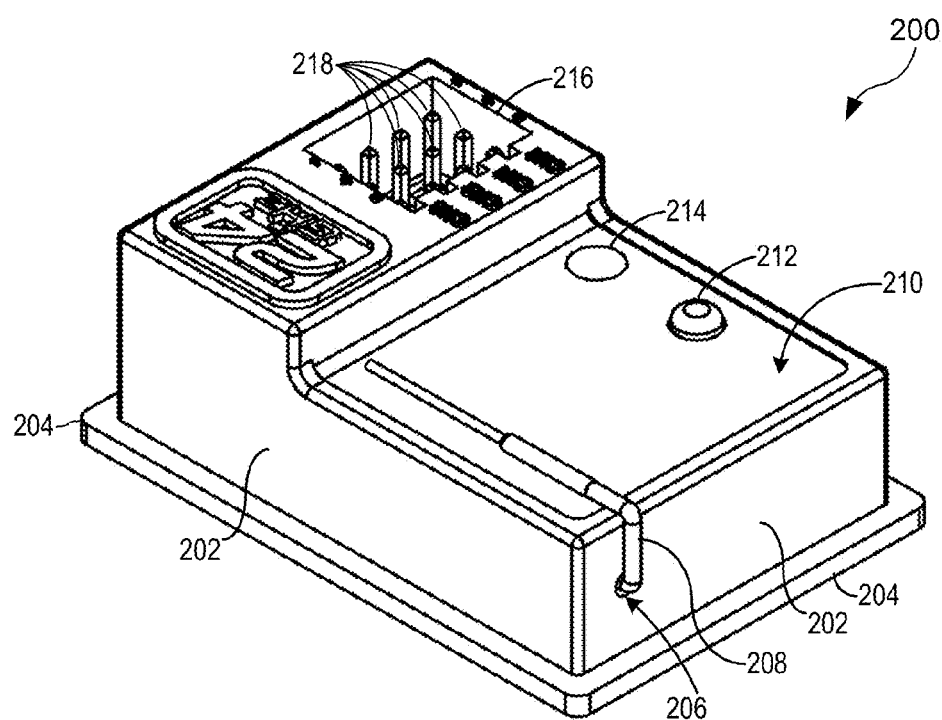
FIG. 9 is a perspective view of a housing for enclosing electronic circuitry.

An alternative embodiment of the housing for enclosing electronic circuitry, a housing 200, is shown as shown in FIG. 9. The housing 200 may include a top surface 210 and a plurality of walls 202 extending down from the top surface 210. The housing 200 may also include a bottom surface (not labeled) within the housing 200 which may be a base for supporting electronic components and may be a closed end for forming a portion of an enclosure. In an alternative embodiment, the housing 200 may not include a top surface 210. In such an embodiment, a cover member 150, as described later, may slide over the plurality of walls 202 of the housing 200 and provide a top surface of the housing 200.

As shown in FIG. 9, the top surface 210 of housing 200 may have a rectangular shape and four walls. In alternate embodiments, the top surface 210 may have a different shape and correspondingly more, or fewer, walls than shown in FIG. 9. For example, the top surface 210 may have a circular, or ovoid, shape as shown in FIG. 40. Alternatively, the top surface 210 may have an irregular pentagonal shape as shown in FIG. 43. These Figs. are illustrative only, and should not be considered an exhaustive listing of the alternative configurations contemplated.

In an embodiment, the housing 200 may include a flange 204. The flange 204 may be at the bottom edge of the plurality of downwardly extending walls 202. The flange 204 may extend outwardly from each of the walls of the housing 200 and form a surface that is substantially parallel to the top surface 210. In an alternative embodiment the housing 200 may not include the flange 204.

The housing 200 may include an aperture 206 for allowing an antenna 208 to pass through the housing 200 and access the electronic components contained within. The aperture 206 may be a hole through a wall of housing 200, as shown, or, in an alternative embodiment, may be located on the upper surface 210 of the housing 200. Although a single aperture 206 is shown, in alternative embodiments the housing 200 may include zero, one, or a plurality of apertures 206.

The control input 212 may access the electronic components enclosed within the housing 200. The control input 212 may be a push button, a switch, or the like. Although a single control input 212 is shown, in alternative embodiments the housing 200 may include zero, one, or a plurality of control inputs 212.

The indicator 214 may access the electronic components within housing 200. The indicator 214 may be an LED light, a screen for displaying data, or the like. Although a single indicator 214 is shown, in alternative embodiments the housing 200 may include zero, one, or a plurality of indicators 214.

The controls 212 and/or indicators 214 may access the electronic circuitry within the housing 200 for programming and/or operating a radio control receiver, as disclosed, for example, in U.S. Patent Application Publication No. US-2011-0057778A1, entitled AUTOMATIC DETERMINATION OF RADIO CONTROL UNIT CONFIGURATION PARAMETER SETTINGS, published Mar. 10, 2011, or in U.S. Patent Application Publication No. US-2011-0063090-A1, entitled ESTABLISHING A LINK WITH A RADIO TRANSMIT CONTROLLER, published Mar. 17, 2011, or in U.S. Patent Application Publication No. US-2011-0059760-A1 entitled COMMUNICATION WITH EXACTLY ONE RADIO CONTROL RECEIVER, published Mar. 10, 2011. The control input 212 and the indicator 214 may be accessible by an operator through the top surface 210 of the housing 200.

The upper surface 210 may be provided with a cavity 216 containing one or more electrical connectors 218 for accessing the electronic circuitry enclosed within the housing 200. Electrical plugs, connectors, wiring, or the like may be coupled to the connectors 218. In an alternative embodiment, electrical wiring may be directly coupled to the electrical circuitry enclosed within the housing 200 and may exit the housing 200 through the cavity 216. The electrical circuitry may function as a radio control receiver for receiving control signals from a remote transmitter. The electrical wiring may serve to convey control signals received from the remote transmitter to electronic control systems (not shown) as may be utilized in a radio-controlled model vehicle.

Figure 46:
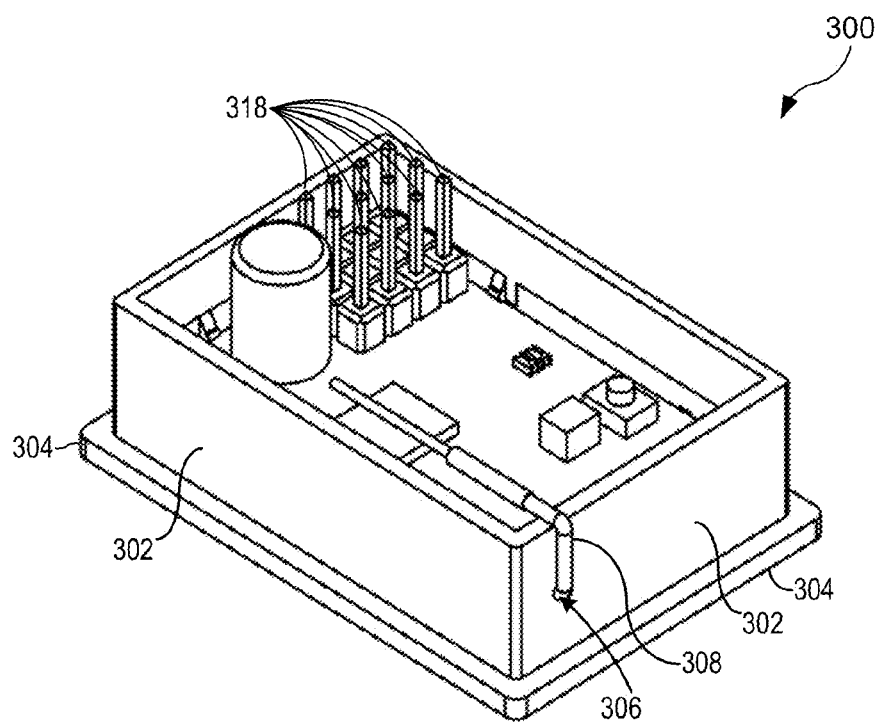
FIG. 46 is a perspective view of a housing for enclosing electronic circuitry.
Figure 47:
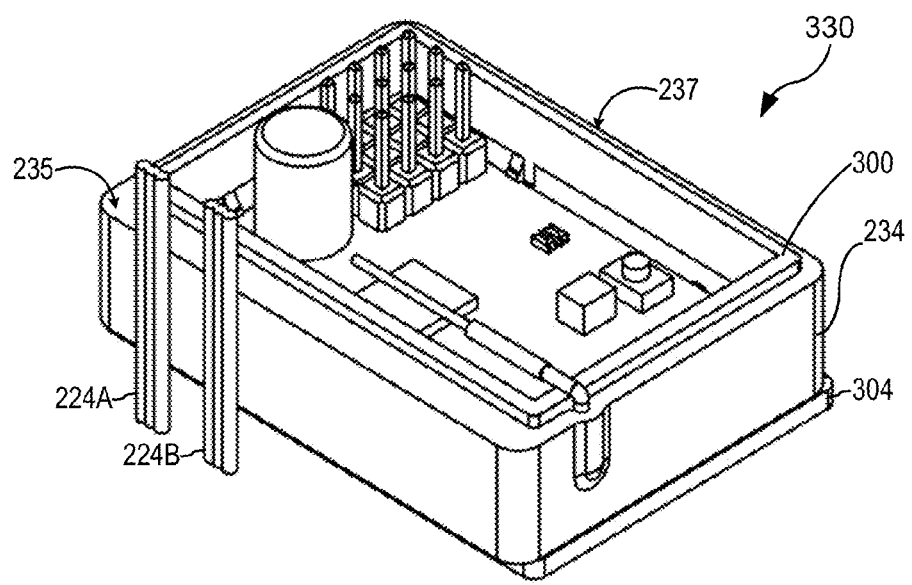
FIG. 47 is a perspective view of the housing of FIG. 46, with sealing materials applied.
Figure 48:
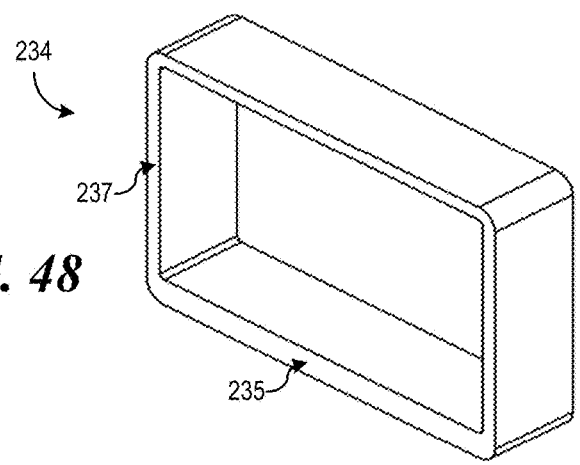
FIG. 48 is a perspective view of sealing materials of FIG. 47.
Figure 49:
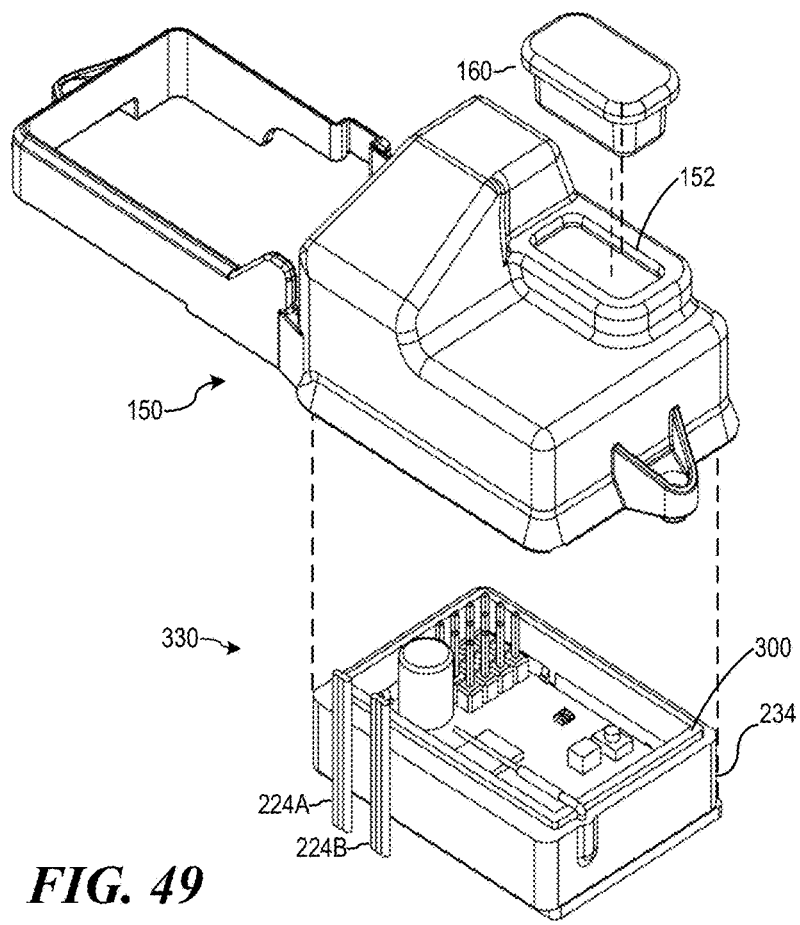
FIG. 49 is a partially exploded, perspective view of a cover member and sealing plug together with the housing having sealing materials applied of FIG. 47.
Figure 50:
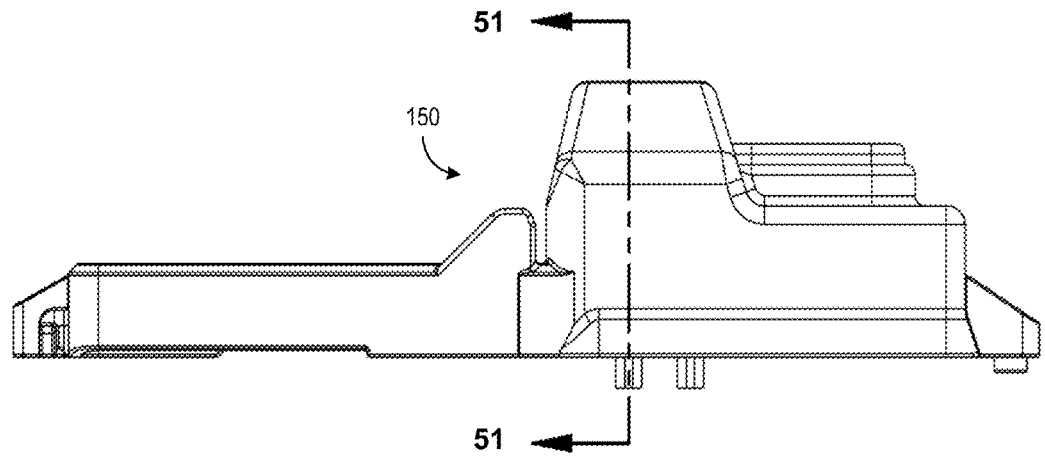
FIG. 50 is a side view of a cover member covering the sealed housing of FIG. 47.
Figure 51:
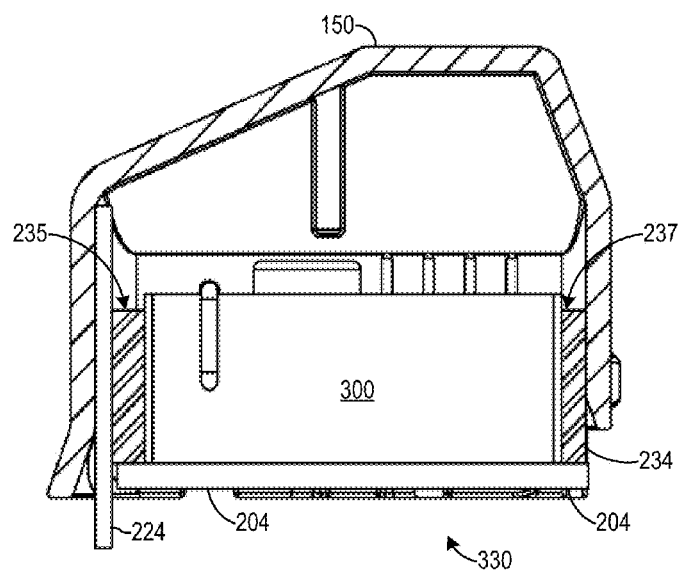
FIG. 51 is a partial cross-section of the cover member of FIG. 50, illustrating the cover member and sealing materials in cross-section, and an end view of the sealed housing of FIG. 47.
Figure 52:
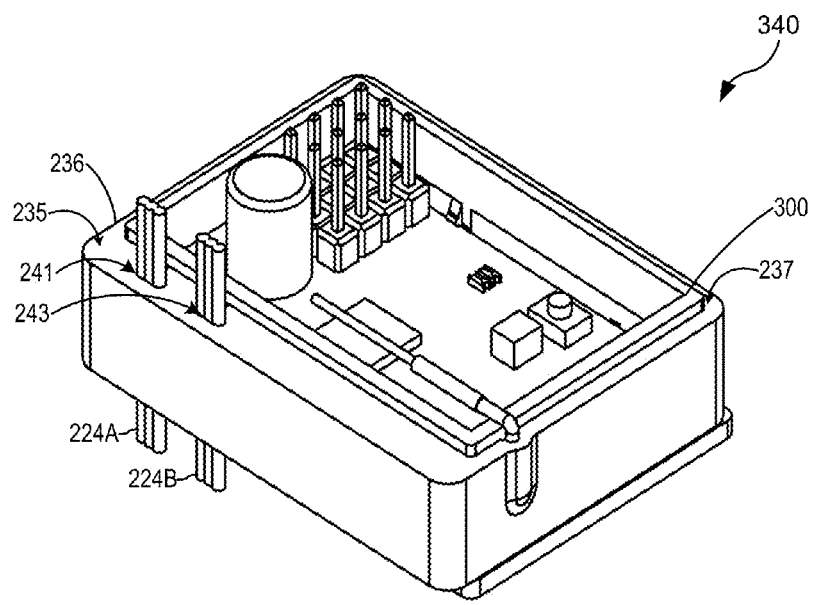
FIG. 52 is a perspective view of the housing of FIG. 46, with sealing materials applied.
Figure 53A:
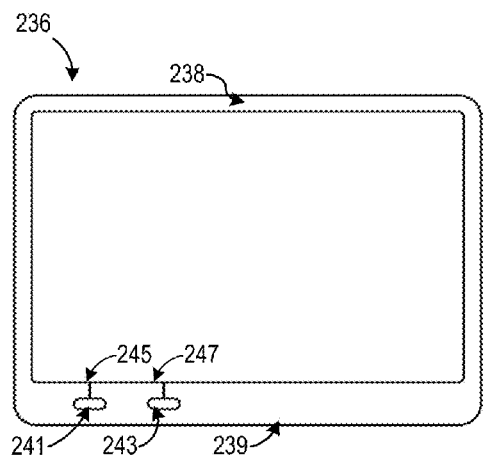
FIG. 53A is a top view.
Figure 53B:
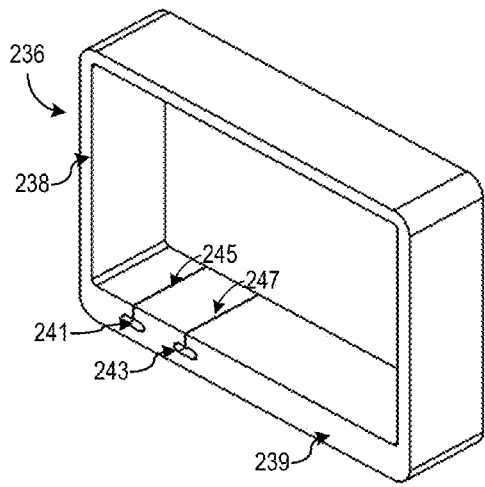
FIG. 53B is a perspective view, of sealing materials of FIG. 52.
Figure 54:
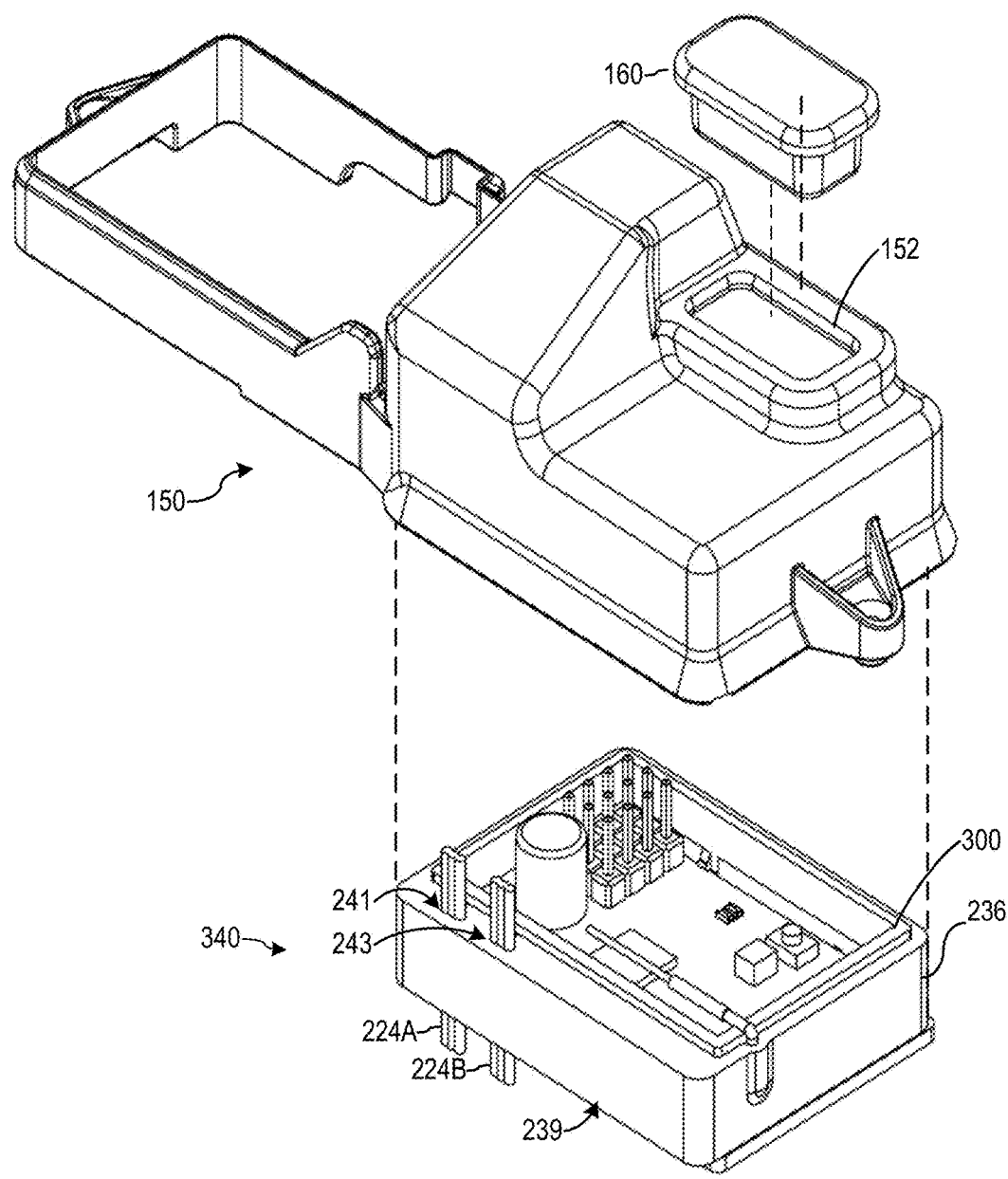
FIG. 54 is a partially exploded, perspective view of a cover member and sealing plug together with the housing having sealing materials applied of FIG. 52.
Figure 55:
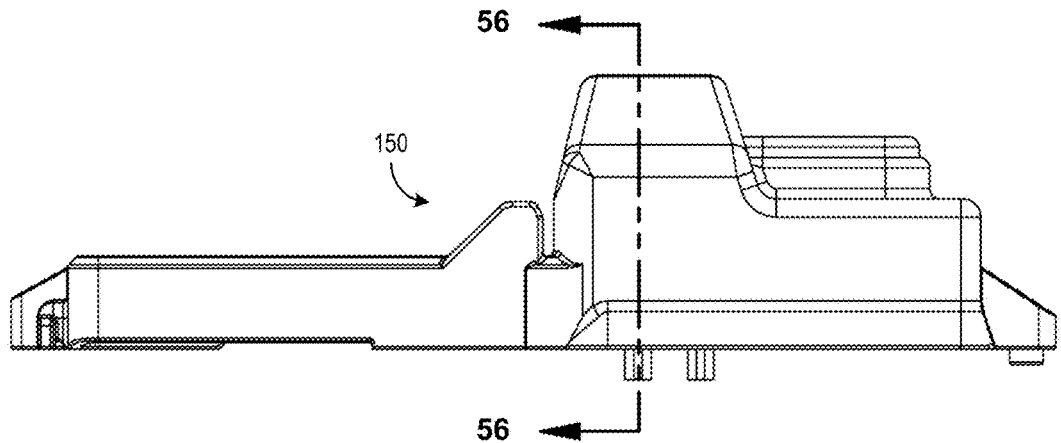
FIG. 55 is a side view of a cover member covering the sealed housing of FIG. 52.
Figure 56:
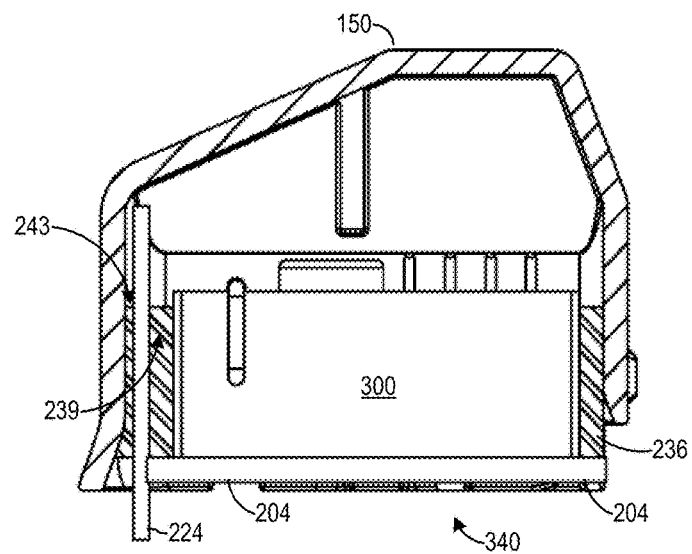
FIG. 56 is a partial cross-section of the cover member of FIG. 55, illustrating the cover member and sealing materials in cross-section, and an end view of the sealed housing of FIG. 52.
Figure 57:
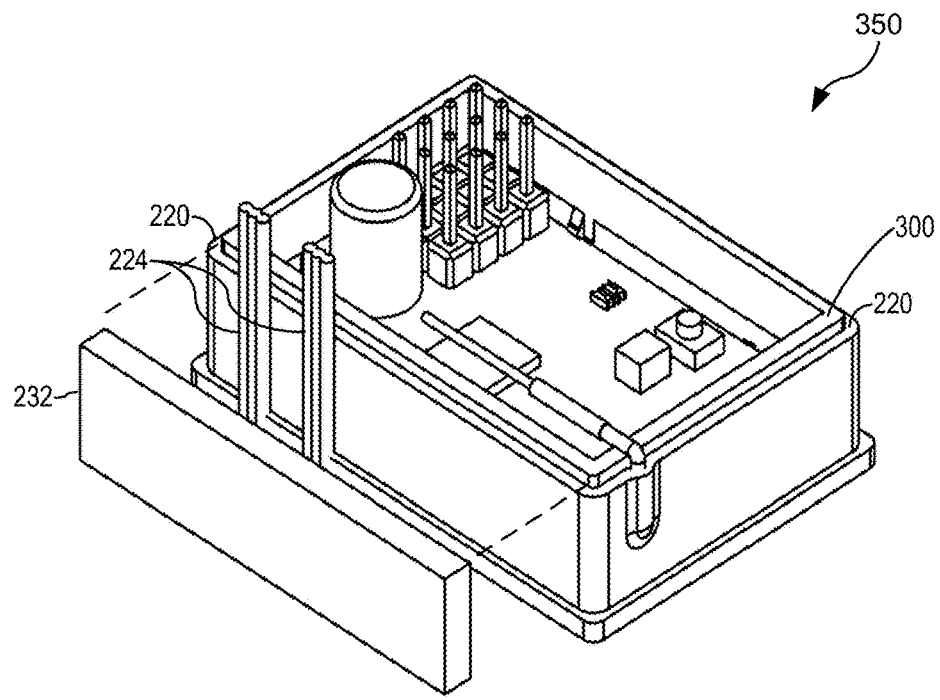
FIG. 57 is a perspective view of the housing of FIG. 46, with sealing materials applied.
Figure 58:
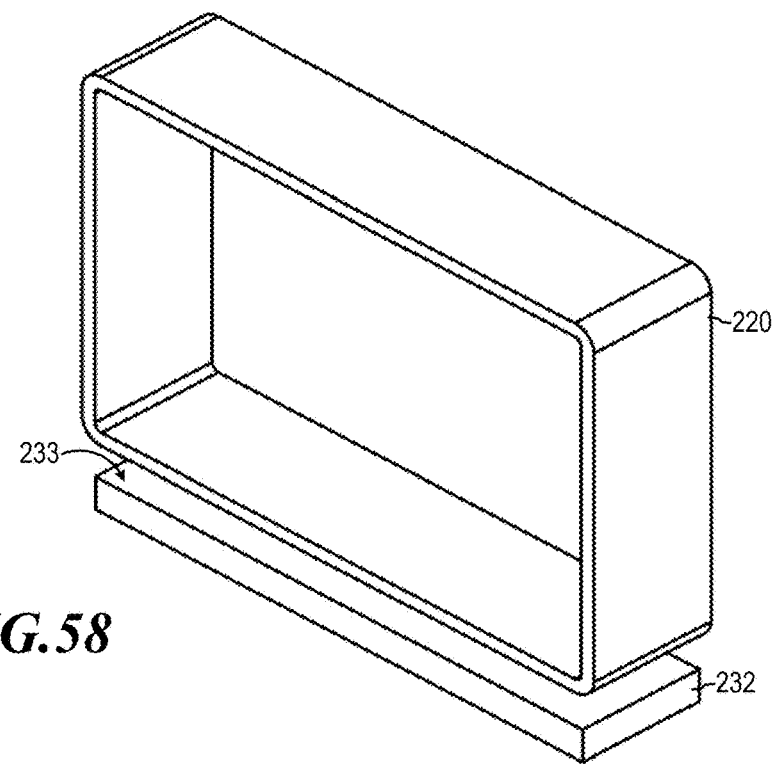
FIG. 58 is a perspective view of sealing materials of FIG. 57.
Figure 59:
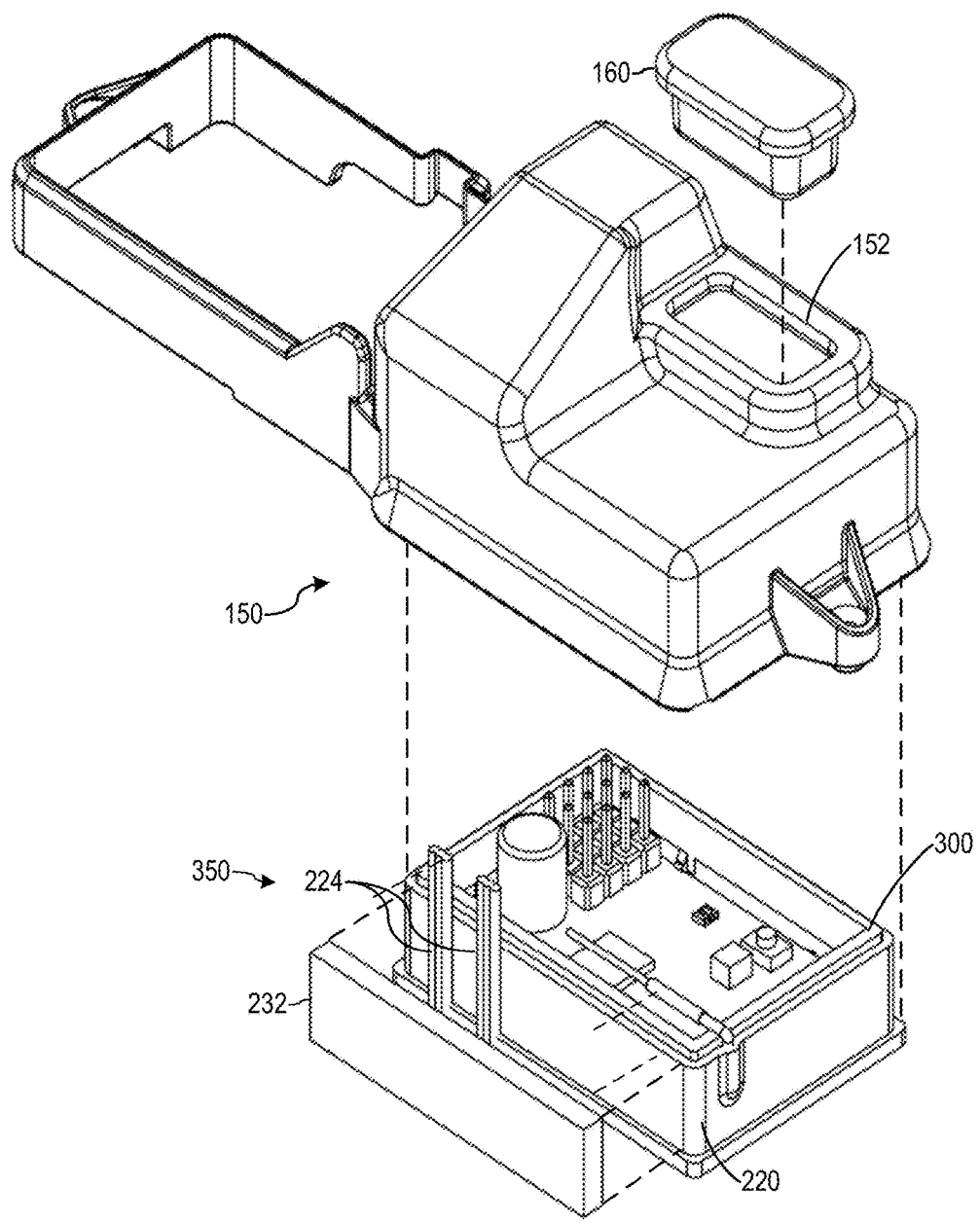
FIG. 59 is a partially exploded, perspective view of a cover member and sealing plug together with the housing having sealing materials applied of FIG. 57.
Figure 60:
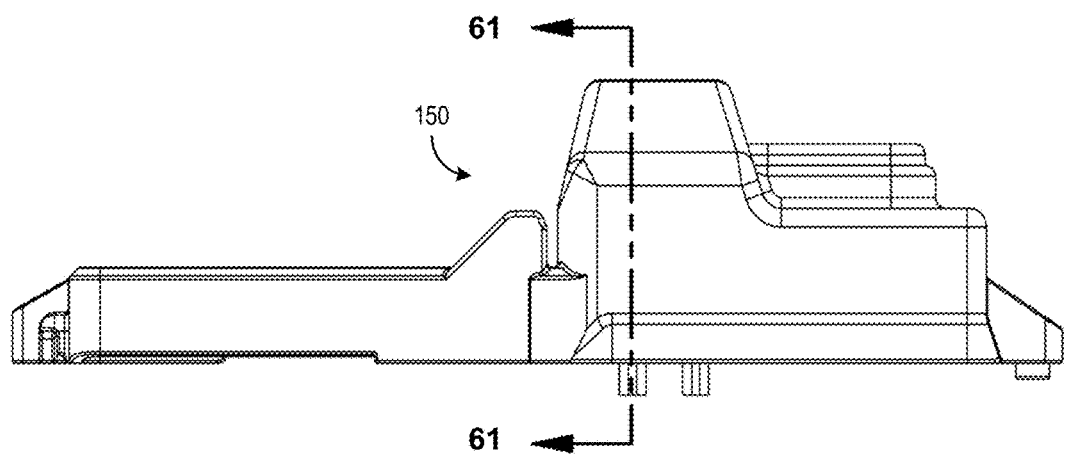
FIG. 60 is a side view of a cover member covering the sealed housing of FIG. 57.
Figure 61:
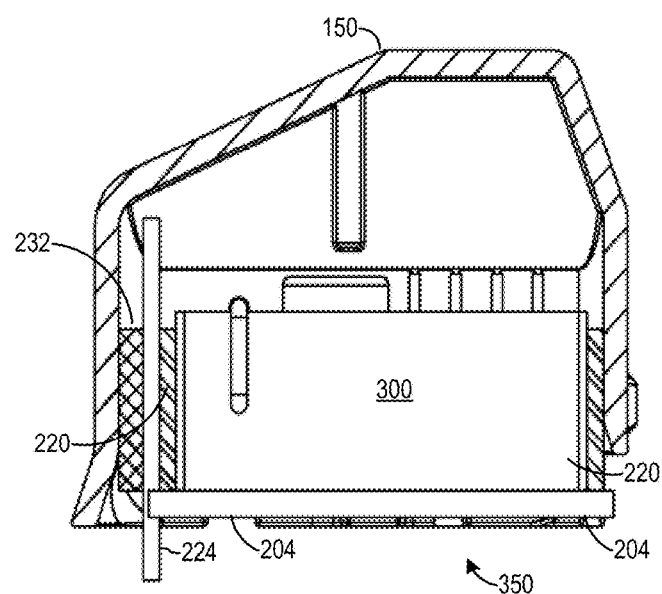
FIG. 61 is a partial cross-section of the cover member of FIG. 60, illustrating the cover member and sealing materials in cross-section, and an end view of the sealed housing of FIG. 57.
Figure 62:
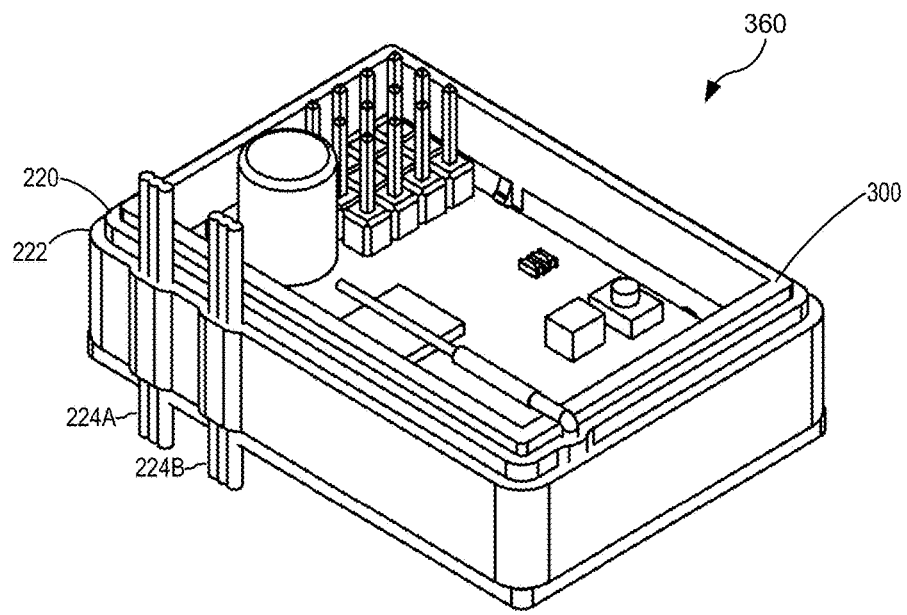
FIG. 62 is a perspective view of the housing of FIG. 46, with sealing materials applied.
Figure 63:
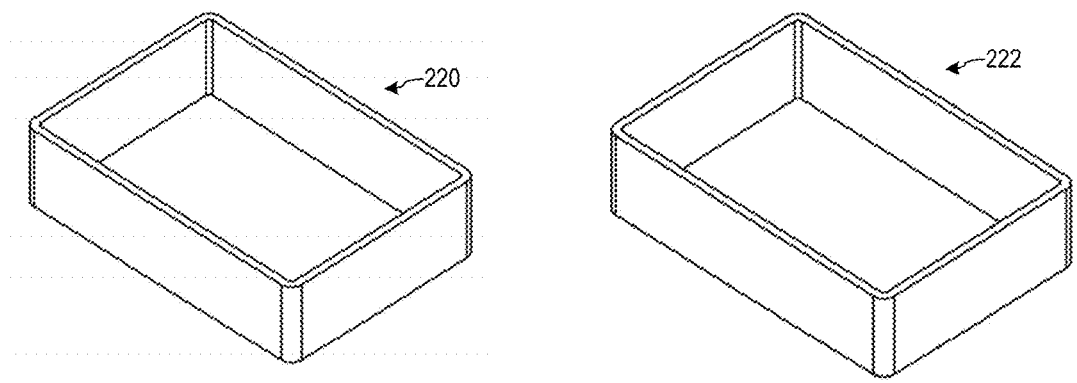
FIG. 63 is a perspective view of sealing material of FIG. 62.
Figure 64:
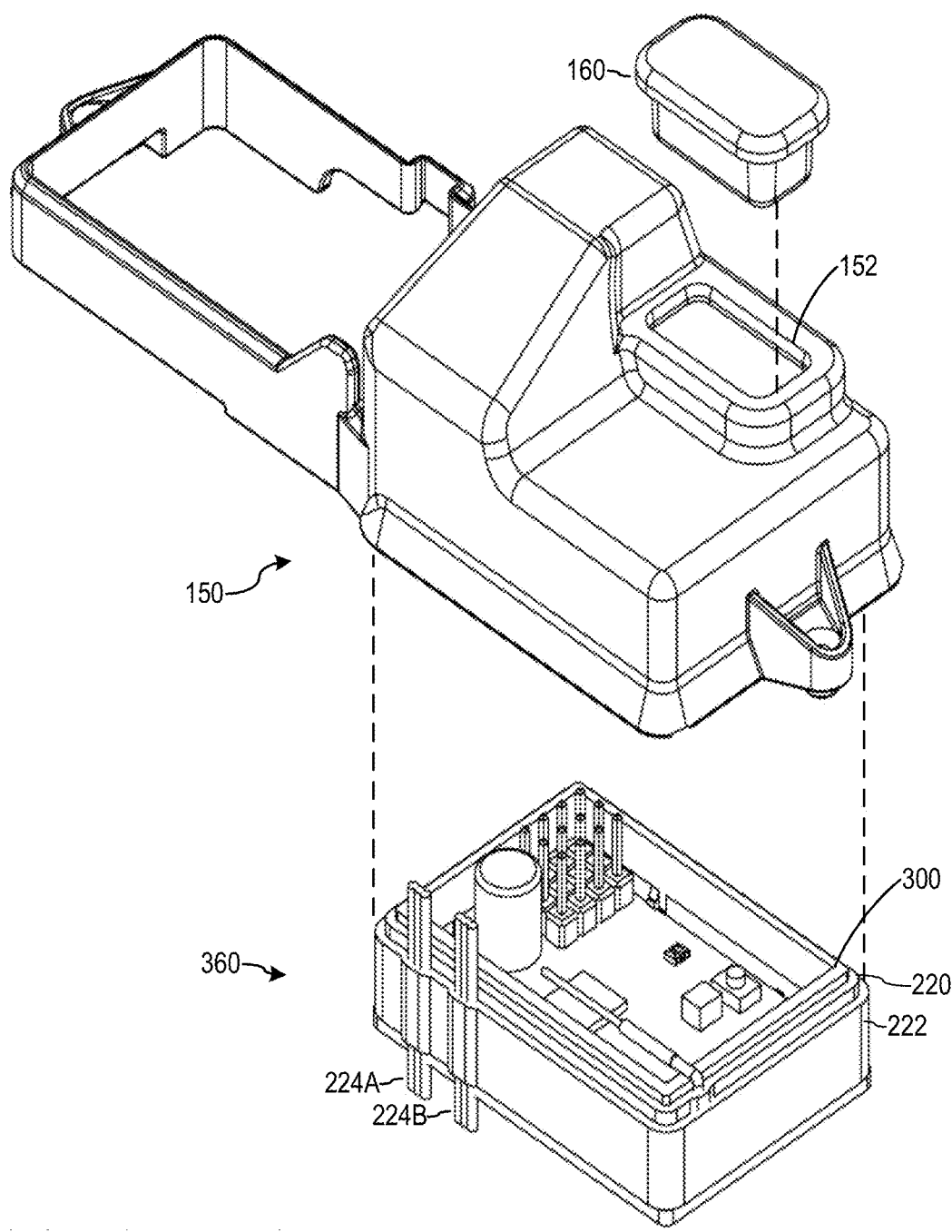
FIG. 64 is a partially exploded, perspective view of a cover member and sealing plug together with the housing having sealing materials applied of FIG. 62.
Figure 65:
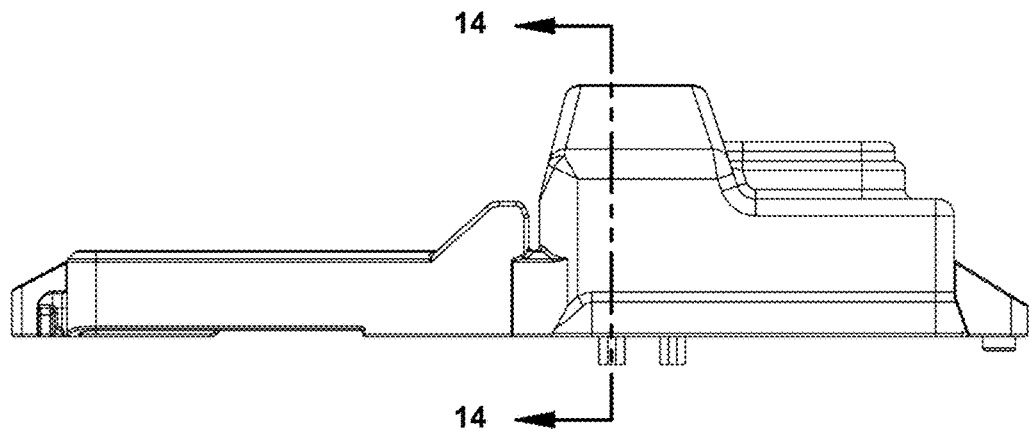
FIG. 65 is a side view of a cover member covering the sealed housing of FIG. 62.
Figure 66:
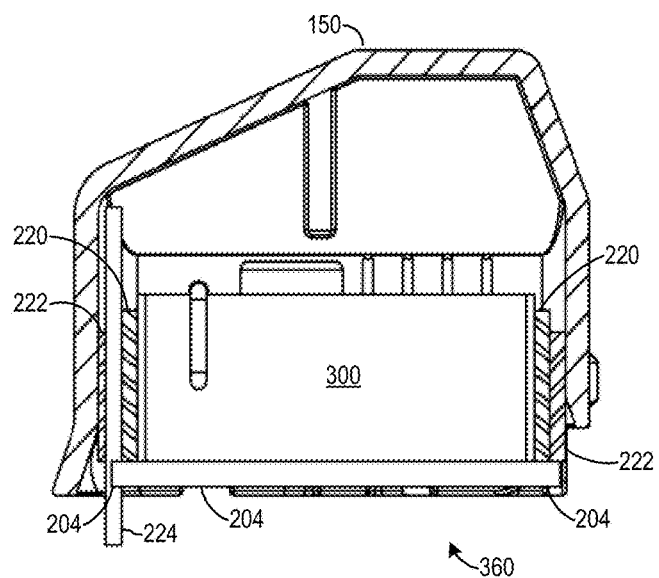
FIG. 66 is a partial cross-section of the cover member of FIG. 65, illustrating the cover member and sealing materials in cross-section, and an end view of the sealed housing of FIG. 62.
Figure 67:
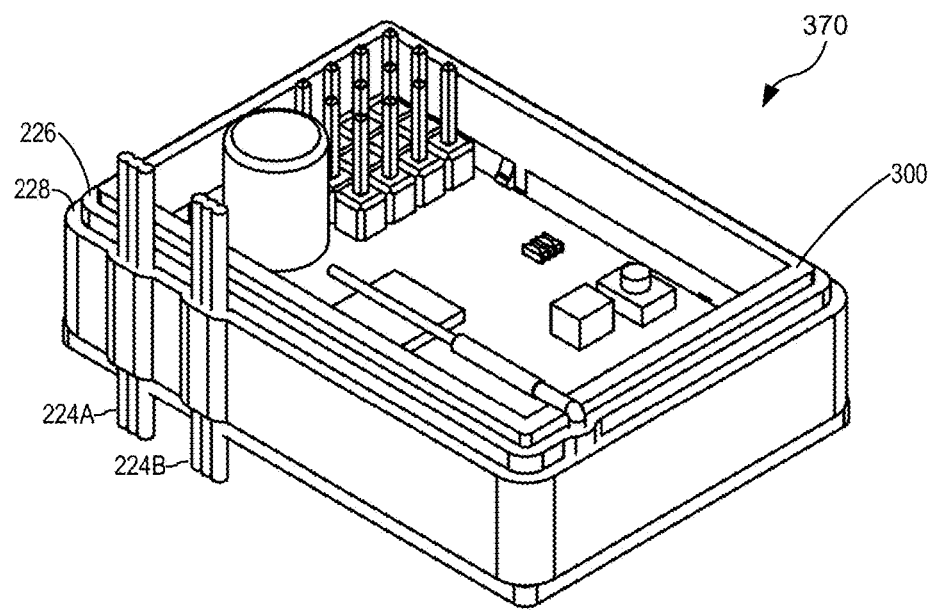
FIG. 67 is a perspective view of the housing of FIG. 46, with sealing materials applied.
Figure 68:
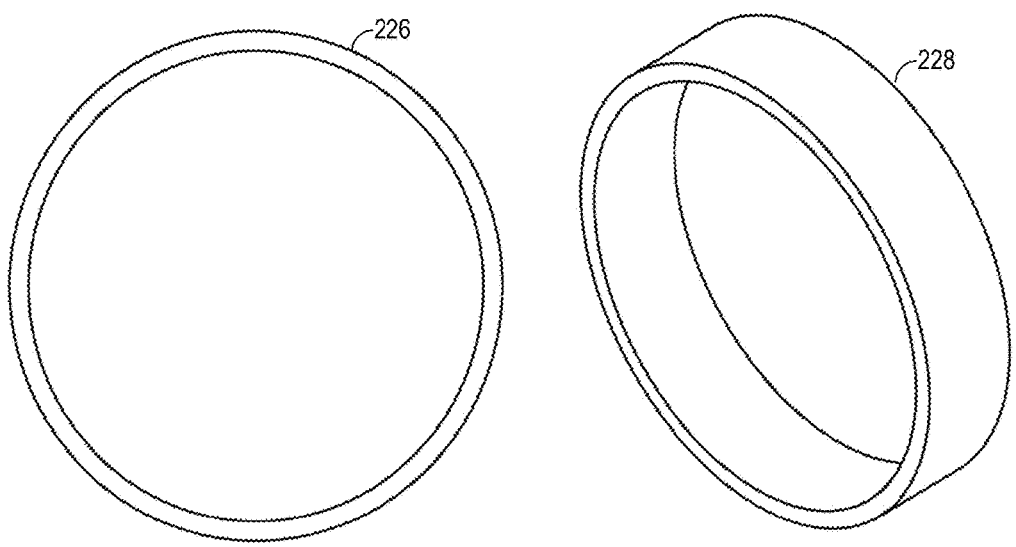
FIG. 68 illustrates sealing materials of FIG. 67 in top view and perspective view.
Figure 69:
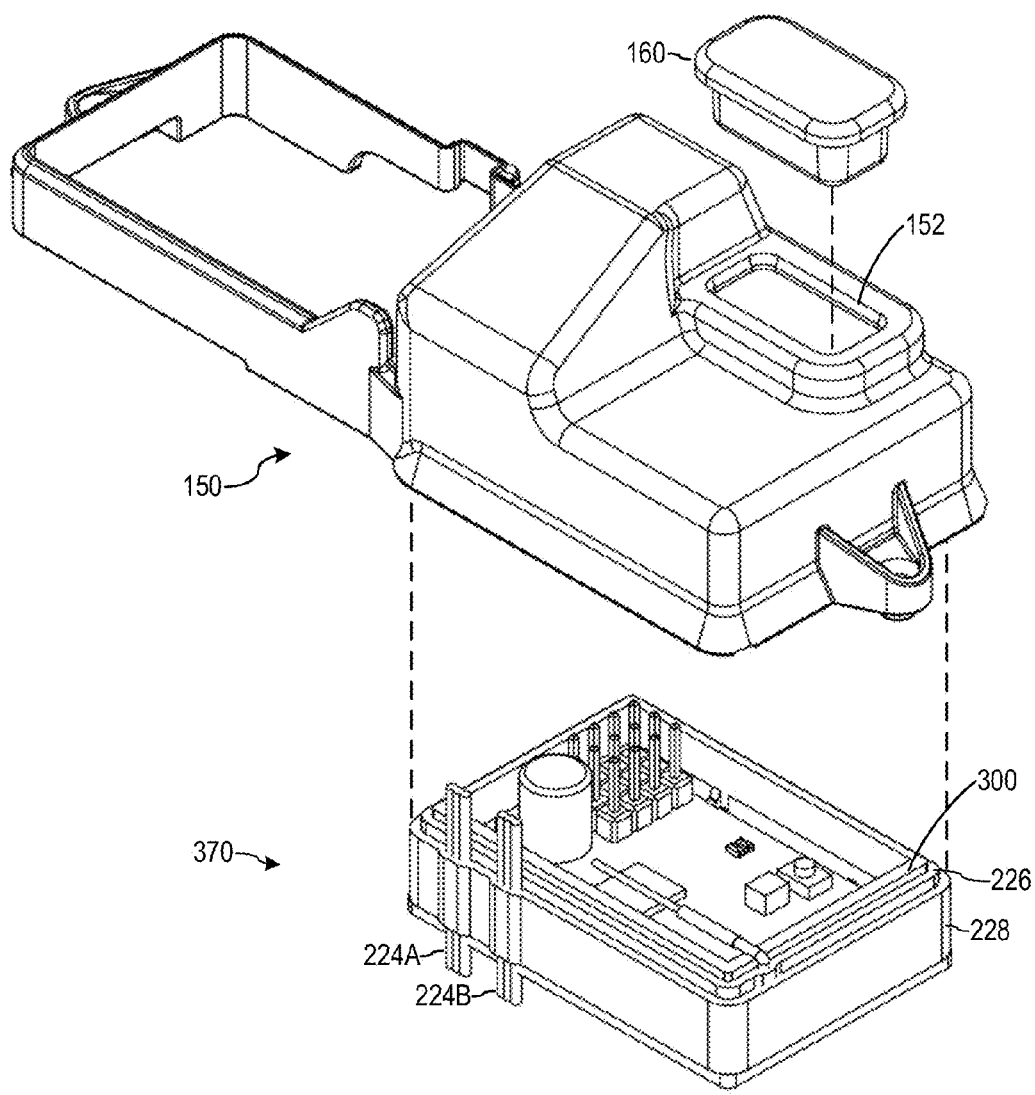
FIG. 69 is a partially exploded, perspective view of a cover member and sealing plug together with the housing having sealing materials applied of FIG. 67.
Figure 70:
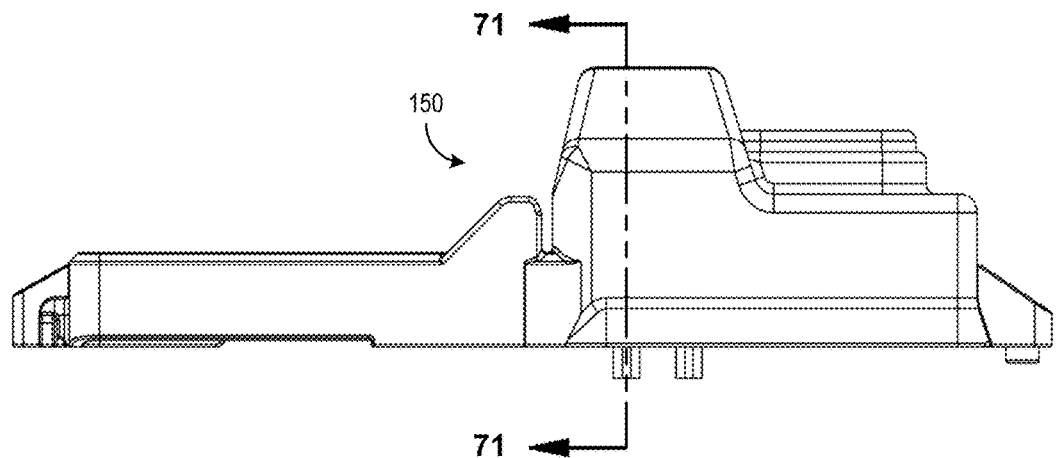
FIG. 70 is a side view of a cover member covering the sealed housing of FIG. 67.
Figure 71:
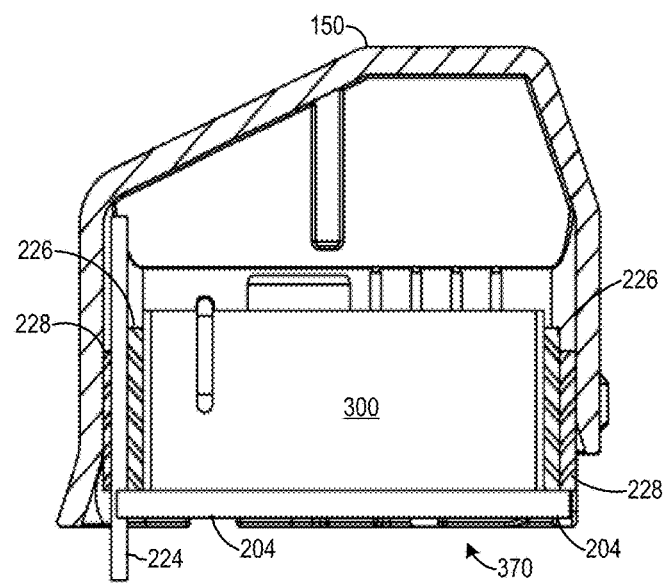
FIG. 71 is a partial cross-section of the cover member of FIG. 70, illustrating the cover member and sealing materials in cross-section, and an end view of the sealed housing of FIG. 67.
Figure 72:
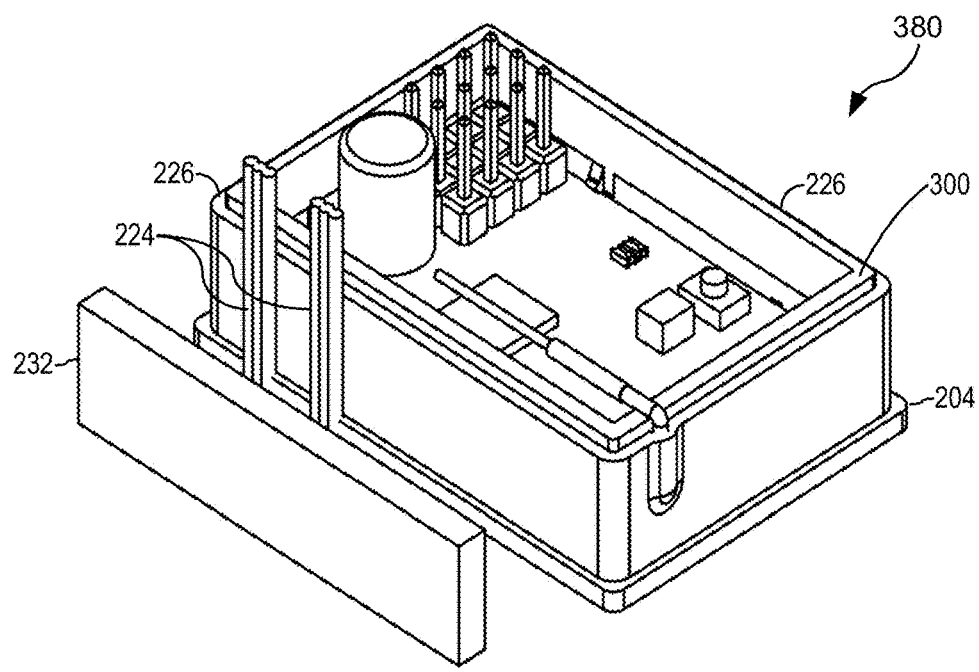
FIG. 72 is a perspective view of the housing of FIG. 46, with sealing materials applied.
Figure 73:
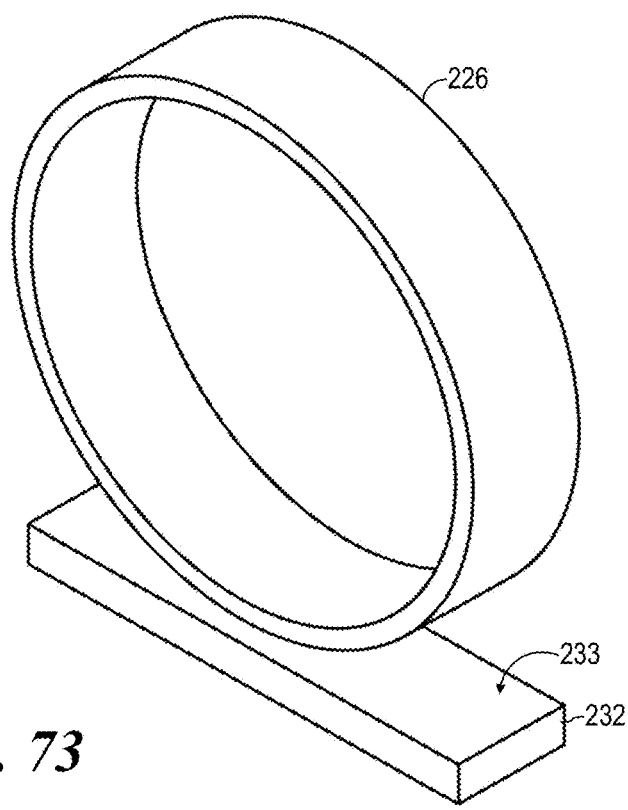
FIG. 73 is a perspective view of sealing materials of FIG. 72.
Figure 74:
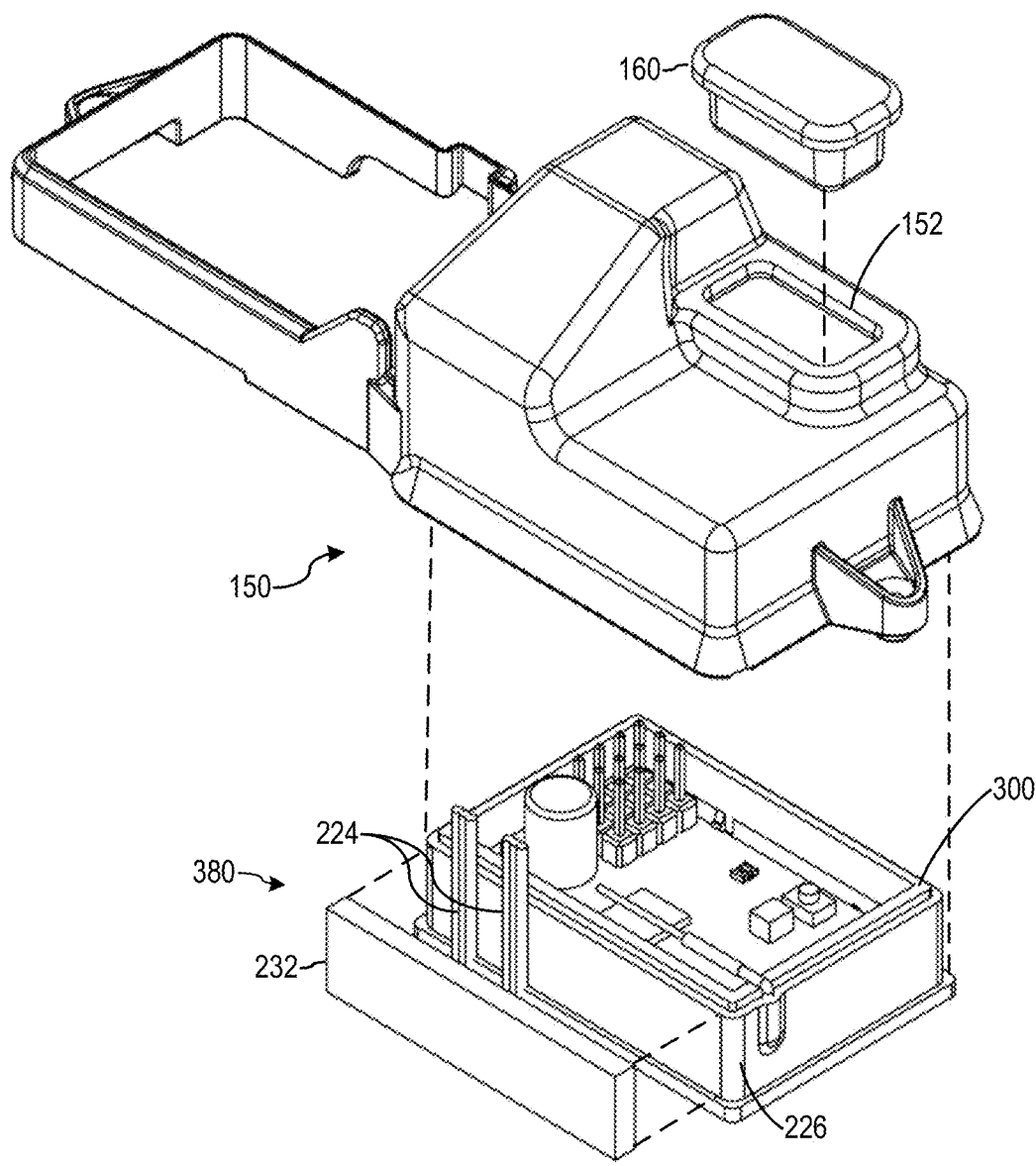
FIG. 74 is a partially exploded, perspective view of a cover member and sealing plug together with the housing having sealing materials applied of FIG. 72.
Figure 75:
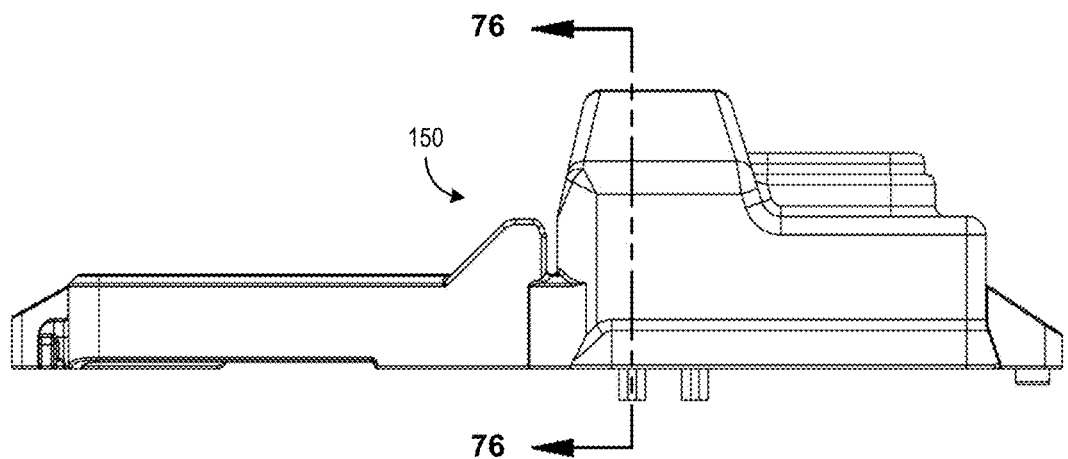
FIG. 75 is a side view of a cover member covering the sealed housing of FIG. 72.
Figure 76:
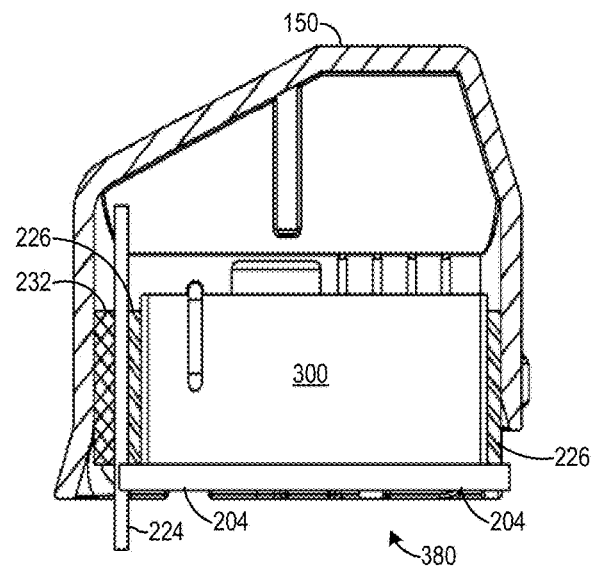
FIG. 76 is a partial cross-section of the cover member of FIG. 75, illustrating the cover member and sealing materials in cross-section, and an end view of the sealed housing of FIG. 72.

An alternative embodiment of the housing for enclosing electronic circuitry, a housing 300, is shown as shown in FIG. 46. As shown in FIG. 46, the bottom surface 304 of housing 300 may have a rectangular shape and four walls. The bottom surface 304 may form a base for supporting electronic components within the housing 300 and may be a closed end for forming a portion of an enclosure. In alternate embodiments, the bottom surface 304 may have a different shape and correspondingly more, or fewer, walls than shown in FIG. 46. For example, the bottom surface 304 may have a circular, ovoid, or any regular or irregular polygonal shape.

The housing 300 may include a bottom surface 304 and a plurality of walls 302 extending up from the bottom surface 304. The bottom surface 304 may have greater outer dimensions than the outer dimensions of the cross-sectional area formed by the walls 302, so that a "lip" or "flange" is formed at the bottom of the walls 302 and along the perimeter of the housing 300. In an embodiment, the "lip" or "flange" may extend outwardly from the walls 302 of the housing 300, forming a surface that is substantially coplanar with the bottom surface 304. In an alternative embodiment, the bottom surface 304 may extend only to the outer surface of each of the walls 302, so that the housing 300 has no "lip" or "flange." In other alternative embodiments, the "lip" or "flange" may be located at a height along the walls 302 such that the "lip" or "flange" is not coplanar with the bottom surface 304.

The housing 300 may include an aperture 306 for allowing an antenna 308 to pass through a wall 302 of the housing 300. The aperture 306 may be a hole through a wall of the housing 300. Although a single aperture 306 is shown, in alternative embodiments the housing 300 may include zero, one, or a plurality of apertures 306.

Within the volume of the housing 300 may be one or more electrical connectors 318 extending upward from the bottom surface 304. Electrical plugs, connectors, wiring, or the like may be coupled to the connectors 318.

Returning to FIG. 1, the first portion 110 and the second portion 120 may be configured to couple together to form a housing 100 for enclosing electronic circuitry. The first portion 110 and the second portion 120 may have cross-sections that correspond to one another such that the walls 114 of the first portion 110 may slide over the walls 124 of the second portion 120 to create the enclosed area within the housing 100. Alternatively, the first portion 110 and the second portion 120 may have cross-sections that correspond to one another such that the walls 114 of the first portion 110 may fit within the walls 124 of the second portion 120 to create the enclosed area within the housing 100. The first portion 110 and second portion 120 may be held together to form housing 100 by any method comprising the prior art, including the use of adhesives, fasteners, clipping mechanisms formed into the component parts, and the like.

The housing 100 may have a seam 102 between the first portion 110 and the second portion 120 where the first portion 110 couples to the second portion 120. The aperture 104 may be formed in the seam 102 between the first portion 110 and the second portion 120, and may allow an antenna 106 to pass through the housing 100 for electrical coupling to the electronic circuitry enclosed within the housing 100.

Figure 4:
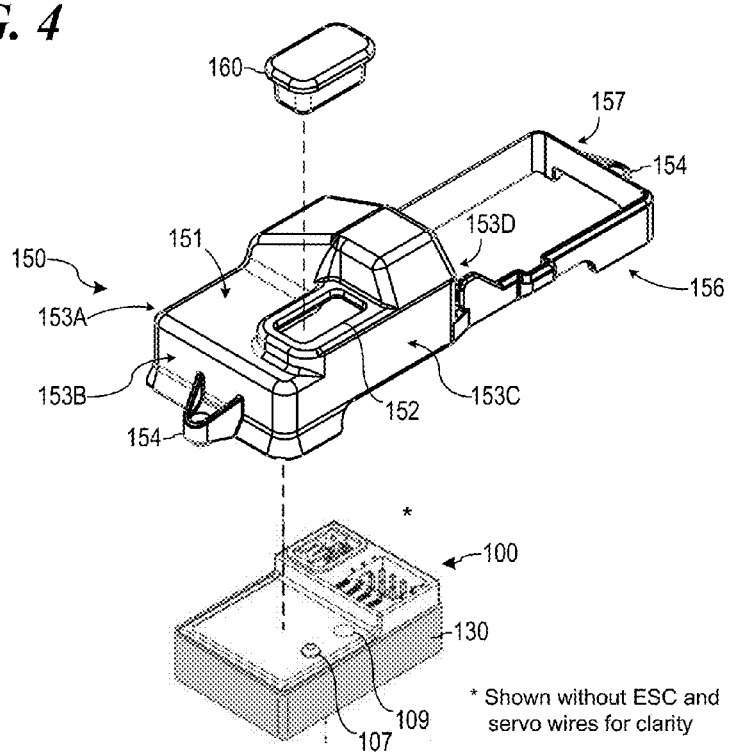
FIG. 4 is a partially exploded, perspective view of a cover member and sealing plug together with the housing having sealing materials applied.
Figure 5:
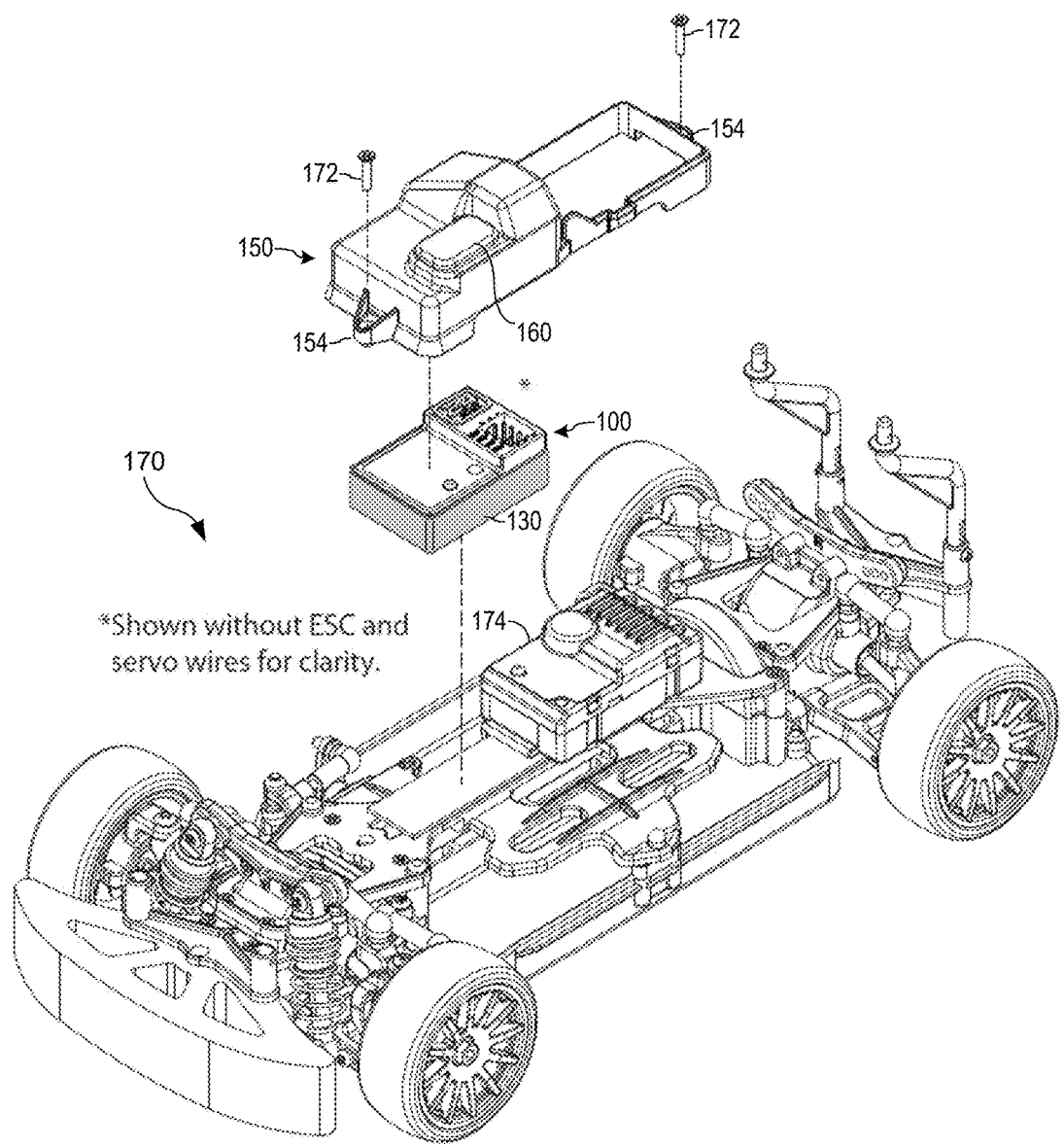
FIG. 5 illustrates installation of the cover member and housing with sealing materials applied into a chassis of a model vehicle.

Each of the housing embodiments described above, along with the variations to each housing embodiment, may have a watertight barrier configured to provide protection ranging from water-resistant to waterproof applied to it using the sealing member components and methods described below. The housing and watertight barrier configured to provide protection ranging from water-resistant to waterproof may be enclosed between a cover member 150 and a chassis 170 of a remote controlled vehicle, as shown in FIGS. 4 and 5. FIGS. 4 and 5 are illustrative of only one embodiment and should not be construed to limit the scope of the present invention. In alternative embodiments, the cover member 150 may be shaped to accommodate the various alternative configurations of the housings described above, and as shown in FIGS. 12, 17, 22, 27, 32, 37, 41, and 44-46, for example.

Turning now to FIG. 4, the cover member 150 may, in an embodiment, be a molded plastic enclosure having a top portion 151 and a plurality of walls descending therefrom. The cover member 150 may be open at the bottom to allow for one of the housing embodiments described above, along with the seal member components, described below, to be slid into the cover member 150 so that the walls of the cover member 150 at least partially overlap the walls of the housing to which the seal member, or seal members, are applied, forming a substantially continuous watertight barrier configured to provide protection ranging from water-resistant to waterproof between the walls of the cover member 150 and the housing. In an embodiment, the number and shape of the walls of cover member 150 may correspond to the walls of the particular housing, so that the cover member 150 may fit over the housing. It should be understood that the walls of the cover member 150 should be spaced apart from the walls of the housing by an appropriate amount to accommodate the thickness of any sealing member, or sealing members, applied to the perimeter of the housing.

In certain embodiments, the cover member 150 may have an opening or aperture 152, and be provided with a sealing plug 160 for forming a watertight barrier configured to provide protection ranging from water-resistant to waterproof at the edges of the aperture 152. In an embodiment, as shown in FIG. 4, the cover member 150 may comprise a structure having an upper surface 151 and a plurality of walls 153A-153D descending from the upper surface 151. The upper surface 151 may have an aperture 152 that may be positioned in correspondence with the control input 107 and the indicator 109 present on an upper surface 112 of the housing 100. Alternatively, the upper surface 151 may have an aperture 152 positioned in correspondence with the control inputs 212 and the indicators 214 of the housing 200. In certain embodiments, the upper surface 151 may be provided with a contoured shape designed to enclose features or components of a housing, such as electrical wiring, control inputs, and/or indicators, for example.

In an embodiment, the cover member 150 may have one or more mounting features 154 formed into the one or more walls 153. The one or more mounting features 154 may be flanges having through-holes for receiving a mechanical fastener, such as a screw. In certain embodiments the cover member 150 may be provided with a mounting frame 156 extending from one end of the cover member 150.

Figure 6:
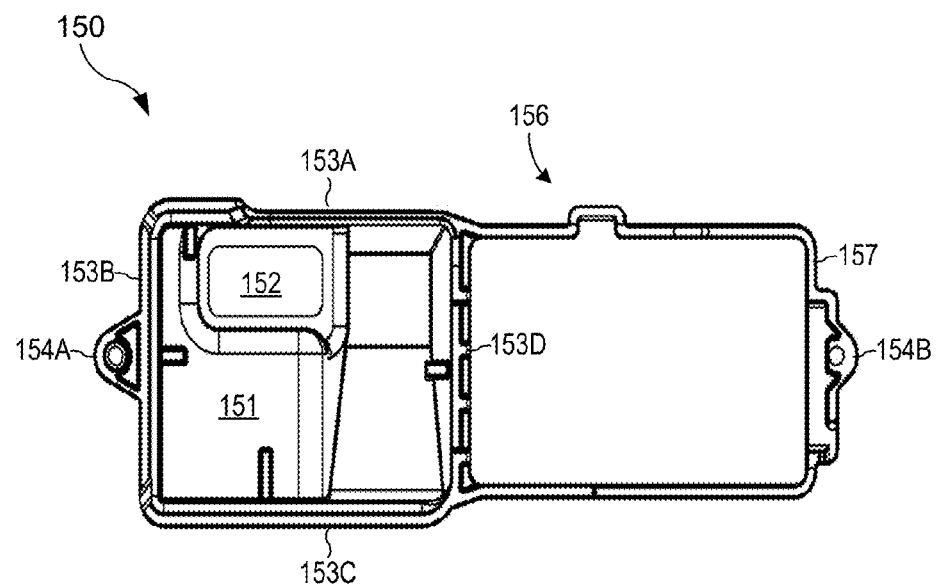
FIG. 6 is a plan view of a cover member from the underside thereof.
Figure 7:
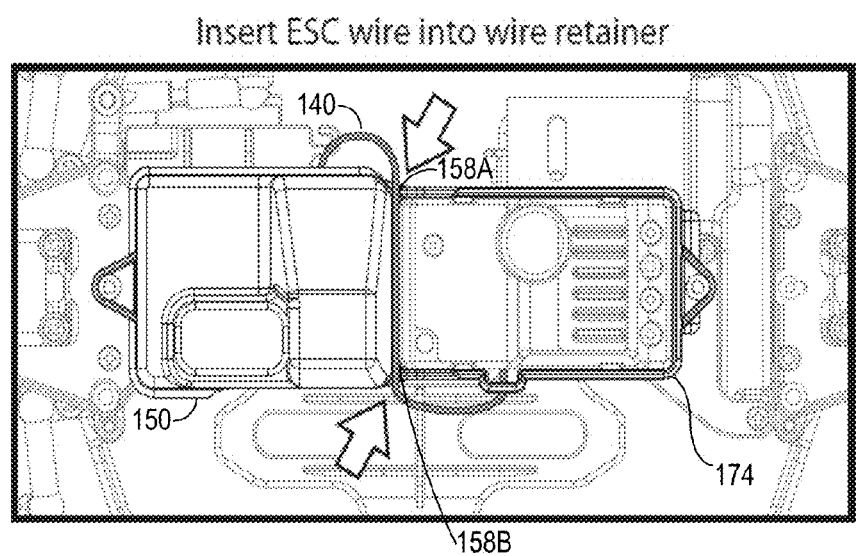
FIG. 7 is a plan view of a covered electronics housing installed in a model vehicle, showing electrical wiring routed between enclosures.
Figure 8A:
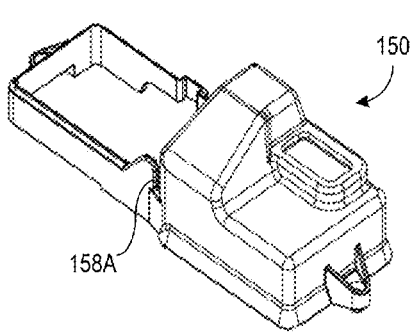
FIGS. 8A and 8B are perspective views of a cover.
Figure 8B:
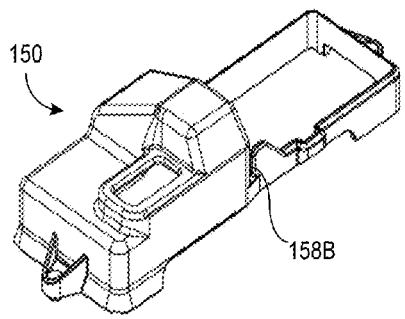
Figure 8C:
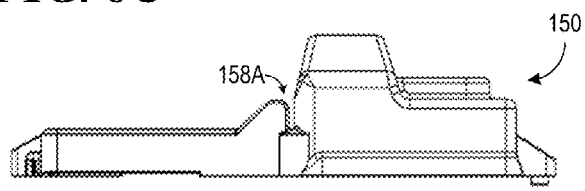
FIGS. 8C and 8D are side views of a cover.
Figure 8D:
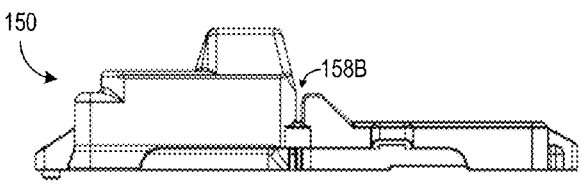
Figure 8E:
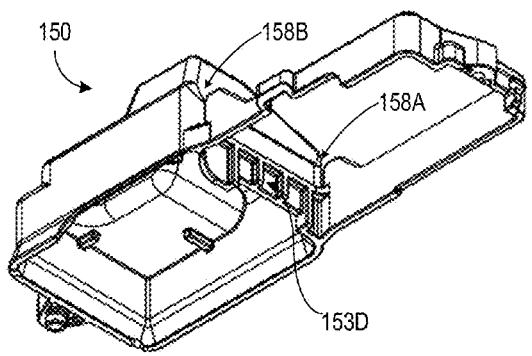
FIG. 8E is a perspective view of a cover from the underside.

As shown in FIG. 6, in an embodiment, the mounting frame 156 may extend generally coplanar with walls 153C and 153A, extending beyond wall 153D, having mounting feature 154B formed into a distal side 157 of mounting frame 156, and may be designed to fit around another electronics enclosure or other component of a model vehicle.

Turning now to FIG. 5, in an embodiment, the housing 100 and sealing member 130 may be placed into cover member 150, having sealing plug 160 installed in aperture 152 as described above, with the upper surface and all four walls of housing 100 at least partially enclosed within the cover member 150 together with the flexible antenna (not shown), electrical wiring (not shown), and the sealing member 130. The lower surface of the housing 100 may be exposed to the surrounding environment. The cover member 150 having the housing 100 with sealing member 130 adhered thereto, may be installed on a chassis 170 of a model vehicle and secured using suitable mechanical fasteners, such as screws 172, through mounting features 154.

In an embodiment, the mounting frame 156 may fit around a protective enclosure 174 already positioned on the chassis 170. FIG. 5 is intended to be illustrative only. Any of the housing embodiments discussed above, as well as the variations of each embodiment, with any of the sealing members, discussed below, applied to the housing may be enclosed between the cover member 150 and the chassis 170 in a manner similar to that shown.

Turning now to FIG. 7 and FIG. 8A-8E, electrical wiring 140 may be routed across the top of cover member 150, inserted into wire retainer features 158A and 158B which may be slots formed into the mounting frame 156 adjacent to wall 153D. A first end of electrical wiring 140 may be retained and protected under the cover member 150. A second end of electrical wiring 140 may be retained and protected within the protective enclosure 174.

Figure 2:
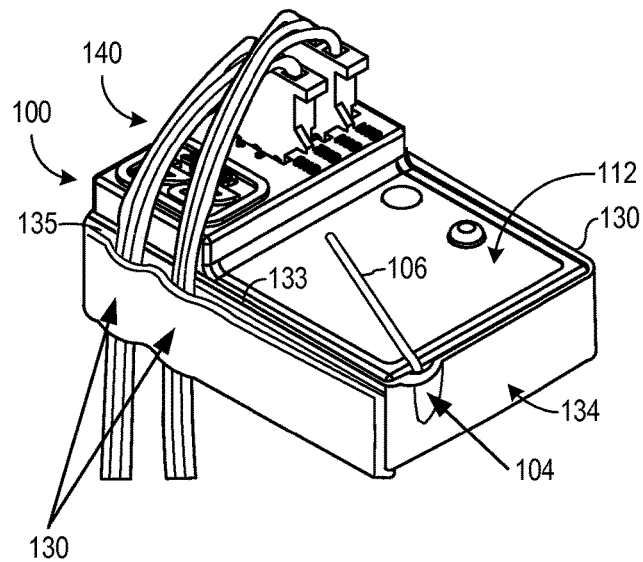
FIG. 2 is a perspective view of the housing with sealing materials applied.
Figure 3A:
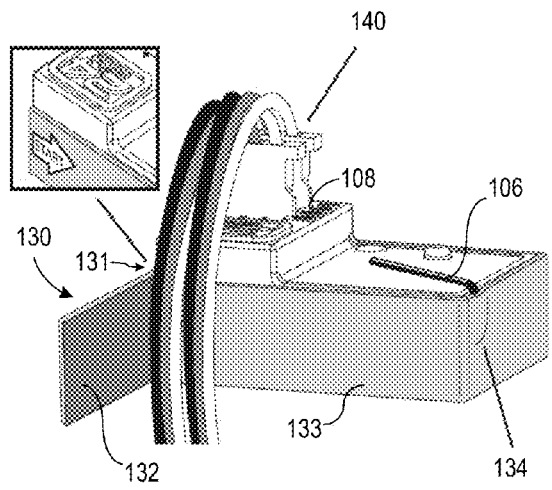
FIG. 3A-3B illustrate a method for applying sealing materials.
Figure 3B:
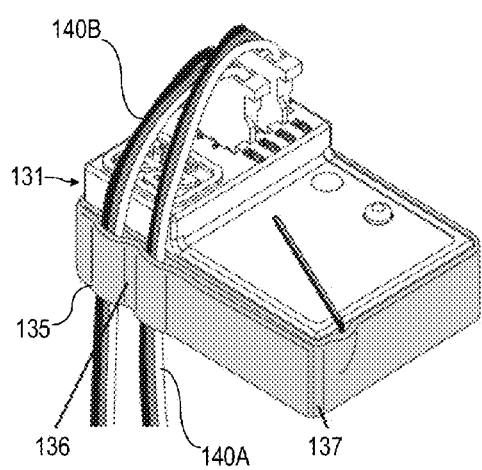

Referring to FIGS. 2, 3A and 3B, a first embodiment of a method of forming a watertight barrier configured to provide protection ranging from water-resistant to waterproof along the perimeter of the housing 100 is shown. Although the housing 100 is shown, the present embodiment and method may also be provided for with any of the housing embodiments described, or any variation of the housing embodiments described above.

According to the present embodiment and method, tape strip 130 may be used as a sealing member. Tape strip 130 may be placed along the perimeter of the housing 100 to cover the seam 102 between the first portion 110 and the second portion 120 of the housing 100. The tape strip 130 may be a continuous strip of viscoelastic or elastomeric material. The tape strip 130 may be made from rubber, foam, or some other similar open cell or closed cell viscoelastic or elastomeric material. The tape strip 130 may further be made of a material that is water resistant and deformable.

An adhesive may be applied to the tape strip 130 or the housing 100 for securing the tape strip 130 to the perimeter of the housing 100. The tape strip 130 may be pre-coated with an adhesive along surface 132 (FIG. 3A) for applying the tape strip 130 to the walls of the housing 100. Alternatively, the tape strip 130 may be pre-coated with an adhesive along both walls of the tape strip 130. In a further alternative embodiment, the tape strip 130 may have no surface that is pre-coated with an adhesive.

The tape strip 130 may be approximately as wide as the height of the housing 100 and have a length of at least the length of the perimeter of the housing 100. In an embodiment, the tape strip 130 may be of a length sufficient to allow for tape strip 130 to be wrapped around the perimeter of the housing 100 plus overlap one wall of the housing 100, such that one wall of the housing 100 is covered by two layers of the tape strip 130.

In the particular embodiment shown in FIGS. 2, 3A and 3B, illustrating the presently described sealing method, the tape strip 130 may be adhesively attached to the perimeter of the housing 100, starting at a first corner 131. The tape strip 130 may be adhesively attached to the four walls comprising the perimeter of the housing 100 to form a first layer 133 of foam around the perimeter of the housing 100. The antenna 106 may be bent upward and folded over the upper surface 112 of the housing 100 as the first layer 133 of the tape strip 130 is adhered to the walls of housing 100 so that the antenna 106 may be trapped between the first layer 133 and the housing 100.

Electrical wiring 140, coupled to the electrical connectors 108, may be routed alongside the housing 100 on one wall and trapped between the first layer 133 and a second layer 135 of the tape strip 130. One or more small gaps 136 should be disposed between separate bundles of electrical wiring 140A and 140B, as shown in FIG. 3B, as required. It should be appreciated that where only one bundle exists, no gap would be required, and where three or more bundles may exist, two or more gaps may be required correspondingly. The second layer 135 may overlap a portion of the perimeter of the housing 100 covered by the first layer 133, and terminate at the corner 137. Any excess tape strip 130 material should be cut off at the corner 137. The electrical wiring 140 is thereby trapped between the first layer 133 and the second layer 135 of tape strip 130.

The housing 100 with the tape strip 130 attached, as described above, may be slid into the cover member 150 so that the outer surface of tape strip 130 makes contact with inner surfaces of the cover member 150 as shown in FIG. 4. The inner surface of the cover member 150 may provide a compressive force along the walls of the housing 100 covered by the first layer 133 and the second layer 135 of the tape strip 130. The housing 100, the tape strip 130, and the cover member 150 thereby create a watertight boundary along the perimeter of the housing 100 as the compressed tape strip 130 "flows" to fill the gaps between the outer surface of the housing 100 and the inner surface of the cover member 150.

A watertight barrier configured to provide protection ranging from water-resistant to waterproof is maintained on the wall 134 of the housing 100 by the first layer 133 that contacts the wall of the lower portion 120 of housing 100, in an area below the aperture 104 through which antenna 106 passes. As shown by the shaded area 134 in FIG. 2, the tape strip 130 maintains adhesive contact with the wall of the housing 100 except for a relatively small area adjacent the antenna 106. A watertight barrier configured to provide protection ranging from water-resistant to waterproof is created around the wires of electrical wiring 140 by the tape strip 130 of the first layer 133 and the second layer 135 "flowing" to fill gaps so the tape strip 130 is pressed tightly around the wires 140.

An embodiment of a method of forming a watertight barrier configured to provide protection ranging from water-resistant to waterproof along the perimeter of a housing is shown in FIGS. 10-14 as assembly 230. FIGS. 10-14 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Figure 10:
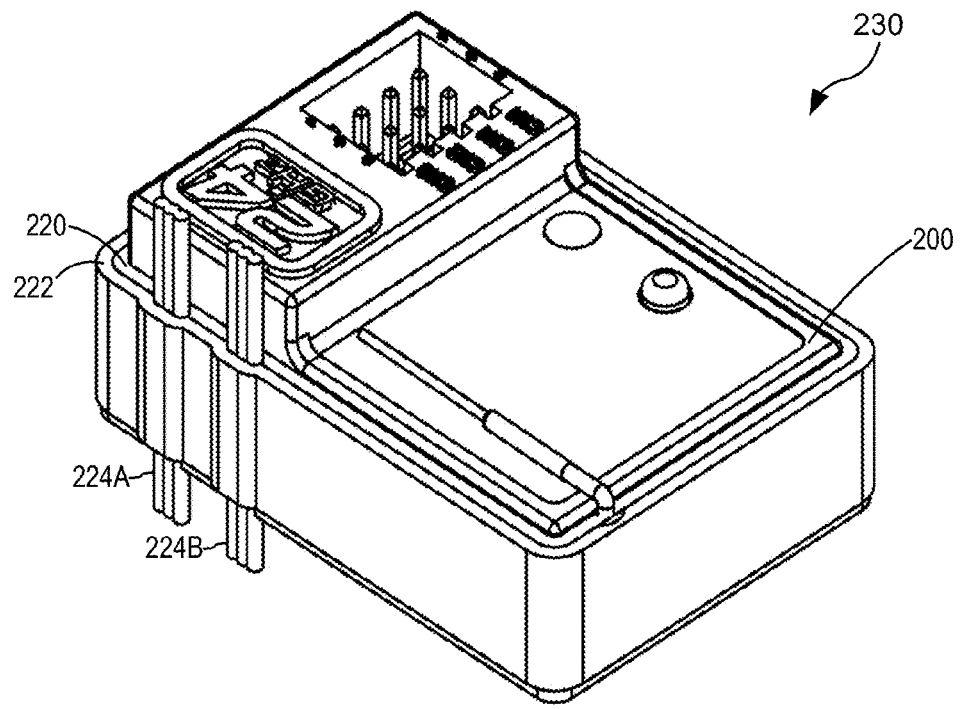
FIG. 10 is a perspective view of the housing of FIG. 9, with sealing materials applied.
Figure 11A:
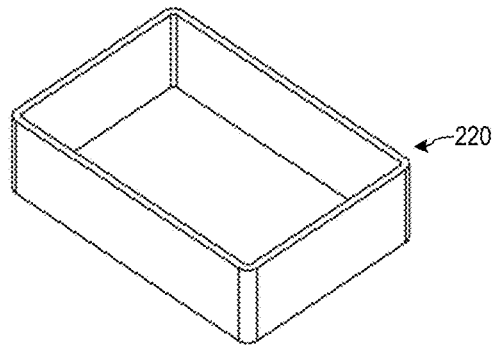
FIGS. 11A and 11B are perspective views of sealing materials of FIG. 10.
Figure 11B:
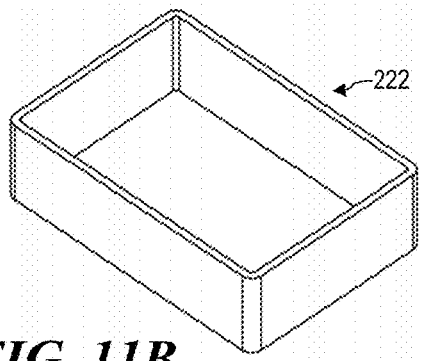

Referring first to FIG. 10, a watertight barrier configured to provide protection ranging from water-resistant to waterproof may be formed around the housing 200 and the wiring bundles 224A and 224B using an inner sealing band 220 and an outer sealing band 222 as seal members. The inner sealing band 220 and the outer sealing band 222 may each be a loop of material and have a shape that is substantially coincident to the particular housing to which the inner sealing band 220 and the outer sealing band 222 may be applied. For example, in the particular embodiment shown in FIGS. 10, 11A, and 11B, the inner sealing band 220 and the outer sealing band 222 may have a rectangular shape.

In alternative embodiments, the inner sealing band 220 and/or the outer sealing band 222 may be comprised of one or more lengths or strips of material that may be applied to the one or more walls of a housing and configured to create a continuous "loop" of material along the one or more walls of a housing. Alternatively, in an embodiment, the inner sealing band 220 and/or the outer sealing band 222 may be a single strip of material that may be placed along one or more walls 202 of the housing 200, without forming a continuous "loop" of material.

Both the inner sealing band 220 and the outer sealing band 222 may be semi-rigid, die cut, and formed from rubber, foam, or some other similar open cell or closed cell viscoelastic or elastomeric material. In an embodiment, the inner sealing band 220 and the outer sealing band 222 may be rubber bands, for example. The material may further be water resistant and deformable.

The inner sealing band 220 and the outer sealing band 222 may have perimeter dimensions that are substantially similar to the perimeter dimensions of the housing 200. Alternatively, the inner sealing band 220 and the outer sealing band 222 may be configured to have a smaller perimeter length than the housing 200, allowing for the sealing band to be "stretched" over the perimeter of the housing 200. The inner sealing band 220 and the outer sealing band 222 may have a height that is substantially the same as the height of the housing 200.

Figure 14:
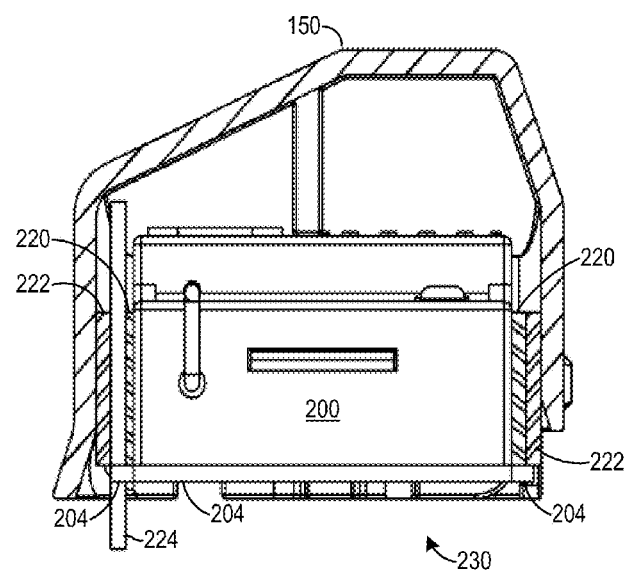
FIG. 14 is a partial cross-section of the cover member of FIG. 13, illustrating the cover member and sealing materials in cross-section, and an end view of the sealed housing of FIG. 10.

Referring to FIG. 10, a watertight barrier configured to provide protection ranging from water-resistant to waterproof may be formed along the outer perimeter of the housing 200 by first placing the inner sealing band 220 around the housing 200 and pressing the inner sealing band 220 down against the flange 204 (FIG. 14). If the housing 200 is equipped with an antenna, the antenna may be trapped between the sealing band 220 and the housing 200, as shown in FIG. 10.

The elasticity of the inner sealing band 220 may ensure that the inner sealing band 220 remains in contact with the housing 200. The inner sealing band 220 may be applied to housing 200 in this manner without the use of an adhesive between the inner sealing band 220 and the housing 200. Alternatively, in an embodiment, an adhesive may be applied between the inner sealing band 220 and the housing 200.

With the inner sealing band 220 in place, the wire bundles 224A and 224B may be positioned so that they pass over the inner sealing band 220, as shown in FIG. 10. The outer sealing band 222 may then be placed around the housing 200, over the inner sealing band 220 and the wire bundles 224A and 224B so the wire bundles 224A and 224B may be trapped between inner sealing band 220 and outer sealing band 222. As previously described in reference to FIG. 3B, one or more small gaps should be disposed between separate wire bundles 224A and 224B, as required. It should be appreciated that where only one bundle exists, no gap would be required, and where three or more bundles may exist, two or more gaps may be required, correspondingly.

The elasticity of the outer sealing band 222 may ensure that the outer sealing band 222 remains in contact with the inner sealing band 220. The outer sealing band 222 may be placed over the inner sealing band 220 without the use of an adhesive between the outer sealing band 222 and the inner sealing band 220. Alternatively, in an embodiment, an adhesive may be applied between the outer sealing band 222 and the inner sealing band 220.

Figure 12:
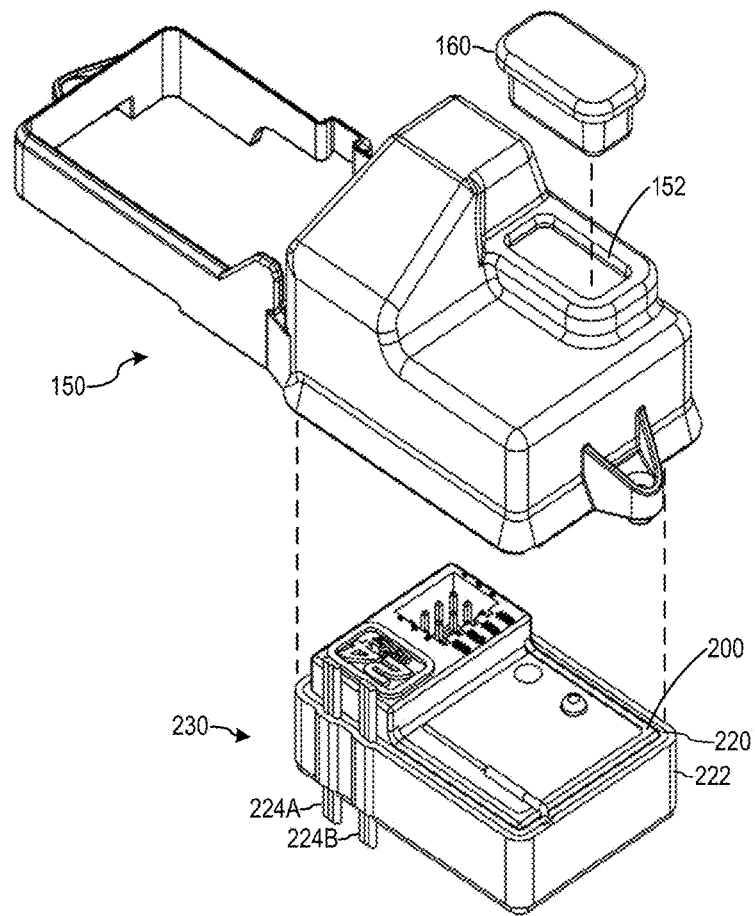
FIG. 12 is a partially exploded, perspective view of a cover member and sealing plug together with the housing having sealing materials applied of FIG. 10.

The assembly 230, with sealing members 220 and 222 applied as described above, may be inserted into the cover member 150, as shown in FIG. 12, so that the walls of cover member 150 at least partially overlap each of the walls of the housing 200 covered by the inner sealing band 220 and the outer sealing band 222, forming a substantially continuous watertight barrier configured to provide protection ranging from water-resistant to waterproof between the walls of the cover member 150 and the housing 200.

Figure 13:
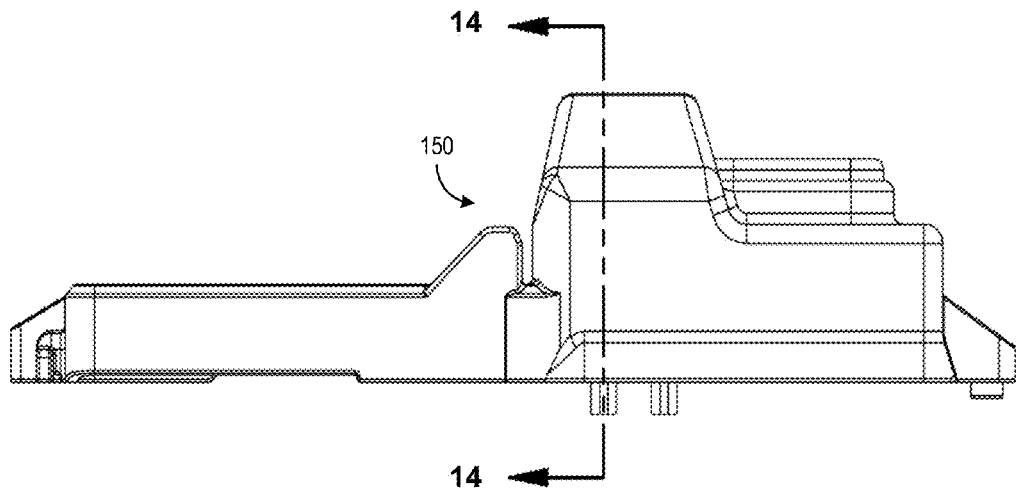
FIG. 13 is a side view of a cover member covering the sealed housing of FIG. 10.

As assembled, shown in FIGS. 13 and 14, the inner surfaces of cover member 150 may press against the outer sealing band 222 of assembly 230. The compressive force may cause the viscoelastic or elastomeric material of outer sealing band 222 to "flow" into any gaps between the inner surface of the cover member 150 and the outer sealing band 222, forming a watertight barrier configured to provide protection ranging from water-resistant to waterproof between the cover member 150 and the outer sealing band 222.

Similarly, the outer sealing band 222 may press against the inner sealing band 220, causing the viscoelastic or elastomeric material of both sealing members to "flow" into the gaps between the outer sealing band 222 and in the inner sealing band 220 and around the wire bundles 224. A watertight barrier configured to provide protection ranging from water-resistant to waterproof between the outer sealing band 222 and the inner sealing band 220 and around wire bundles 224A and 224B as the viscoelastic or elastomeric sealing members may be formed. The material of inner sealing band 220 may also "flow" to form a watertight barrier configured to provide protection ranging from water-resistant to waterproof between the inner sealing band 220 and the housing 200.

An embodiment of the present method of forming a watertight barrier configured to provide protection ranging from water-resistant to waterproof along the perimeter of the housing 300 is shown in FIGS. 62-66 as assembly 360. The sealing components and their application to housing 300 are substantially the same as described above, in reference to the housing 200, and are not repeated here.

An embodiment of another method of forming a watertight barrier configured to provide protection ranging from water-resistant to waterproof along the perimeter of a housing is shown in FIGS. 15-19 as assembly 240. FIGS. 15-19 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Referring first to FIG. 15, a watertight barrier configured to provide protection ranging from water-resistant to waterproof may be formed around the housing 200 and the wiring bundles 224A and 224B using the inner sealing band 226 and the outer sealing band 228 as seal members. The inner sealing band 226 and the outer sealing band 228 may each be a continuous loop of material and each may have a circular shape, as shown in FIGS. 16A and 16B, respectively.

In alternative embodiments, the inner sealing band 226 and/or the outer sealing band 228 may be lengths of material or one or more strips of material that may be applied to the one or more walls of a housing and configured to create a continuous "loop" of material along the one or more walls of a housing. Alternatively, in an embodiment, the inner sealing band 226 and/or the outer sealing band 228 may be a single strip of material that may be placed along one or more walls 202 of the housing 200, without forming a continuous "loop" of material.

Both the inner sealing band 226 and the outer sealing band 228 may be semi-rigid, die cut, and formed from rubber, foam, or some other similar open cell or closed cell viscoelastic or elastomeric material. In an embodiment, the inner sealing band 226 and the outer sealing band 228 may be rubber bands, for example. The material may further be water resistant and deformable.

The inner sealing band 226 and the outer sealing band 228 may each have a circumferential dimension that is substantially equal to the perimeter dimension of the housing 200. Alternatively, the inner sealing band 226 and the outer sealing band 228 may be configured to have a smaller circumferential length than the perimeter length of the housing 200, allowing for the sealing band to be "stretched" over the perimeter of the housing 200. The inner sealing band 226 and the outer sealing band 228 may have a height that is substantially the same as the height of the housing 200.

Figure 19:
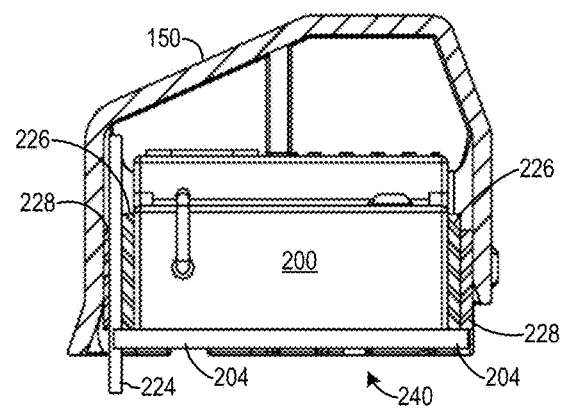
FIG. 19 is a partial cross-section of the cover member of FIG. 18, illustrating the cover member and sealing materials in cross-section, and an end view of the sealed housing of FIG. 10.

Referring to FIG. 15, a watertight barrier configured to provide protection ranging from water-resistant to waterproof may be formed along the outer perimeter of the housing 200 by first placing the inner sealing member around the housing 200 and pressing the inner sealing band 226 down against the flange 204 (FIG. 19). If the housing 200 is equipped with an antenna, the antenna may be trapped between the sealing band 226 and the housing 200, as shown in FIG. 15. The elasticity of the inner sealing band 226 may ensure that the inner sealing band 226 remains in contact with the housing 200. The inner sealing band 226 may be applied to housing 200 in this manner without the use of an adhesive between the inner sealing band 226 and the housing 200. Alternatively, in an embodiment, an adhesive may be applied between the inner sealing band 226 and the housing 200.

With the inner sealing band 226 in place, the wire bundles 224A and 224B may be positioned so that they pass over the inner sealing band 226, as shown in FIG. 15. The outer sealing band 228 may then be placed around the housing 200, over the inner sealing band 226 and the wire bundles 224A and 224B so the wire bundles 224A and 224B may be trapped between inner sealing band 226 and outer sealing band 228. As previously described in reference to FIG. 3B, one or more small gaps should be disposed between separate wire bundles 224A and 224B, as required. It should be appreciated that where only one bundle exists, no gap would be required, and where three or more bundles may exist, two or more gaps may be required, correspondingly.

The elasticity of the outer sealing band 228 may ensure that the outer sealing band 228 remains in contact with the inner sealing band 226. The outer sealing band 228 may be placed over the inner sealing band 226 without the use of an adhesive between the outer sealing band 228 and the inner sealing band 226. Alternatively, in an embodiment, an adhesive may be applied between the outer sealing band 228 and the inner sealing band 226.

Figure 17:
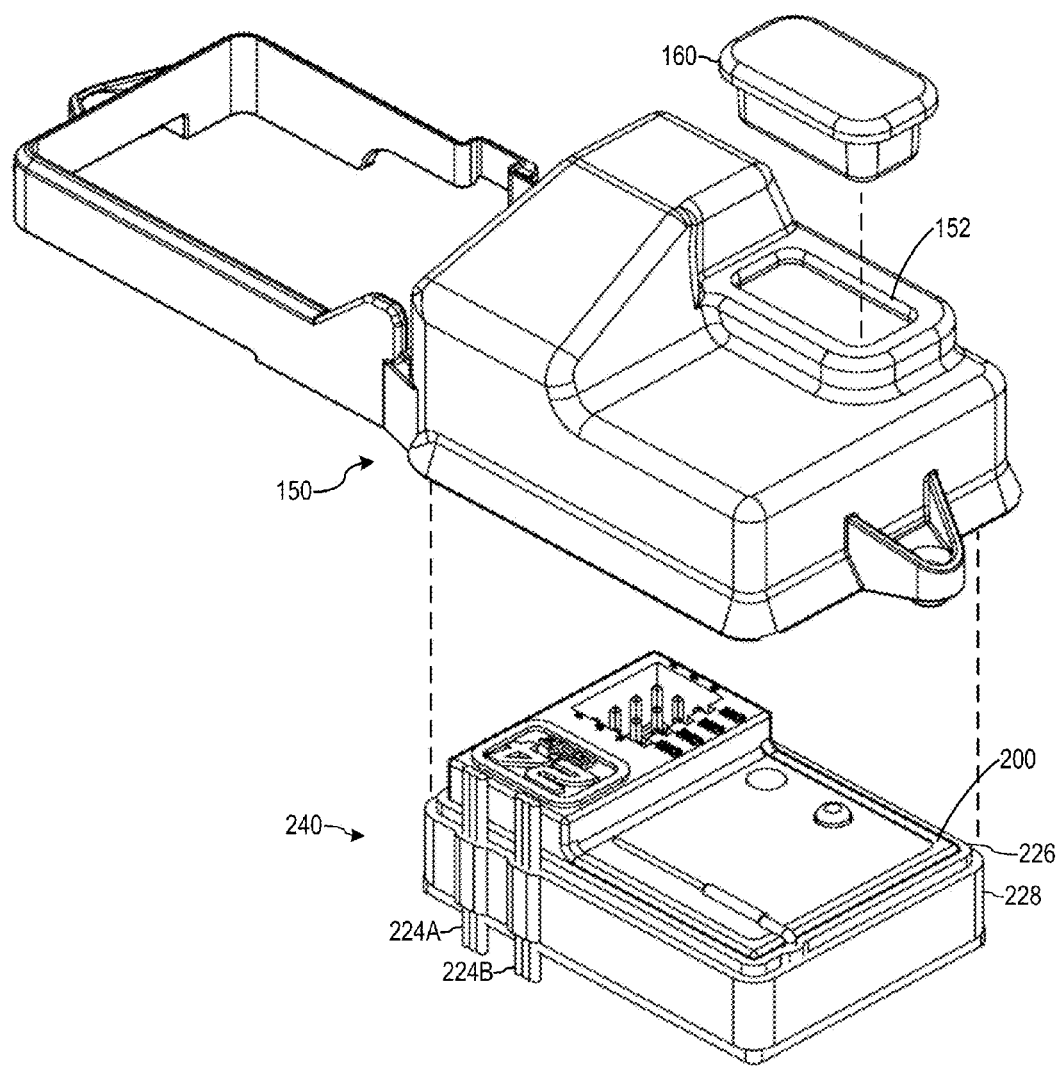
FIG. 17 is a partially exploded, perspective view of a cover member and sealing plug together with the housing having sealing materials applied of FIG. 15.

The assembly 240, with inner sealing band 226 and outer sealing band 228 applied as described above, may be inserted into the cover member 150, as shown in FIG. 17, so that the walls of cover member 150 at least partially overlap each of the walls of the housing 200 covered by the inner sealing band 226 and the outer sealing band 228, forming a substantially continuous watertight barrier configured to provide protection ranging from water-resistant to waterproof between the walls of the cover member 150 and the housing 200.

Figure 18:
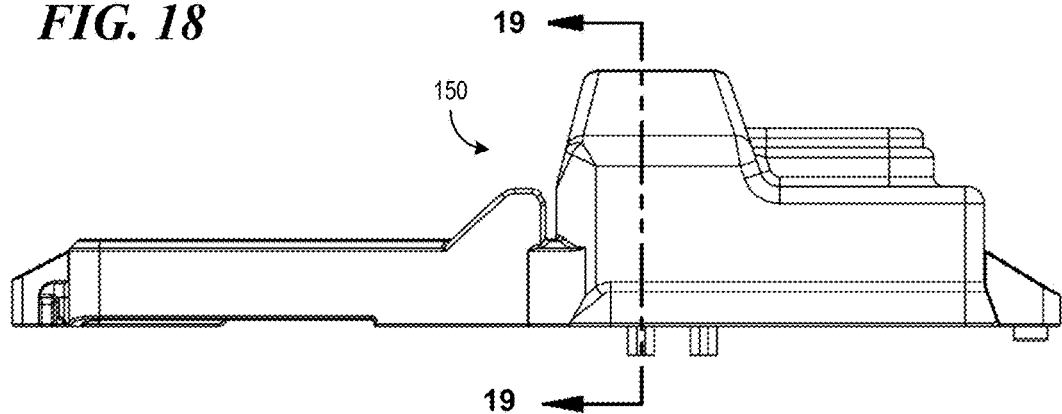
FIG. 18 is a side view of a cover member covering the sealed housing of FIG. 15.

As assembled, shown in FIGS. 18 and 19, the inner surfaces of cover member 150 may press against the outer sealing band 228 of assembly 240. The compressive force may cause the material of outer sealing band 228 to "flow" into any gaps between the inner surface of the cover member 150 and the outer sealing band 228, forming a watertight barrier configured to provide protection ranging from water-resistant to waterproof between the cover member 150 and the outer sealing band 228.

Similarly, the outer sealing band 228 may press against the inner sealing band 226, causing the material of both sealing members to "flow" into the gaps between the outer sealing band 228 and in the inner sealing band 226 and around the wire bundles 224. A watertight barrier configured to provide protection ranging from water-resistant to waterproof between the outer sealing band 228 and the inner sealing band 226 and around wire bundles 224A and 224B may be formed. The material of inner sealing band 226 may also "flow" to form a watertight barrier configured to provide protection ranging from water-resistant to waterproof between the inner sealing band 226 and the housing 200.

An embodiment of the present method of forming a watertight barrier configured to provide protection ranging from water-resistant to waterproof along the perimeter of the housing 300 is shown in FIGS. 67-71 as assembly 370. The sealing components and their application to housing 300 are substantially the same as described above, in reference to the housing 200, and are not repeated here.

An embodiment of another method of forming a watertight barrier configured to provide protection ranging from water-resistant to waterproof along the perimeter of a housing is shown in FIGS. 20-24 as assembly 250. FIGS. 20-24 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Figure 20:
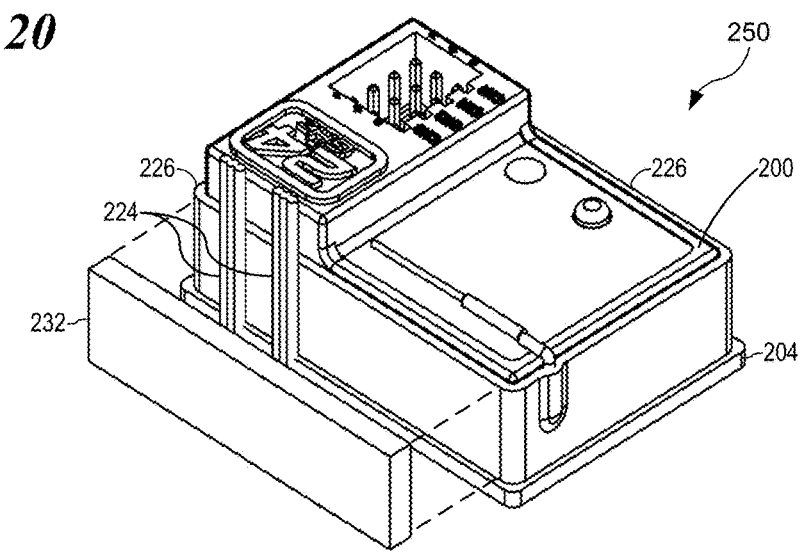
FIG. 20 is a perspective view of the housing of FIG. 9, with sealing materials applied.

Referring first to FIG. 20, a watertight barrier configured to provide protection ranging from water-resistant to waterproof may be formed around the housing 200 and the wiring bundles 224A and 224B using a sealing band 226 and a sealing strip 232 as seal members.

Figure 21:
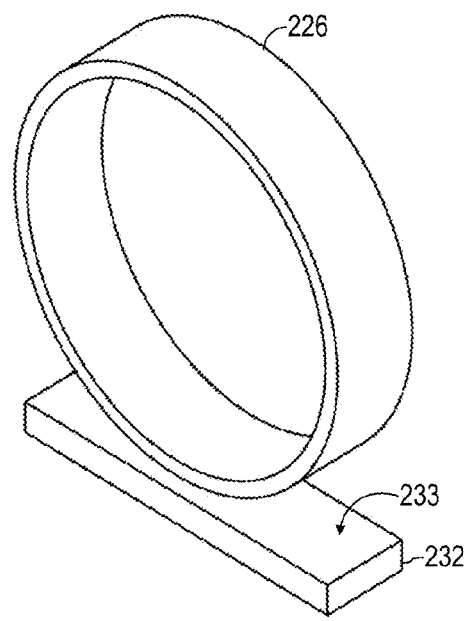
FIG. 21 is a perspective view of sealing materials of FIG. 20.

The sealing band 226 may be a continuous loop of material and have a circular shape, as shown in FIG. 21. In alternative embodiments, the sealing band 226 may be a length of material or one or more strips of material that may be applied to the one or more walls of a housing and configured to create a continuous "loop" of material along the one or more walls of a housing. Alternatively, in an embodiment, sealing band 226 may be a single strip of material that may be placed along one or more walls 202 of the housing 200, without forming a continuous "loop" of material.

The sealing band 226 may be semi-rigid, die cut, and formed from rubber, foam, or some other similar open cell or closed cell viscoelastic or elastomeric material. In an embodiment, the sealing band 226 may be a rubber band, for example. The material may further be water resistant and deformable.

The sealing band 226 may have a circumferential dimension that is substantially equal to the perimeter dimension of the housing 200. Alternatively, the sealing band 226 may be configured to have a smaller circumferential length than the perimeter length of the housing 200, allowing for the sealing band to be "stretched" over the perimeter of the housing 200. The sealing band 226 may have a height that is substantially the same as the height of the housing 200.

The sealing strip 232 may have a rectangular shape and an inner surface 233, as shown in FIG. 21. The inner surface 233 may be provided with an adhesive. The sealing strip 232 may be formed from rubber, foam, or some other similar open cell or closed cell viscoelastic or elastomeric material. The material may further be water resistant and deformable. The sealing strip 232 may have height and length dimensions substantially equal to the height and length dimensions of one wall of the housing 200. The sealing strip 232 may be configured to have a thickness sufficient to allow for the sealing strip to deform around the wire bundles 224 when the wire bundles are pressed against a surface of the sealing strip 232.

Referring to FIG. 20, a watertight barrier configured to provide protection ranging from water-resistant to waterproof may be formed along the outer perimeter of the housing 200 by first placing the sealing band 226 around the housing 200 and pressing the sealing band 226 down against the flange 204. If the housing 200 is equipped with an antenna, the antenna may be trapped between the sealing band 226 and the housing 200, as shown in FIG. 20. The elasticity of the sealing band 226 may ensure that the sealing band 226 remains in contact with the housing 200. The sealing band 226 may be applied to housing 200 in this manner without the use of an adhesive between the sealing band 226 and the housing 200. Alternatively, in an embodiment, an adhesive may be applied between the sealing band 226 and the housing 200.

With the sealing band 226 in place, the wire bundles 224 may be positioned so that they pass over the sealing band 226, as shown in FIG. 20. The sealing strip 232 may then be applied over the sealing band 226 and to the wall of the housing 200 over which the wire bundles 224 are routed with the inner surface 233 facing towards the housing 200. The wire bundles 224 may be trapped between sealing band 226 and sealing strip 232. As previously described in reference to FIG. 3B, one or more small gaps should be disposed between separate wire bundles 224A and 224B, as required. It should be appreciated that where only one bundle exists, no gap would be required, and where three or more bundles may exist, two or more gaps may be required, correspondingly.

Figure 22:
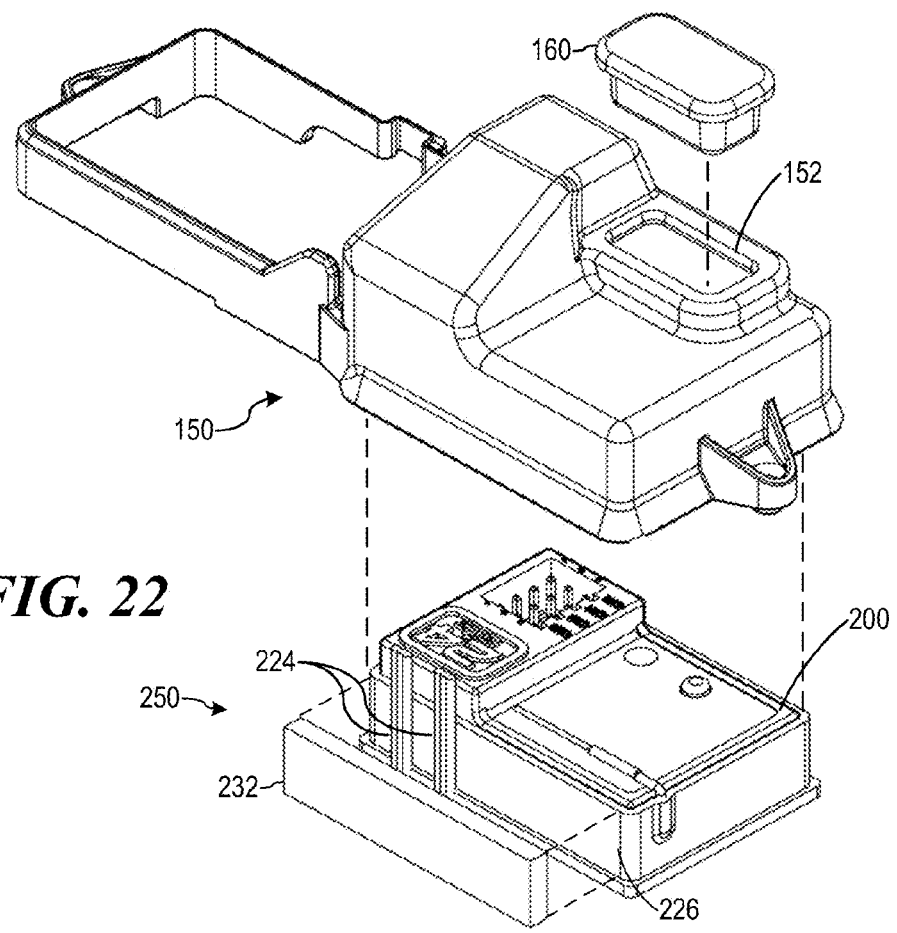
FIG. 22 is a partially exploded, perspective view of a cover member and sealing plug together with the housing having sealing materials applied of FIG. 20.

The assembly 250, with the sealing band 226 and the sealing strip 232 applied as described above, may be inserted into the cover member 150, as shown in FIG. 22, so that the walls of cover member 150 at least partially overlap each of the walls of the housing 200 covered by the sealing band 226 and the sealing strip 232, forming a substantially continuous watertight barrier configured to provide protection ranging from water-resistant to waterproof between the walls of the cover member 150 and the housing 200.

Figure 23:
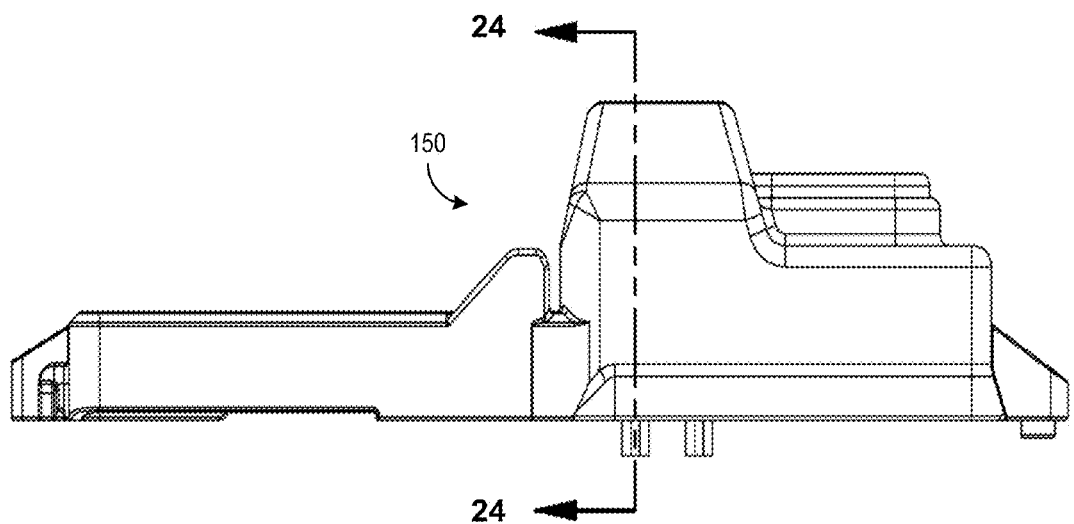
FIG. 23 is a side view of a cover member covering the sealed housing of FIG. 20.
Figure 24:
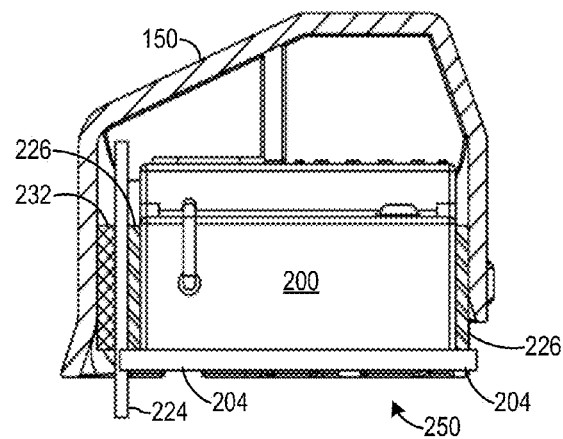
FIG. 24 is a partial cross-section of the cover member of FIG. 23, illustrating the cover member and sealing materials in cross-section, and an end view of the sealed housing of FIG. 20.

As assembled, shown in FIGS. 23 and 24, the inner surfaces of cover member 150 may press against the sealing band 226 and the sealing strip 232 of assembly 250. The compressive force may cause the material of the sealing band 226 to "flow" into any gaps between the inner surface of the cover member 150 and the sealing band 226, forming a watertight barrier configured to provide protection ranging from water-resistant to waterproof between the cover member 150 and the sealing band 226. Similarly, the compressive force may cause the material of the sealing strip 232 to "flow" into any gaps between the inner surface of the cover member 150 and the sealing strip 232, forming a watertight barrier configured to provide protection ranging from water-resistant to waterproof between the cover member 150 and the sealing strip 232.

The sealing strip 232 may press against the sealing band 226, causing the material of both sealing members to "flow" into the gaps between the sealing strip 232 and the sealing band 226 and around the wire bundles 224. A watertight barrier configured to provide protection ranging from water-resistant to waterproof between the sealing strip 232 and the sealing band 226 as well as around wire bundles 224A and 224B may be formed. The material of sealing band 226 may also "flow" to form a watertight barrier configured to provide protection ranging from water-resistant to waterproof between the sealing band 226 and the housing 200.

An embodiment of the present method of forming a watertight barrier configured to provide protection ranging from water-resistant to waterproof along the perimeter of the housing 300 is shown in FIGS. 72-76 as assembly 380. The sealing components and their application to housing 300 are substantially the same as described above, in reference to the housing 200, and are not repeated here.

An embodiment of another method of forming a watertight barrier configured to provide protection ranging from water-resistant to waterproof along the perimeter of a housing is shown in FIGS. 25-29 as assembly 260. FIGS. 25-29 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Figure 25:
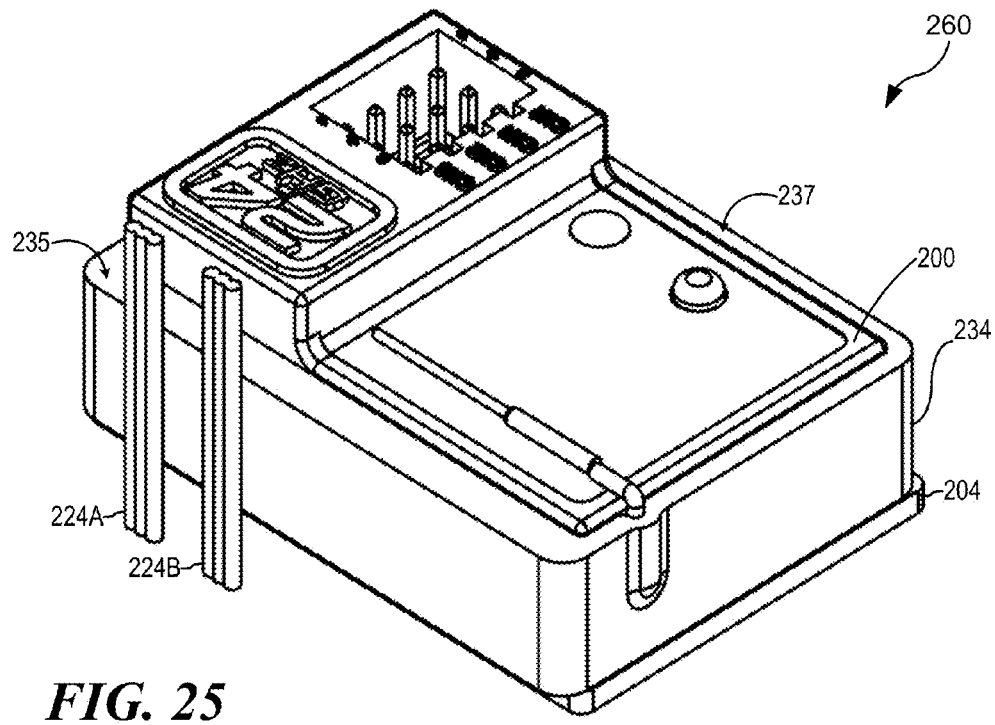
FIG. 25 is a perspective view of the housing of FIG. 9, with sealing materials applied.

Referring first to FIG. 25, a watertight barrier configured to provide protection ranging from water-resistant to waterproof may be formed around the housing 200 and the wiring bundles 224A and 224B using the sealing band 234 as a seal member. The sealing band 234 may be a continuous loop of material and have a shape that is coincident to the particular housing to which the sealing band 234 may be applied. For example, in the particular embodiment shown in FIGS. 25 and 26, the sealing band 234 may have a rectangular shape.

In alternative embodiments, the sealing band 234 may be a length of material or one or more strips of material that may be applied to the one or more walls of a housing and configured to create a continuous "loop" of material along the one or more walls of a housing. Alternatively, in an embodiment, the sealing band 234 may be a single strip of material that may be placed along one or more walls 202 of the housing 200, without forming a continuous "loop" of material.

The sealing band 234 may be semi-rigid, die cut, and formed from rubber, foam, or some other similar open cell or closed cell viscoelastic or elastomeric material. The material may further be water resistant and deformable. The sealing band 234 may have a uniform material composition, or, alternatively, may be a composite of two or more materials joined together.

The sealing band 234 may have an inner perimeter dimensions that are substantially similar to the perimeter dimensions of the housing 200. Alternatively, the sealing band 234 may be configured to have slightly smaller perimeter dimensions than the housing 200 so that the sealing band 234 may be "stretched" over the housing 200. The sealing band 234 may have a height that is substantially the same as the height of the housing 200.

Figure 26:
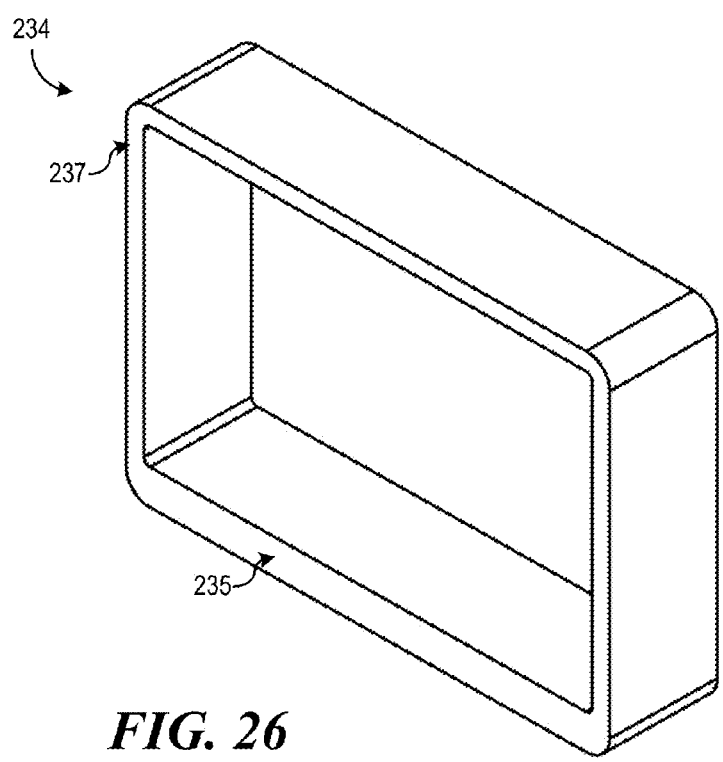
FIG. 26 is a perspective view of sealing material of FIG. 25.

As shown in FIG. 26, the sealing band 234 may have one thick side 235 and three thin walls 237. The thick side 235 may allow for greater deformation to accommodate deformation around components pressed into the thick side 235, such as wire bundles 224, for example. The thick side 235 may be configured to have a thickness sufficient to allow for the sealing strip to deform around the wire bundles 224.

As shown, the thick side 235 corresponds to a longer side of the rectangular sealing band 234. In an alternative embodiment, the sealing band 234 may be configured to have the thick side 235 along a shorter side of the sealing band 234. Additionally, the sealing band 234 may be configured to have more than one thick side 235 and, correspondingly, fewer thin walls 237.

Referring to FIG. 25, a watertight barrier configured to provide protection ranging from water-resistant to waterproof may be formed along the outer perimeter of the housing 200 by placing the sealing band 234 around the housing 200 and pressing the sealing band 234 down against the flange 204 of the housing 200. If the housing 200 is equipped with an antenna, the antenna may be trapped between the sealing band 234 and the housing 200, as shown in FIG. 25. The elasticity of the sealing band 234 may ensure that the sealing band 234 remains in contact with the housing 200 along the perimeter of the housing 200. The sealing band 234 may be applied to housing 200 in this manner without the use of an adhesive between the sealing band 234 and the housing 200. Alternatively, in an embodiment, an adhesive may be applied between the sealing band 234 and the housing 200.

With the sealing band 234 in place, the wire bundles 224A and 224B may be positioned so that they pass over the thick side 235 of the sealing band 234, as shown in FIG. 25. As previously described in reference to FIG. 3B, one or more small gaps should be disposed between separate wire bundles 224A and 224B, as required. It should be appreciated that where only one bundle exists, no gap would be required, and where three or more bundles may exist, two or more gaps may be required, correspondingly.

Figure 27:
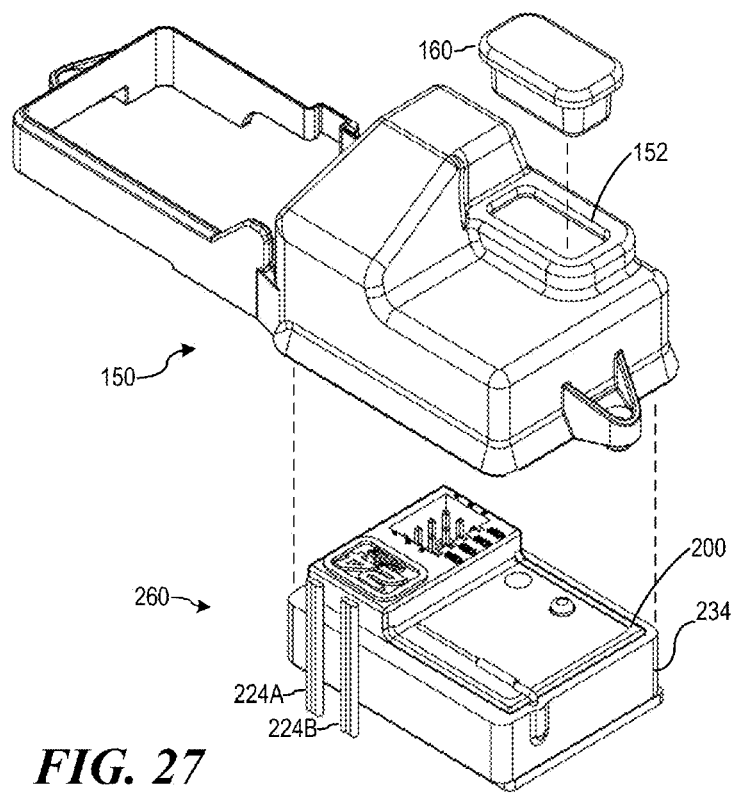
FIG. 27 is a partially exploded, perspective view of a cover member and sealing plug together with the housing having sealing materials applied of FIG. 25.

The assembly 260, with sealing band 234 applied as described above and with the wire bundles 234A and 234B positioned as described above, may be inserted into the cover member 150 as shown in FIG. 27, so that the walls of cover member 150 at least partially overlap each of the walls of the housing 200 covered by the sealing band 234, forming a substantially continuous watertight barrier configured to provide protection ranging from water-resistant to waterproof between the walls of the cover member 150 and the housing 200.

Figure 28:
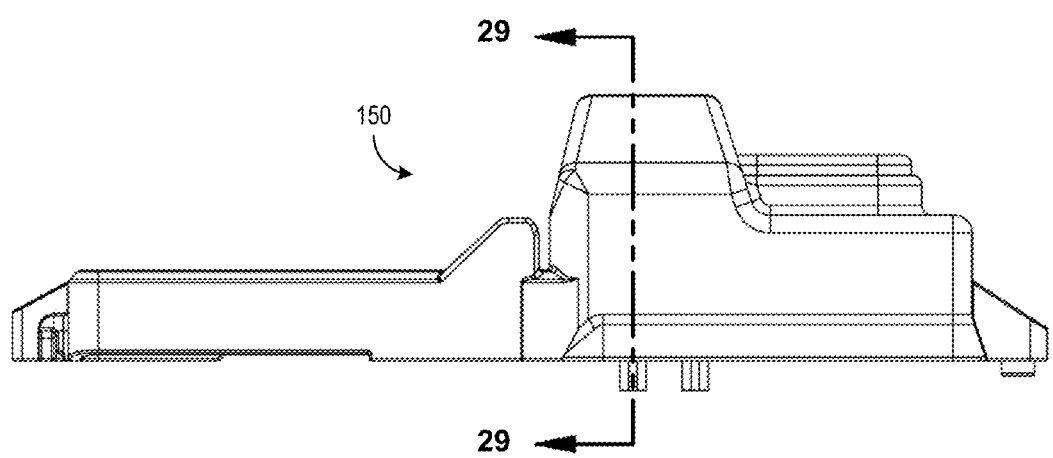
FIG. 28 is a side view of a cover member covering the sealed housing of FIG. 25.

As assembled, shown in FIGS. 28 and 29, the inner surfaces of cover member 150 may press against the sealing band 234 of assembly 260. The compressive force may cause the material of sealing band 234 to "flow" into any gaps between the inner surface of the cover member 150 and the sealing band 234, forming a watertight barrier configured to provide protection ranging from water-resistant to waterproof between the cover member 150 and the sealing band 234.

The material of the thick side 235 of sealing band 234 may "flow" into the gaps around the wire bundles 224. A watertight barrier configured to provide protection ranging from water-resistant to waterproof around wire bundles 224A and 224B may be formed. The material of sealing band 234 may also "flow" to form a watertight barrier configured to provide protection ranging from water-resistant to waterproof between the sealing band 234 and the housing 200.

An embodiment of the present method of forming a watertight barrier configured to provide protection ranging from water-resistant to waterproof along the perimeter of the housing 300 is shown in FIGS. 47-51 as assembly 330. The sealing components and their application to housing 300 are substantially the same as described above, in reference to the housing 200, and are not repeated here.

An embodiment of a method of forming a watertight barrier configured to provide protection ranging from water-resistant to waterproof along the perimeter of a housing is shown in FIGS. 30-34 as assembly 270. FIGS. 30-34 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Referring first to FIG. 30, a watertight barrier configured to provide protection ranging from water-resistant to waterproof may be formed around the housing 200 and the wiring bundles 224A and 224B using a sealing band 236 as a seal member. The sealing band 236 may be a continuous loop of material and may have a shape that is coincident with the particular housing to which the sealing band 236 may be applied. For example, in the particular embodiment shown in FIGS. 30, 31A, and 31B, the sealing band 236 may have a rectangular shape.

In alternative embodiments, the sealing band 236 may be a length of material or one or more strips of material that may be applied to the one or more walls of a housing and configured to create a continuous "loop" of material along the one or more walls of a housing. Alternatively, in an embodiment, the inner sealing band 236 may be a single strip of material that may be placed along one or more walls 202 of the housing 200, without forming a continuous "loop" of material.

The sealing band 236 may be semi-rigid, die cut, and formed from rubber, foam, or some other similar open cell or closed cell viscoelastic or elastomeric material. The material may further be water resistant and deformable. The sealing band 236 may have a uniform material composition, or, alternatively, may be a composite of two or more materials joined together.

The sealing band 236 may have an inner perimeter dimensions that are substantially equal to the perimeter dimensions of the housing 200. Alternatively, the sealing band 236 may be configured to have slightly smaller perimeter dimensions than the housing 200 so that the sealing band 236 may be "stretched" over the housing 200. The sealing band 236 may have a height that is substantially the same as the height of the housing 200.

As shown in FIGS. 31A and 31B, the sealing band 236 may have one thick side 239 and three thin walls 238. The thick side 239 may allow for greater deformation to accommodate deformation around components pressed into the thick side 239, such as wire bundles 224, for example. The thick side 239 may be configured to have a thickness sufficient to allow for the sealing strip to deform around the wire bundles 224.

As shown, the thick side 239 corresponds to a longer side of the rectangular sealing band 236. In an alternative embodiment, the sealing band 236 may be configured to have the thick side 239 along a shorter side of the sealing band 236. Additionally, the sealing band 236 may be configured to have more than one thick side 239 and, correspondingly, fewer thin walls 238.

As shown in FIGS. 31A-C, along the thick side 239 of sealing band 236 may be one or more openings 241, 243 for containing the wire bundles 224A and 224B. For each opening 241, 243 the sealing band 236 may have a corresponding slit 245, 247 allowing for a wire bundle 224 to be pressed through the sealing band 236 material and into an opening 241, 243.

In an embodiment, the openings 241, 243 may have an oval cross-sectional shape oriented substantially perpendicular to the slits 245, 247 as shown in FIGS. 31A and 31B. Alternatively, in an embodiment, the openings 241, 243 may have a different cross-sectional shape, such as circular, rectangular, and the like. The openings 241,243 may be configured to have a cross-sectional area substantially similar to the cross-sectional area of the wire bundle 224 contained by the opening 241,243.

In yet another alternative embodiment, as shown in FIG. 31C, the openings 241, 243 may, instead, be a second pair of slits cut into the sealing band 236 and oriented perpendicular to the slits 241, 243. In this embodiment, the openings 241, 243 are formed without removing material from the sealing band 236. The openings 241, 243 may expand to accommodate a wire bundle 224.

As shown, the sealing band 236 has two openings 241, 243 and two slits 245, 247 corresponding to the two wire bundles 224A and 224B. In an embodiment, the number of openings and slits may vary to correspond to the number of wire bundles connecting to the housing 200. Further, in an embodiment, the openings 241, 243 and corresponding slits 245, 247 may be located anywhere along a thick side 239 of the sealing band 236. The slits 245, 247 may also be configured to allow the openings 241, 243 to be accessed from either the inner surface 249 of the sealing band 236 or the outer surface 251 of the sealing band 236.

Referring to FIG. 30, a watertight barrier configured to provide protection ranging from water-resistant to waterproof may be formed along the outer perimeter of the housing 200 by first pressing wire bundle 224A through slit 245 and into opening 241 of the sealing band 236. Similarly, wire bundle 224B may be passed through slit 247 and into opening 243 of the sealing band 236. The sealing band 236 may then be placed, or "stretched," around the housing 200 and pressed down into contact with the flange 204 of the housing 200. If the housing 200 is equipped with an antenna, the antenna may be trapped between the sealing band 236 and the housing 200, as shown in FIG. 30.

The elasticity of the sealing band 236 may ensure that the sealing band 236 remains in contact with the housing 200 along the perimeter of the housing 200. The sealing band 236 may be applied to housing 200 in this manner without the use of an adhesive between the sealing band 236 and the housing 200. Alternatively, in an embodiment, an adhesive may be applied between the sealing band 236 and the housing 200.

The assembly 270, with the sealing band 236 applied as described above and with the wire bundles 224A and 224B positioned as described above, may be inserted into the cover member 150, as shown in FIG. 32, so that the walls of cover member 150 at least partially overlap each of the walls of the housing 200 covered by the sealing band 236, forming a substantially continuous watertight barrier configured to provide protection ranging from water-resistant to waterproof between the walls of the cover member 150 and the housing 200.

Figure 33:
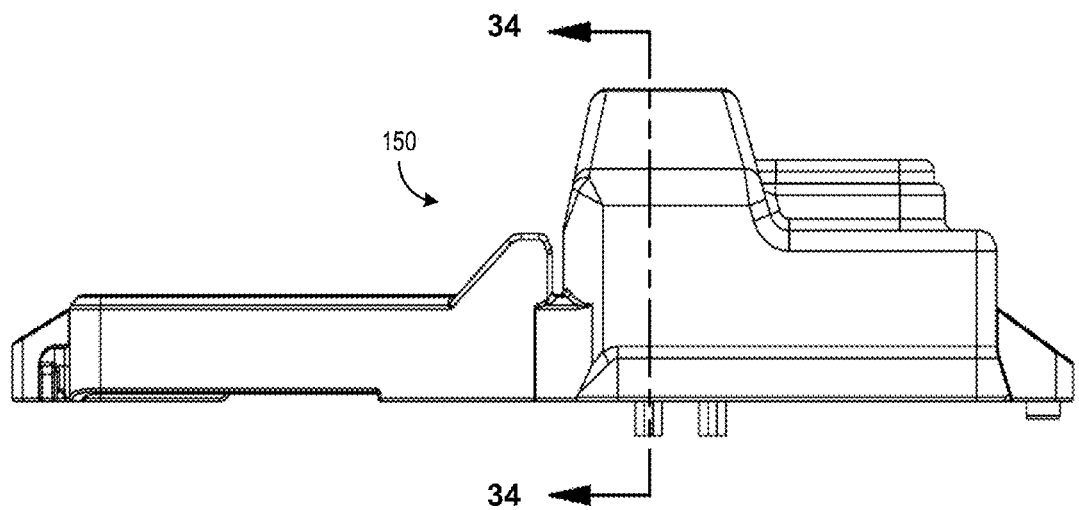
FIG. 33 is a side view of a cover member covering the sealed housing of FIG. 30.
Figure 34:
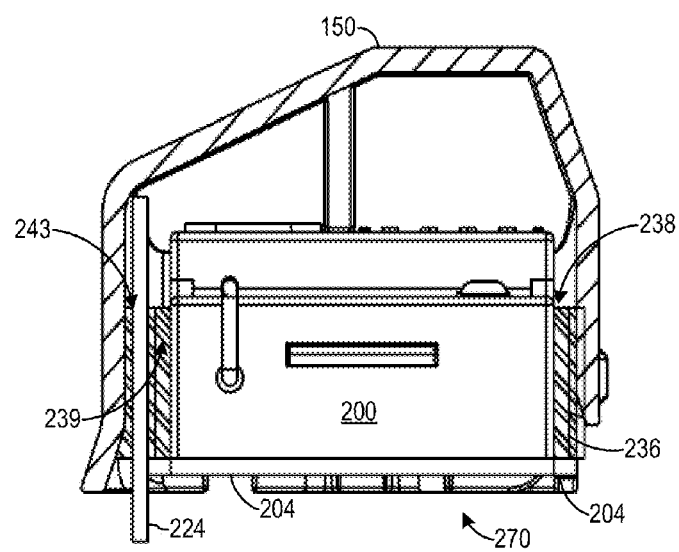
FIG. 34 is a partial cross-section of the cover member of FIG. 33, illustrating the cover member and sealing materials in cross-section, and an end view of the sealed housing of FIG. 30.

As assembled, shown in FIGS. 33 and 34, the inner surfaces of cover member 150 may press against the sealing band 236 of assembly 270. The compressive force may cause the material of sealing band 236 to "flow" into any gaps between the inner surface of the cover member 150 and the sealing band 236, forming a watertight barrier configured to provide protection ranging from water-resistant to waterproof between the cover member 150 and the sealing band 236.

The material of the thick side 239 of sealing band 236 may "flow" into the gaps between the openings 241, 243 and the wire bundles 224A and 224B and press together the slits 245, 247. A watertight barrier configured to provide protection ranging from water-resistant to waterproof around wire bundles 224A and 224B may be formed. The material of sealing band 236 may also "flow" to form a watertight barrier configured to provide protection ranging from water-resistant to waterproof between the sealing band 236 and the housing 200.

An embodiment of the present method of forming a watertight barrier configured to provide protection ranging from water-resistant to waterproof along the perimeter of the housing 300 is shown in FIGS. 52-56 as assembly 340. The sealing components and their application to housing 300 are substantially the same as described above, in reference to the housing 200, and are not repeated here.

An embodiment of another method of forming a watertight barrier configured to provide protection ranging from water-resistant to waterproof along the perimeter of a housing is shown in FIGS. 35-39 as assembly 280. FIGS. 35-39 are illustrative, only, and should not be construed to limit the scope of the present embodiment to applying only to the particular housing shown. The present method of forming a watertight barrier configured to provide protection ranging from water-resistant to waterproof along the perimeter of a housing may be applied to any of the housing configurations described above.

Figure 35:
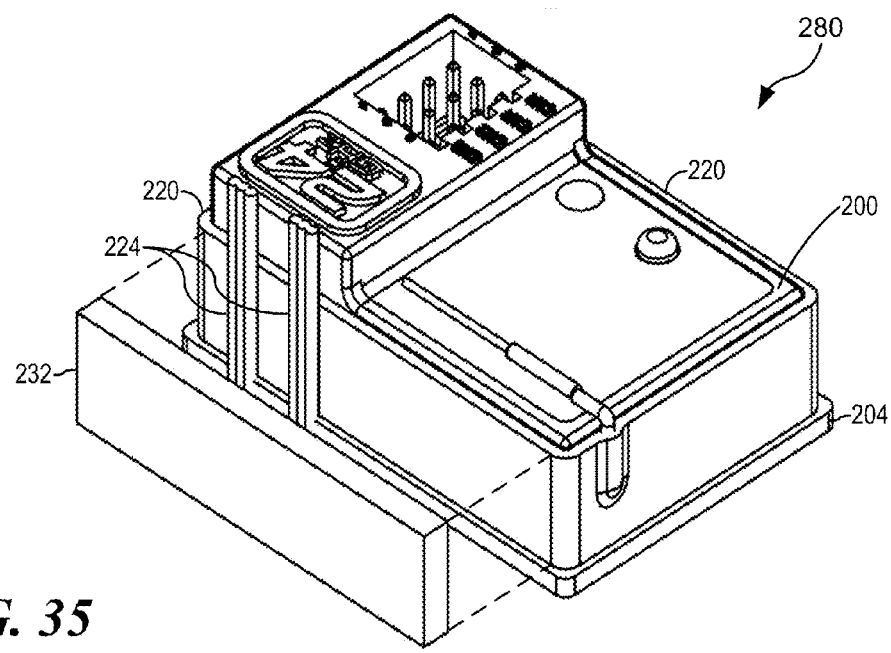
FIG. 35 is a perspective view of the housing of FIG. 9, with sealing materials applied.

Referring first to FIG. 35, a watertight barrier configured to provide protection ranging from water-resistant to waterproof may be formed around the housing 200 and the wiring bundles 224 using a sealing band 220 and a sealing strip 232 as seal members. The sealing band 220 may be a continuous loop of material and may have a shape that is coincident to the particular outer dimensions of the housing to which the sealing band 220 may be applied. For example, in the particular embodiment shown in FIGS. 35 and 36, the sealing band 220 may have a rectangular shape.

In alternative embodiments, the inner sealing band 220 may be a length of material or one or more strips of material that may be applied to the one or more walls of a housing and configured to create a continuous "loop" of material along the one or more walls of a housing. Alternatively, in an embodiment, the sealing band 220 may be a single strip of material that may be placed along one or more walls 202 of the housing 200, without forming a continuous "loop" of material.

The sealing band 220 may be semi-rigid, die cut, and formed from rubber, foam, or some other similar open cell or closed cell viscoelastic or elastomeric material. The material may further be water resistant and deformable. The sealing band 220 may have perimeter dimensions that are substantially similar to the perimeter dimensions of the housing 200. Alternatively, the sealing band 220 may be configured to have slightly smaller perimeter dimensions than the perimeter dimensions of housing 200 so that the sealing band 220 may be "stretched" over the housing 200. The sealing band 220 may have a height that is substantially the same as the height of the housing 200.

Figure 36:
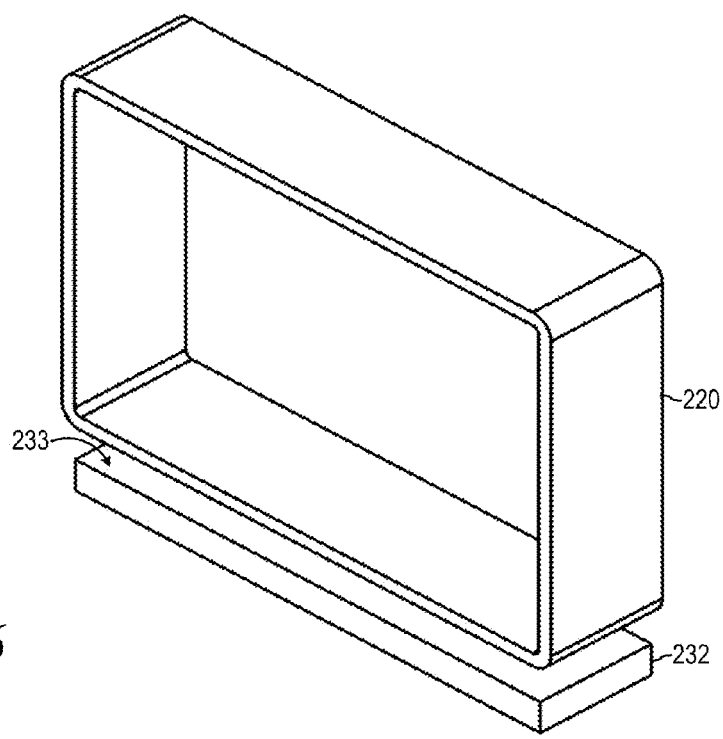
FIG. 36 is a perspective view of sealing materials of FIG. 35.

The sealing strip 232 may have a rectangular shape and an inner surface 233, as shown in FIG. 36. The inner surface 233 may be provided with an adhesive. The sealing strip 232 may be formed from rubber, foam, or some other similar open cell or closed cell viscoelastic or elastomeric material. The material may further be water resistant and deformable. The sealing strip 232 may have height and length dimensions substantially equal to the height and length dimensions of one wall of the housing 200. The sealing strip 232 may be configured to have a thickness sufficient to allow for the sealing strip to deform around the wire bundles 224 when the wire bundles are pressed against a surface of the sealing strip 232.

Referring to FIG. 35, a watertight barrier configured to provide protection ranging from water-resistant to waterproof may be formed along the outer perimeter of the housing 200 by first placing the sealing band 220 around the housing 200 and pressing the sealing band 220 down into contact with the flange 204. If the housing 200 is equipped with an antenna, the antenna may be trapped between the sealing band 220 and the housing 200, as shown in FIG. 35.

The elasticity of the sealing band 220 may ensure that the sealing band 220 remains in contact with the housing 200. The sealing band 220 may be applied to housing 200 in this manner without the use of an adhesive between the sealing band 220 and the housing 200. Alternatively, in an embodiment, an adhesive may be applied between the sealing band 220 and the housing 200.

With the sealing band 220 in place, the wire bundles 224 may be positioned so that they pass over the sealing band 220, as shown in FIG. 20. The sealing strip 232 may then be applied over the sealing band 220 and to the wall of the housing 200 over which the wire bundles 224 are routed with the inner surface 233 of the sealing strip 232 facing towards the housing 200. The wire bundles 224 may be trapped between sealing band 220 and sealing strip 232. As previously described in reference to FIG. 3B, one or more small gaps should be disposed between separate wire bundles 224, as required. It should be appreciated that where only one bundle exists, no gap would be required, and where three or more bundles may exist, two or more gaps may be required, correspondingly.

Figure 37:
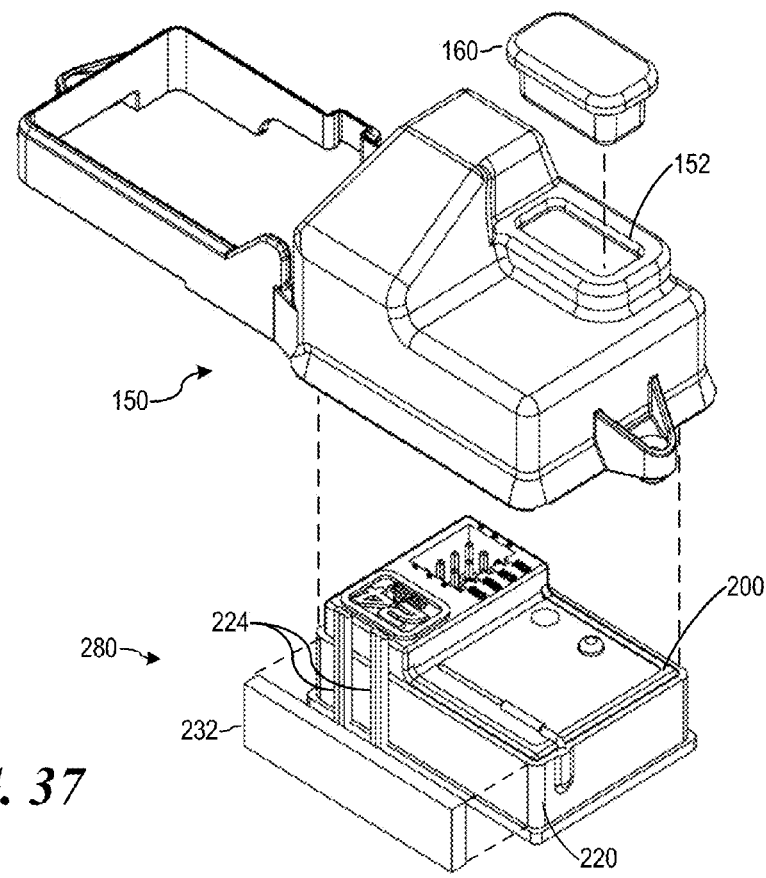
FIG. 37 is a partially exploded, perspective view of a cover member and sealing plug together with the housing having sealing materials applied of FIG. 35.

The assembly 280, with the sealing band 220 and the sealing strip 232 applied as described above, may be inserted into the cover member 150 as shown in FIG. 37, so that the walls of cover member 150 at least partially overlap each of the walls of the housing 200 covered by the sealing band 220 and the sealing strip 232, forming a substantially continuous watertight barrier configured to provide protection ranging from water-resistant to waterproof between the walls of the cover member 150 and the housing 200.

Figure 38:
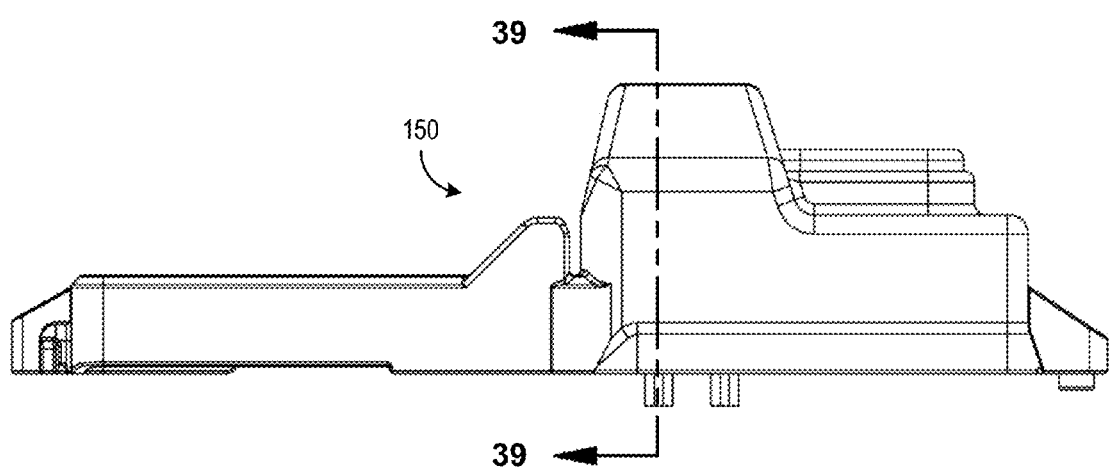
FIG. 38 is a side view of a cover member covering the sealed housing of FIG. 35.
Figure 39:
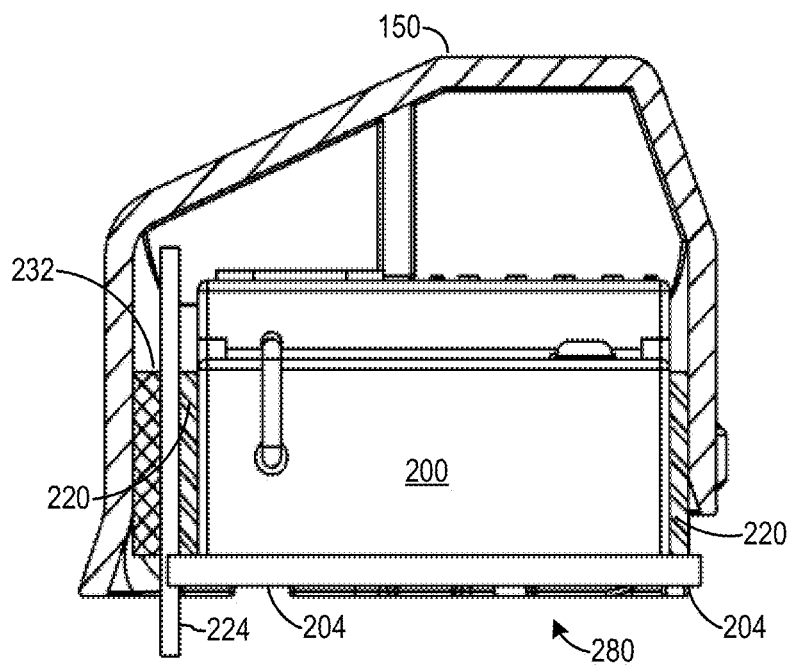
FIG. 39 is a partial cross-section of the cover member of FIG. 38, illustrating the cover member and sealing materials in cross-section, and an end view of the sealed housing of FIG. 35.

As assembled, shown in FIGS. 38 and 39, the inner surfaces of cover member 150 may press against the sealing band 220 and the sealing strip 232 of assembly 280. The compressive force may cause the material of the sealing band 220 to "flow" into any gaps between the inner surface of the cover member 150 and the sealing band 220, forming a watertight barrier configured to provide protection ranging from water-resistant to waterproof between the cover member 150 and the sealing band 220. Similarly, the compressive force may cause the material of the sealing strip 232 to "flow" into any gaps between the inner surface of the cover member 150 and the sealing strip 232, forming a watertight barrier configured to provide protection ranging from water-resistant to waterproof between the cover member 150 and the sealing strip 232.

The sealing strip 232 may press against the sealing band 220, causing the material of both sealing members to "flow" into the gaps between the sealing strip 232 and the sealing band 220 and around the wire bundles 224. A watertight barrier configured to provide protection ranging from water-resistant to waterproof between the sealing strip 232 and the sealing band 220 as well as around wire bundles 224 may be formed. The material of sealing band 220 may also "flow" to form a watertight barrier configured to provide protection ranging from water-resistant to waterproof between the sealing band 220 and the housing 200.

An embodiment of the present method of forming a watertight barrier configured to provide protection ranging from water-resistant to waterproof along the perimeter of the housing 300 is shown in FIGS. 57-61 as assembly 350. The sealing components and their application to housing 300 are substantially the same as described above, in reference to the housing 200, and are not repeated here.

Having thus described the present invention by reference to certain of its exemplary embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of exemplary embodiments. Accordingly, it is appropriate that any claims supported by this description be construed broadly and in a manner consistent with the scope of the invention.

The invention claimed is:

1. An enclosure for a component of a model vehicle, comprising: a housing comprising a housing interior configured for holding a component, the housing further comprising one or more housing perimeter walls at least partially surrounding the component, the one or more housing perimeter walls extending from a component support surface of the housing to a perimeter of an opening of the housing, wherein the one or more housing perimeter walls further comprises a first surface facing the housing interior and a second surface facing in a direction directly opposite to the first surface;
   a cover comprising at least a portion configured to receive and cover at least a portion of the opening of the housing and one or more cover perimeter walls extending from the portion of the cover to a perimeter of an opening of the cover receiving the at least a portion of the housing, wherein the one or more cover perimeter walls are disposed adjacent the second surface of the one or more housing perimeter walls;
   one or more seal members interposed between the second surface of the one or more housing perimeter walls and the one or more cover perimeter walls, and the one or more seal members extending along at least a portion of the second surface of the one or more housing perimeter walls between the perimeter of the opening of the housing and the support surface of the housing;
   wherein the one or more seal members are configured to contact the one or more cover perimeter walls and the second surface of the one or more housing perimeter walls, forming a substantially continuous seal between the cover and the housing to protect the component;
   wherein the enclosure further comprises one or more electrical wires extending from the component, wherein at least one of the one or more electrical wires extend outwardly from the housing between the one or more housing perimeter walls and the one or more cover perimeter walls and adjacent the one or more seal members, and at the least one of the one or more electrical wires extend parallel to the one or more housing perimeter walls and the one or more cover perimeter walls;
   and wherein the one or more seal members are configured to form a seal with the one or more electrical wires between the one or more housing perimeter walls and the one or more cover perimeter walls.

2. The enclosure of claim 1, wherein the one or more cover perimeter walls are configured to overlap at least a substantial portion of the one or more housing perimeter walls and at least a substantial portion of the one or more seal members, providing protection ranging from water-resistant to waterproof between the housing and cover.

3. The enclosure of claim 1, wherein the one or more seal members conform to the shape of the one or more perimeter walls of the housing and cover.

4. The enclosure of claim 1, further comprising one or more flanges extending outwardly from the housing perimeter walls to retain the one or more seal members between the one or more perimeter walls of the housing and cover.

5. The enclosure of claim 1, wherein the one or more seal members comprise one or more lengths of deformable material surrounding the one or more housing perimeter walls.

6. The enclosure of claim 5, wherein the one or more seal members comprise at least one rubber band.

7. The enclosure of claim 5, wherein the one or more seal members comprise at least one length of foam.

8. The enclosure of claim 1, wherein the one or more seal members further comprise at least two lengths of deformable material, and wherein the one or more electrical wires are disposed between the at least two lengths of deformable material.

9. The enclosure of claim 1, wherein the one or more seal members overlap the one or more electrical wires and at least one of the one or more housing perimeter walls.

10. The enclosure of claim 1, wherein the one or more seal members comprise foam having an adhesive adhering at least a portion of the foam to at least one of the one or more housing perimeter walls.

11. The enclosure of claim 1, wherein the one or more seal members comprise an inner band of deformable material and an outer band of deformable material overlaying at least a portion of the inner band, wherein at least one of the one or more electrical wires is disposed between at least a portion of each of the inner and outer bands.

12. The enclosure of claim 11, wherein the inner band comprises a substantially continuous length of deformable material and the outer band comprises a length of deformable material.

13. The enclosure of claim 1, wherein the one or more seal members comprise deformable material surrounding the one or more housing perimeter walls, and wherein the deformable material forming a seal with the one or more electrical wires is thicker relative to other portions of the deformable material.

14. The enclosure of claim 13, wherein the one or more seal members comprise foam surrounding the one or more housing perimeter walls, and wherein the foam forming a seal with the one or more electrical wires is deformable to a greater extent relative to one or more other portions of the foam.

15. The enclosure of claim 13, wherein at least a portion of one of the one or more electrical wires is disposed between the deformable material and at least one of the one or more cover perimeter walls.

16. The enclosure of claim 1, wherein at least one of the one or more seal members comprises at least one aperture extending through the seal member and traversing at least a portion of the height of at least one of the one or more housing perimeter walls adjacent to the one or more electrical wires, and wherein at least a portion of one of the one or more electrical wires extends through the aperture.

17. The enclosure of claim 16, wherein the one or more seal members comprise deformable material surrounding the one or more housing perimeter walls, and wherein the deformable material forming a seal with the one or more electrical wires is thicker relative to other portions of the deformable material.

18. The enclosure of claim 17, wherein the one or more seal members comprise foam surrounding the one or more housing perimeter walls, wherein the foam forming a seal with the one or more electrical wires is deformable to a greater extent relative to one or more other portions of the foam.

19. The enclosure of claim 16, wherein the one or more seal members further comprise a slit laterally intersecting the at least one aperture along the length of the aperture, the slit allowing at least a portion at least one of the one or more electrical wires to be laterally inserted into the aperture through the slit.

20. The enclosure of claim 1, further comprising an opening through at least one wall of the cover and a removable plug for sealing the opening, to allow sealable access to the component held by the housing.

21. The enclosure of claim 1 wherein one of the one or more seals extends continuously around a perimeter defined by the second surfaces of all of the one or more housing perimeter walls surrounding the component on four sides.

22. An electrical component enclosure for a model vehicle, comprising: a housing comprising a housing interior configured for holding an electrical component, the housing having an open end having a perimeter for receiving the electrical component, a base for supporting the electrical component, and one or more walls extending from the base to the housing perimeter of the open end for retaining the electrical component, wherein the one or more walls further comprises a first surface facing the housing interior and a second surface facing in a direction directly opposite to the first surface;

a cover for protecting the electrical component received by the housing, the cover having an open end having a perimeter for placement over the housing containing the electrical component, a top, and one or more walls extending from the top to the cover perimeter;

wherein the one or more walls of the cover are configured to extend around and adjacent to the second surface of the one or more walls of the housing to form a space external to the housing;

one or more seals disposed in the space between the second surface of the one or more walls of the housing and the one or more walls of the cover, wherein the one or more seals comprises a deformable material extending around at least a portion of the second surface of the one or more walls of the housing, and at least partially disposed between the base of the housing and the perimeter of the open end of the housing;

wherein the one or more seals are compressed between the one or more walls of the cover and the second surface of the one or more walls of the housing; and one or more electrical wires connected to the electrical component and extending through the space between the housing and the cover and in contact with the seal;

wherein the one of the one or more electrical wires extend parallel to the one or more walls of the housing and the one or more walls of the cover;

and wherein the one or more seal members are configured to form a seal with the one or more electrical wires between the one or more walls of the housing and the one or more walls of the cover.

23. The enclosure of claim 22, wherein the one or more seals compress the one or more electrical wires against at least one of the one or more walls of the enclosure.

24. The enclosure of claim 22, wherein the one or more seals compress the one or more electrical wires against at least one of the one or more walls of the cover.

25. The enclosure of claim 22, wherein the one or more seals compress the one or more electrical wires to form a seal with the one or more electrical wires.

26. The enclosure of claim 22 wherein one of the one or more seals extends continuously around a perimeter defined by the second surfaces of all of the one or more walls of the housing surrounding the electrical component on four sides.

* * * * *